US012660696B2

(12) United States Patent　　(10) Patent No.:　US 12,660,696 B2
Yu et al.　　　　　　　　　　　　(45) Date of Patent:　　Jun. 16, 2026

(54) INTEGRATED CIRCUIT PACKAGES AND METHODS OF FORMING THE SAME

(71) Applicant: Taiwan Semiconductor Manufacturing Co., Ltd., Hsinchu (TW)

(72) Inventors: Tsung-Yuan Yu, Taipei (TW); Tzuan-Horng Liu, Longtan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 501 days.

(21) Appl. No.: 18/152,453

(22) Filed: Jan. 10, 2023

(65) Prior Publication Data

US 2024/0234400 A1　　Jul. 11, 2024

(51) Int. Cl.
| | |
|---|---|
| *H10W 90/00* | (2026.01) |
| *H10P 54/00* | (2026.01) |
| *H10W 20/20* | (2026.01) |
| *H10W 70/60* | (2026.01) |
| *H10W 70/65* | (2026.01) |
| *H10W 70/685* | (2026.01) |
| *H10W 74/01* | (2026.01) |
| *H10W 74/10* | (2026.01) |

(Continued)

(52) U.S. Cl.
CPC ............. *H10W 90/00* (2026.01); *H10P 54/00* (2026.01); *H10W 20/20* (2026.01); *H10W 70/611* (2026.01); *H10W 70/65* (2026.01); *H10W 70/685* (2026.01); *H10W 74/012*

(2026.01); *H10W 74/019* (2026.01); *H10W 74/117* (2026.01); *H10W 74/15* (2026.01); *H10W 72/072* (2026.01); *H10W 72/073* (2026.01); *H10W 90/722* (2026.01); *H10W 90/724* (2026.01); *H10W 90/734* (2026.01)

(58) Field of Classification Search
None
See application file for complete search history.

(56) References Cited

U.S. PATENT DOCUMENTS

| | | | |
|---|---|---|---|
| 8,993,380 B2 | 3/2015 | Hou et al. | |
| 9,209,247 B2 | 12/2015 | Colinge et al. | |

(Continued)

FOREIGN PATENT DOCUMENTS

| | | |
|---|---|---|
| EP | 3945547 A1 | 2/2022 |
| TW | 202008530 A | 2/2020 |

(Continued)

*Primary Examiner* — Nicholas J Tobergte
(74) *Attorney, Agent, or Firm* — Slater Matsil, LLP

(57) ABSTRACT

Embodiments include a stacked semiconductor device and methods of forming the same. The stacked semiconductor device includes a first package embedded in a second package. Forming the first package includes mounting a first integrated circuit device to a first workpiece by a first set of solder connectors, depositing a first underfill between the first integrated circuit device and the first workpiece, and forming a first encapsulant laterally surrounding the first integrated circuit device. The first package is mounted to a second workpiece by a second set of solder connectors, a second underfill is deposited between the first package and the second workpiece, and a second encapsulant is deposited to laterally surround the first package.

20 Claims, 39 Drawing Sheets

(51) Int. Cl.
    *H10W 74/15*      (2026.01)
    *H10W 72/00*      (2026.01)

(56)          References Cited

U.S. PATENT DOCUMENTS

| | | | |
|---|---|---|---|
| 9,236,267 | B2 | 1/2016 | De et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,412,817 | B2 | 8/2016 | Yang et al. |
| 9,412,828 | B2 | 8/2016 | Ching et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,472,618 | B2 | 10/2016 | Oxland |
| 9,496,189 | B2 | 11/2016 | Yu et al. |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,666,502 | B2 | 5/2017 | Chen et al. |
| 9,735,131 | B2 | 8/2017 | Su et al. |
| 11,948,930 | B2 * | 4/2024 | Chang ..................... H01L 25/50 |
| 2006/0189033 | A1 * | 8/2006 | Kim ................... H01L 23/3128 |
| | | | 257/E21.705 |
| 2009/0230531 | A1 * | 9/2009 | Do .......................... H01L 21/56 |
| | | | 257/E23.141 |
| 2014/0353838 | A1 * | 12/2014 | Lin ....................... H01L 23/055 |
| | | | 257/773 |
| 2015/0249062 | A1 * | 9/2015 | Ang ....................... B23K 1/203 |
| | | | 228/42 |
| 2019/0279938 | A1 * | 9/2019 | Mehta ................. H01L 21/4853 |
| 2020/0043896 | A1 * | 2/2020 | Yu .......................... H01L 25/105 |
| 2022/0310470 | A1 * | 9/2022 | Chen ................... H01L 25/0652 |

FOREIGN PATENT DOCUMENTS

| | | |
|---|---|---|
| TW | 202205560 A | 2/2022 |
| TW | 202238864 A | 10/2022 |

* cited by examiner

INTEGRATED CIRCUIT PACKAGES AND METHODS OF FORMING THE SAME

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1A, 1B:
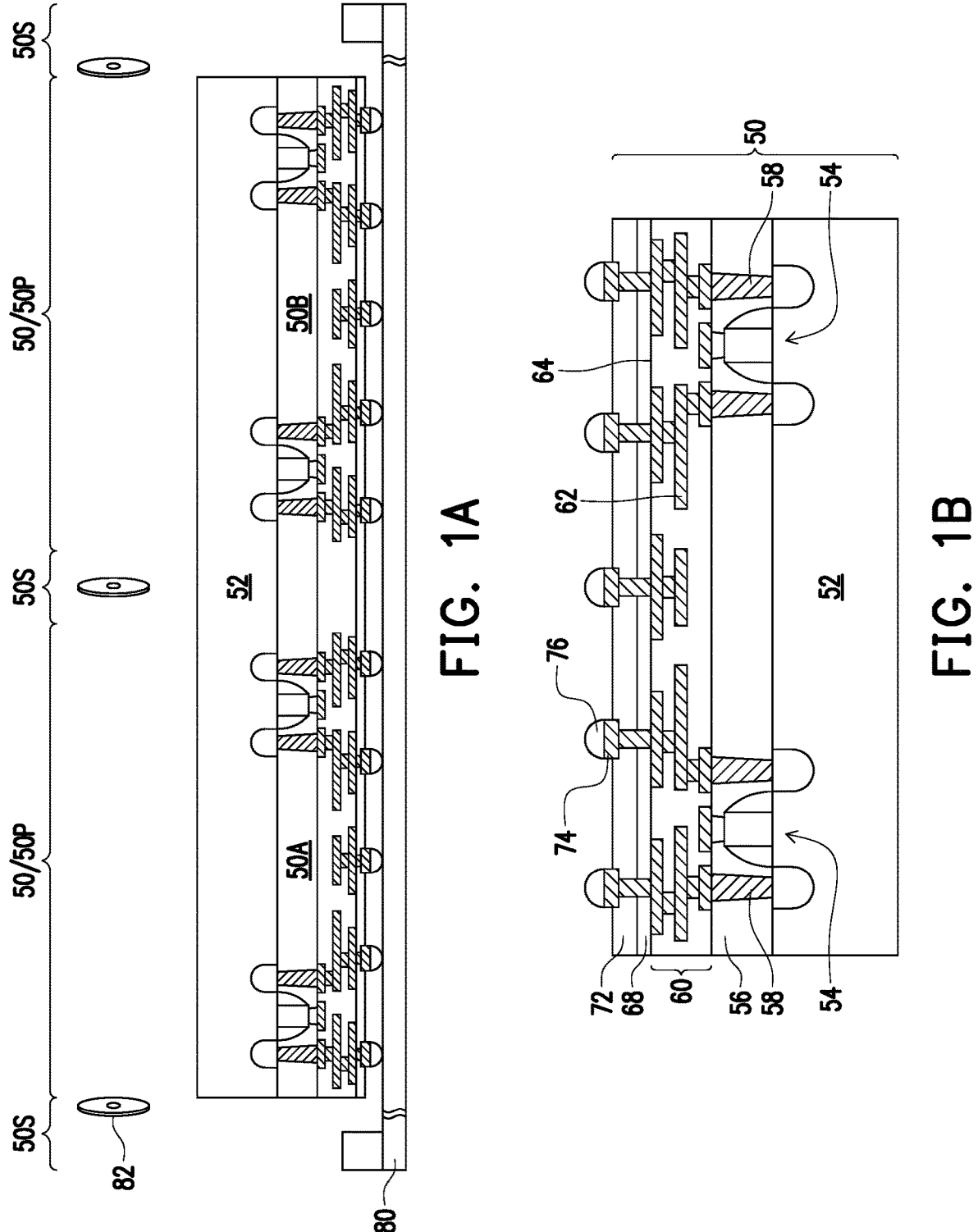
FIGS. 1A and 1B is a cross-sectional views of the formation of an integrated circuit die.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In system-on-integrated-circuit (SOIC) devices, integrated circuit devices (which may also be referred to as dies or chips) are attached together into a single system device package. Embodiments utilize solder bonding techniques, such as utilizing microbumps, to bond the various stacked components together, as further described below. The differences in die widths are then compensated for by utilizing encapsulants such as molding compounds to laterally fill the device. A stacked or 3D package is then singulated from the resulting structure, and used again in another stacked bonding process utilizing solder bonding techniques and a second encapsulant to form a fan-out device which includes the first stacked package. By using solder bonding techniques to form the stacked package, costs and processing times can be reduced to form more cost-effective devices which include advantages associated with fan-out devices and fully system integrated devices.

FIGS. 1A and 1B are cross-sectional views of an integrated circuit die 50. The integrated circuit die 50 will be packaged in subsequent processing to form an integrated circuit device. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

As illustrated in FIG. 1A, the integrated circuit die 50 may be formed in a wafer, which may include different package regions 50P that are singulated in scribe regions 50S to form a plurality of integrated circuit dies 50. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1B), sometimes called a front side, and an inactive surface (e.g., the surface facing downwards in FIG. 1B), sometimes called a back side.

Devices 54 (represented by a transistor) are disposed at the active surface of the semiconductor substrate 52. The devices 54 may be active devices (e.g., transistors, diodes, etc.), capacitors, resistors, etc. For example, the devices 54 may be transistors that include gate structures and source/drain regions, where the gate structures are on channel regions, and the source/drain regions are adjacent the channel regions. The channel regions may be patterned regions of the semiconductor substrate 52. For example, the channel regions may be regions of semiconductor fins, semiconductor nanosheets, semiconductor nanowires, or the like patterned in the semiconductor substrate 52. When the devices 54 are transistors, they may be nanostructure field-effect transistors (Nanostructure-FETs), fin field-effect transistors (FinFETs), planar transistors, or the like.

An inter-layer dielectric 56 is disposed over the active surface of the semiconductor substrate 52. The inter-layer dielectric 56 surrounds and may cover the devices 54. The inter-layer dielectric 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like, which may be formed by a deposition process such as chemical vapor deposition (CVD), atomic layer deposition (ALD), or the like. Contacts 58 extend through the inter-layer dielectric 56 to electrically and physically couple the devices 54. For example, when the devices 54 are transistors, the contacts 58 may couple the gates and source/drain regions of the transistors. The contacts 58 may be formed of a suitable conductive material such as tungsten, cobalt, nickel, copper, silver, gold, aluminum, the like, or combinations thereof, which may be formed by a deposition process such as physical vapor deposition (PVD) or CVD, a plating process such as electrolytic or electroless plating, or the like.

An interconnect structure 60 is disposed over the inter-layer dielectric 56 and contacts 58. The interconnect structure 60 interconnects the devices 54 to form an integrated circuit. The interconnect structure 60 may be formed of, for example, metallization patterns 62 in dielectric layers 64. The dielectric layers 64 may be, e.g., low-k dielectric layers. The metallization patterns 62 include metal lines and vias, which may be formed in the dielectric layers 64 by a damascene process, such as a single damascene process, a dual damascene process, or the like. The metallization patterns 62 may be formed of a suitable conductive material, such as copper, tungsten, aluminum, silver, gold, a combination thereof, or the like. The metallization patterns 62 are electrically coupled to the devices 54 by the contacts 58.

The conductive vias 66 extend into the interconnect structure 60 and/or the semiconductor substrate 52. The conductive vias 66 are electrically coupled to the metallization patterns 62 of the interconnect structure 60. The conductive vias 66 may be through-substrate vias, such as through-silicon vias. As an example to form the conductive vias 66, recesses can be formed in the interconnect structure 60 and/or the semiconductor substrate 52 by, for example, etching, milling, laser techniques, a combination thereof, or the like. A thin barrier layer may be conformally deposited in the recesses, such as by CVD, atomic layer deposition (ALD), physical vapor deposition (PVD), thermal oxidation, a combination thereof, or the like. The barrier layer may be formed from an oxide, a nitride, a carbide, combinations thereof, or the like. A conductive material may be deposited over the barrier layer and in the recesses. The conductive material may be formed by an electro-chemical plating process, CVD, ALD, PVD, a combination thereof, or the like. Examples of conductive materials include copper, tungsten, aluminum, silver, gold, a combination thereof, or the like. Excess conductive material and barrier layer is removed from a surface of the interconnect structure 60 or the semiconductor substrate 52 by, for example, a chemical-mechanical polish (CMP). The remaining portions of the barrier layer and conductive material in the recesses form the conductive vias 66.

In this embodiment, the conductive vias 66 are formed by a via-middle process, such that the conductive vias 66 extend through a portion of the interconnect structure 60 (e.g., a subset of the dielectric layers 64) and extend into the semiconductor substrate 52. The conductive vias 66 formed by a via-middle process are connected to a middle metallization pattern 62 of the interconnect structure 60. In another embodiment, the conductive vias 66 are formed by a via-first process, such that the conductive vias 66 extend into the semiconductor substrate 52 but not the interconnect structure 60. The conductive vias 66 formed by a via-first process are connected to a lower metallization pattern 62 of the interconnect structure 60. In yet another embodiment, the conductive vias 66 are formed by a via-last process, such that the conductive vias 66 extend through an entirety of the interconnect structure 60 (e.g., each of the dielectric layers 64) and extend into the semiconductor substrate 52. The conductive vias 66 formed by a via-last process are connected to the upper metallization pattern 62 of the interconnect structure 60.

One or more passivation layer(s) 68 are disposed on the interconnect structure 60. The passivation layer(s) 68 may be formed of one or more suitable dielectric materials such as silicon oxynitride, silicon nitride, low-k dielectrics such as carbon doped oxides, extremely low-k dielectrics such as porous carbon doped silicon oxide, a polymer such as polyimide, solder resist, polybenzoxazole (PBO), a benzo-cyclobutene (BCB) based polymer, molding compound, the like, or a combination thereof. The passivation layer(s) 68 may be formed by chemical vapor deposition (CVD), spin coating, lamination, the like, or a combination thereof. In some embodiments, the passivation layer(s) 68 include a silicon oxynitride layer or a silicon nitride layer.

A dielectric layer 72 is disposed on the passivation layer(s) 68. The dielectric layer 72 may be formed of an oxide such as silicon oxide, phosphosilicate glass (PSG), borosilicate glass (BSG), boron-doped phosphosilicate glass (BPSG), a tetraethyl orthosilicate (TEOS) based oxide, or the like; a nitride such as silicon nitride or the like; a polymer such as PBO, polyimide, a BCB-based polymer, or the like; a combination thereof; or the like. The dielectric layer 72 may be formed, for example, by CVD, spin coating, lamination, or the like. In some embodiments, the dielectric layer 72 is formed of TEOS-based silicon oxide.

Die connectors 74 extend through the dielectric layer 72 and the passivation layer(s) 68. The die connectors 74 may include conductive pillars, pads, or the like, to which external connections can be made. In some embodiments, the die connectors 74 include bond pads at the front-side surface of the integrated circuit die 50, and include bond pad vias that connect the bond pads to the upper metallization pattern 62 of the interconnect structure 60. In such embodiments, the die connectors 74 (including the bond pads and the bond pad vias) may be formed by a damascene process, such as a single damascene process, a dual damascene process, or the like. The die connectors 74 can be formed of a conductive material, such as a metal, such as copper, aluminum, or the like, which can be formed by, for example, plating, or the like.

Optionally, solder regions 76 may be disposed on the die connectors 74 during formation of the integrated circuit die 50. The solder regions may be used to perform chip probe (CP) testing on the integrated circuit die 50. For example, the solder regions may be solder balls, solder bumps, or the like, which are used to attach a chip probe to the die connectors 74. Chip probe testing may be performed on the integrated circuit die 50 to ascertain whether the integrated circuit die 50 is a known good die (KGD). Thus, only integrated circuit dies 50, which are KGDs, undergo subsequent processing are packaged, and dies which fail the chip probe testing are not packaged. After testing, the solder regions may be removed in subsequent processing steps.

In some embodiments, the integrated circuit die 50 is a stacked device that includes multiple semiconductor substrates 52. For example, the integrated circuit die 50 may be a memory device that includes multiple memory dies such as a hybrid memory cube (HMC) device, a high bandwidth memory (HBM) device, or the like. In such embodiments, the integrated circuit die 50 includes multiple semiconductor substrates 52 interconnected by through-substrate vias (TSVs) such as through-silicon vias. Each of the semiconductor substrates 52 may (or may not) have a separate interconnect structure 60.

After formation of the integrated circuit die 50 in the wafer, a singulation process 82 may be used to separate the package regions 50P of the integrated circuit dies 50 from one another, for example, into the integrated circuit die 50A and integrated circuit die 50B. The singulation process may include a mechanical process such as a sawing process, a cutting process, or the like. In some embodiments, the singulation process may include an etching process, lasering process, mechanical process, and/or combinations thereof. The singulation is performed along the scribe line regions 50S through the passivation layer(s) 68, interconnect structure 60, inter-layer dielectrics 56, and substrate 52. In some embodiments, the wafer may be placed face down and adhered to a handling apparatus 80, such as a frame, tape, or carrier and cut from the back side of the wafer through to the front side of the wafer. After singulation, the completed integrated circuit die 50 may be cleaned to remove any adhesive residue.

FIGS. 2, 3A, 3B, 3C, 3D, 3E, 3F, 3G, 3H, 3I, 3J, 3K, 3L, 3M, and 4 are cross-sectional views of intermediate stages in the manufacturing of first package devices 100, in accordance with some embodiments. Specifically, first package devices 100 are formed by packaging one or more integrated circuit dies 50 in respective package regions 100P. The package regions 100P are separated by scribe line regions 100S. The package regions 100P will be singulated along the scribe line regions 100S in subsequent processing to form the first package devices 100. Processing of one package region 100P is illustrated, but it should be appreciated that any number of package regions 100P can be simultaneously processed to form any number of first package devices 100. The processes described below may be utilized to form first package devices 100 using low-cost bonding techniques in face-to-back chip-on-wafer structures to form reliable, yet low cost devices. The first package devices 100 may be system-on-integrated-chips (SoIC) devices, although other types of packages may be formed.

In accordance with some embodiments, wafer 100W is a package component such as a device wafer including active devices such as transistors and/or diodes, and possibly passive devices such as capacitors, inductors, resistors, or the like. It should be understood that although wafer 100W is referred to as a "wafer," it is not limited to such and any suitable workpiece may be used. Wafer 100W may include a plurality of package regions 100P therein, with one of the package regions 100P illustrated. The package region 100P may alternatively be referred to as chips 100P or (device) dies 100P. In accordance with some embodiments, device die 100P is a logic die, which may be a Central Processing Unit (CPU) die, a Micro Control Unit (MCU) die, an input-output (IO) die, a BaseBand (BB) die, an Application processor (AP) die, or the like. Device die 100P may also be a memory die such as a Dynamic Random-Access Memory (DRAM) die or a Static Random-Access Memory (SRAM) die.

In accordance with alternative embodiments of the present disclosure, wafer 100W is a carrier, which may be formed of a homogenous material such as silicon. In accordance with some embodiments, wafer 100W includes substrate 102, which may be a silicon substrate. Wafer 100W may be free from active devices and passive devices, and/or free from routing metal lines. In accordance with yet alternative embodiments, wafer 100W is or comprises an interposer wafer. In subsequent discussion, a device wafer is discussed as an example package component. The embodiments of the present disclosure may also be applied to other types of package components such as interposer wafers.

In accordance with some embodiments, wafer 100W includes semiconductor substrate 102 and the features formed at a top surface of semiconductor substrate 102. Semiconductor substrate 102 may be formed of crystalline silicon, crystalline germanium, crystalline silicon germanium, or the like. Semiconductor substrate 102 may also be a bulk silicon substrate or a Silicon-On-Insulator (SOI) substrate. Shallow Trench Isolation (STI) regions (not shown) may be formed in semiconductor substrate 102 to isolate the active regions in semiconductor substrate 102.

In accordance with some embodiments, wafer 100W includes integrated circuit devices 104, which are formed on the top surface of semiconductor substrate 102. Example integrated circuit devices 104 may include Complementary Metal-Oxide Semiconductor (CMOS) transistors, resistors, capacitors, diodes, and/or the like. The details of integrated circuit devices 104 are not illustrated herein. In accordance with alternative embodiments, wafer 100W is used for forming interposers, which are free from active devices and passive devices.

Inter-Layer Dielectric (ILD) 106 is formed over semiconductor substrate 102, and fills the space between the gate stacks of transistors (not shown) in integrated circuit devices 104. In accordance with some embodiments, ILD 106 is formed of Phospho Silicate Glass (PSG), Boro Silicate Glass (BSG), Boron-Doped Phospho Silicate Glass (BPSG), Fluorine-Doped Silicate Glass (FSG), silicon oxide, or the like. ILD 106 may be formed using spin coating, Flowable Chemical Vapor Deposition (FCVD), Chemical Vapor Deposition (CVD), Plasma Enhanced Chemical Vapor Deposition (PECVD), Low Pressure Chemical Vapor Deposition (LPCVD), or the like.

Contact plugs 108 are formed in ILD 106, and are used to electrically connect integrated circuit devices 104 to overlying metal lines and vias 112. In accordance with some embodiments, contact plugs 108 are formed of a conductive material selected from tungsten, aluminum, copper, titanium, tantalum, titanium nitride, tantalum nitride, alloys thereof, and/or multi-layers thereof. The formation of contact plugs 108 may include forming contact openings in ILD 106, filling a conductive material(s) into the contact openings, and performing a planarization (such as Chemical Mechanical Polish (CMP) process) to level the top surfaces of contact plugs 108 with the top surface of ILD 106.

Through-Silicon Vias (TSVs) 116, sometimes referred to as through-semiconductor vias or through-vias, are formed to extend from a top surface of semiconductor substrate 102 (or a top surface of the ILD 106) to an intermediate level between the top surface and the bottom surface of semiconductor substrate 102. TSVs 116 are used to connect the devices and metal lines formed on the front side (the illustrated top side) of semiconductor substrate 102 to the backside in the resulting package.

Interconnect structure 110 is formed over ILD 106 and contact plugs 108. Interconnect structure 110 includes dielectric layers 114, and metal lines and vias 112 formed in dielectric layers 114. Dielectric layers 114 are alternatively referred to as Inter-Metal Dielectric (IMD) layers 114 hereinafter. In accordance with some embodiments, at least the lower ones of dielectric layers 114 are formed of a low-k dielectric material having a dielectric constant (k-value) lower than about 3.5 or about 3.0. Dielectric layers 114 may be formed of a carbon-containing low-k dielectric material, Hydrogen SilsesQuioxane (HSQ), MethylSilsesQuioxane (MSQ), or the like. In accordance with alternative embodiments of the present disclosure, some or all of dielectric layers 114 are formed of non-low-k dielectric materials such as silicon oxide, silicon carbide (SiC). silicon carbo-nitride (SiCN), silicon oxy-carbo-nitride (SiOCN), or the like. Etch stop layers (not shown), which may be formed of silicon carbide, silicon nitride, aluminum oxide, aluminum nitride, or the like, or multi-layers thereof, are formed between IMD layers 114, and are not shown for simplicity.

Metal lines and vias 112 are formed in dielectric layers 114. The metal lines 112M at a same level may collectively be referred to as a metal layer. In accordance with some embodiments, interconnect structure 110 includes a plurality of metal layers that are interconnected through the vias 112V. Metal lines and vias 112 may be formed through single damascene and/or dual damascene processes. Metal lines and vias 112 may include diffusion barriers and copper-containing metallic materials over the corresponding diffusion barriers. The diffusion barriers may include titanium, titanium nitride, tantalum, tantalum nitride, or the like.

Metal lines 112M include metal lines/pads in an uppermost layer of the interconnect structure 110 (furthest from the integrated circuit devices 104), which are sometimes referred to as top metal lines. Top metal lines/pads of the metal lines 112M are also collectively referred to as being a top metal layer. The respective top dielectric layer 114 for the top metal layer may be formed of a non-low-k dielectric material such as Un-doped Silicate Glass (USG), silicon oxide, silicon nitride, and/or the like. The top dielectric layer 114 may also be formed of a low-k dielectric material, which may be selected from the similar candidate materials of the underlying IMD layers 114.

Next, passivation layer 118 is formed over interconnect structure 110. In accordance with some embodiments, passivation layer 118 is formed of a non-low-k and dense dielectric material having a dielectric constant equal to or greater than the dielectric constant of silicon oxide. Passivation layer 118 may be formed of or comprise an inorganic dielectric material, which may include a material selected from, and is not limited to, silicon nitride (SiN), silicon oxide (SiO$_2$), silicon oxy-nitride (SiON), silicon oxy-carbide (SiOC), or the like, combinations thereof, and/or multilayers thereof. In accordance with some embodiments, passivation layer 118 is formed using High Density Plasma Chemical Vapor Deposition (HDPCVD), Plasma-Enhanced Chemical Vapor Deposition (PECVD), Atomic Layer Deposition (ALD), or the like.

Figures 2, 3A:
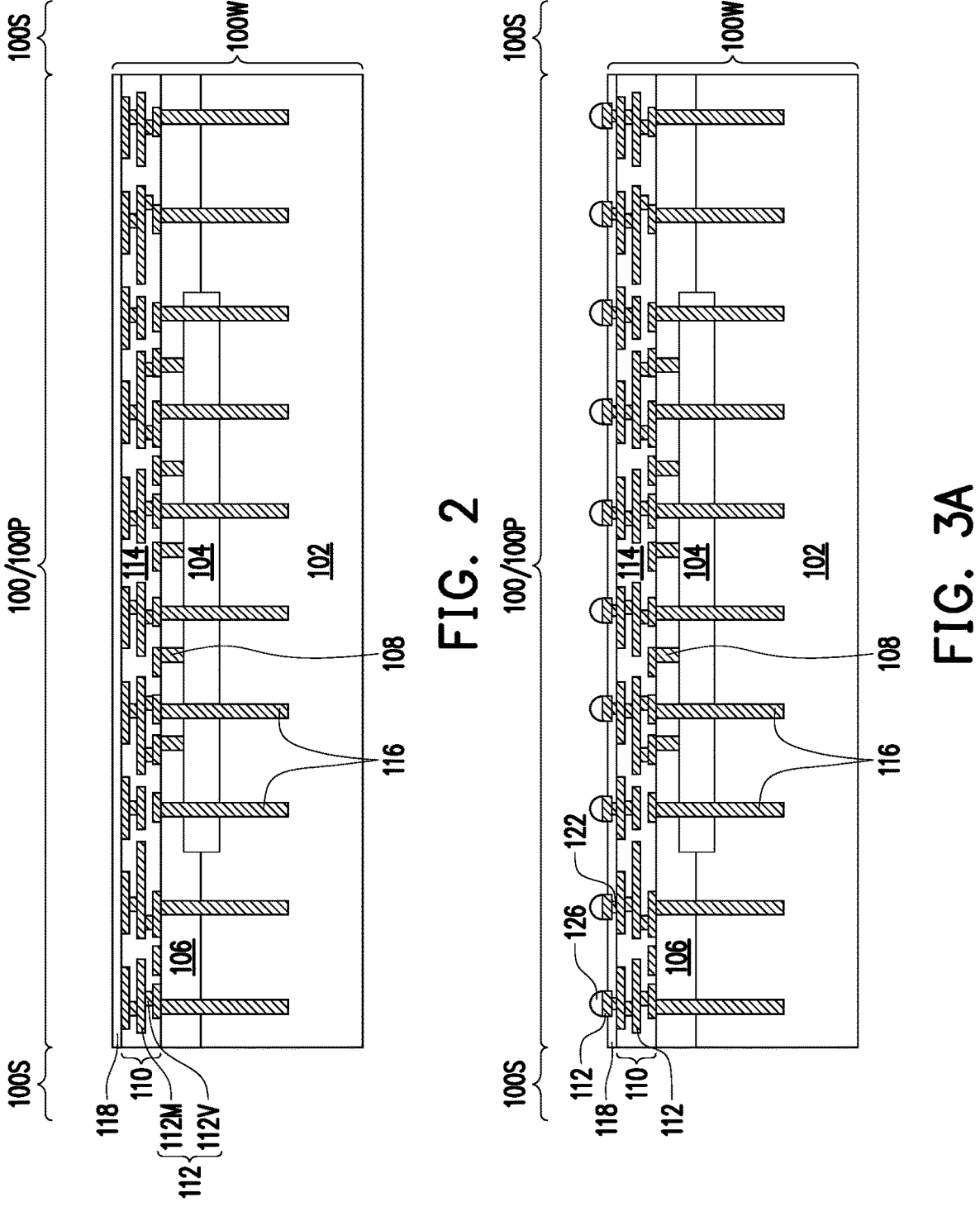
FIGS. 2, 3A, 3B, 3C, 3D, 3E, 3F, 3G, 3H, 3I, 3J, 3K, 3L, and 3M are cross-sectional views of intermediate stages in the manufacturing of integrated circuit packages, in accordance with some embodiments.

The structure of FIG. 2 may be used to form a first package device 100 by attaching an integrated circuit die 50 thereto and singulating the wafer 100W into individual first package devices 100. The integrated circuit die 50 may be attached to a face of the wafer 100W or to the back of the wafer 100W. The face of the wafer 100W is the side of the wafer where the interconnect structure 110 is formed and is closest to the devices 104. The back side of the wafer 100W is where the substrate 102 is located. FIGS. 3A-3M illustrate intermediate stages of a process of forming a first package device 100 from the wafer 100W of FIG. 2 where the integrated circuit die 50 is attached to the wafer 100W at a back side of the wafer 100W. Or, in other words, the integrated circuit die 50 is attached face-to-back with the wafer 100W. FIGS. 7A-7M illustrate intermediate stages of a process of forming a first package device 100 from the wafer 100W of FIG. 2 where the integrated circuit die 50 is attached to the wafer 100W at a front side of the wafer 100W. Or, in other words, the integrated circuit die 50 is attached face-to-face with the wafer 100W. Rather than performing the attaching using direct metal-to-metal bonding techniques, a chip on wafer technique is used to perform the attaching using solder bonding, resulting in reduced process times and lest costly integration.

As noted above, FIGS. 3A-3M illustrate intermediate stages of a process of forming a first package device 100 from the wafer 100W of FIG. 2 where the integrated circuit die 50 is attached to the wafer 100W at a back side of the wafer 100W. As shown in FIG. 3A, vias 122 and bond pads 124 are formed at a front side of the wafer 100W. In accordance with some embodiments, the formation process of vias 122 and bond pads 124 includes etching passivation layer 118 to form trenches and via openings, filling the trenches and via openings with a conformal barrier layer and a metallic material, and performing a planarization process such as a Chemical Mechanical Polish (CMP) process or a mechanical grinding process to remove excess portions of the barrier layer and the metallic material. The remaining portions of the barrier layer and the metallic material are vias 122 and bond pads 124. In accordance with some embodiments, the barrier layer comprises Ti, TiN, Ta, TaN or the like. The metallic material may include copper.

FIG. 3A further illustrates the formation of electrical connectors 126, which may be formed through plating, printing, stenciling, ball dropping, and so forth, or the like, utilizing eutectic materials such as solder. Electrical connectors 126 may also include nickel, Electroless Nickel Immersion Gold (ENIG), Electroless Nickel Electroless Palladium Immersion Gold (ENEPIG), and/or the like. In accordance with some embodiments, the formation of electrical connectors 126 may include forming Under-Bump Metallurgies (UBMs) (e.g., as bond pads 124), placing solder balls on the UBMs, and then reflowing the solder balls. The resulting electrical connectors 126 thus may include solder regions. In accordance with other embodiments, the formation of electrical connectors 126 includes performing a plating process to form solder layers over the UBMs, and then reflowing the solder layers.

Figures 3B, 3C:
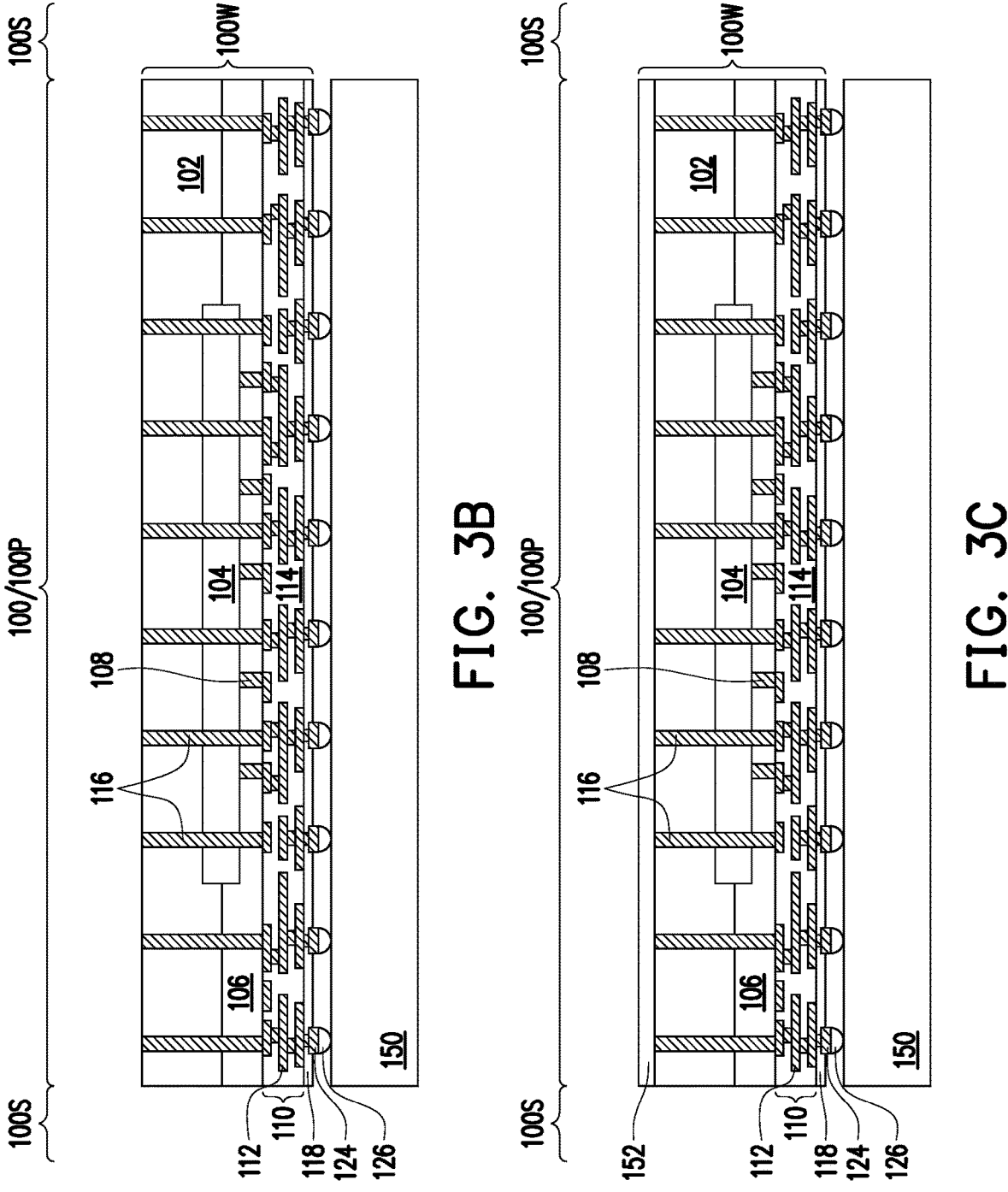

The structure in FIG. 3A is flipped over in FIG. 3B and placed on a support carrier 150. The support carrier 150 may be a carrier substrate, a frame, a tape, or the like. The support carrier 150 is a handling apparatus for holding the wafer 100W while processing the back side of the wafer 100W. In some embodiments, an adhesive may be deposited on the support carrier 150 and/or the wafer 100W and the wafer 100W adhered to the support carrier 150.

Also illustrated in FIG. 3B, the back side of the wafer 100W may be thinned to expose the TSVs 116. The thinning may be accomplished through a backside grinding process performed on the substrates 102 to thin the wafer 100W. Due to the backside grinding, TSVs 116 of the wafer 100W device die are revealed.

In FIG. 3C, a dielectric layer 152 may be deposited over the backside of the wafer 100W. The dielectric layer 152 may be formed from any suitable material such as a polyimide, polybenzoxazole (PBO), benzocyclobutene (BCB), or the like, using any suitable process, such as by spin coating or the like. Adding the dielectric layer 152 provides additional thickness to the wafer 100W after thinning the wafer 100W to expose the TSVs 116.

Figure 3D:
Figure 3D:
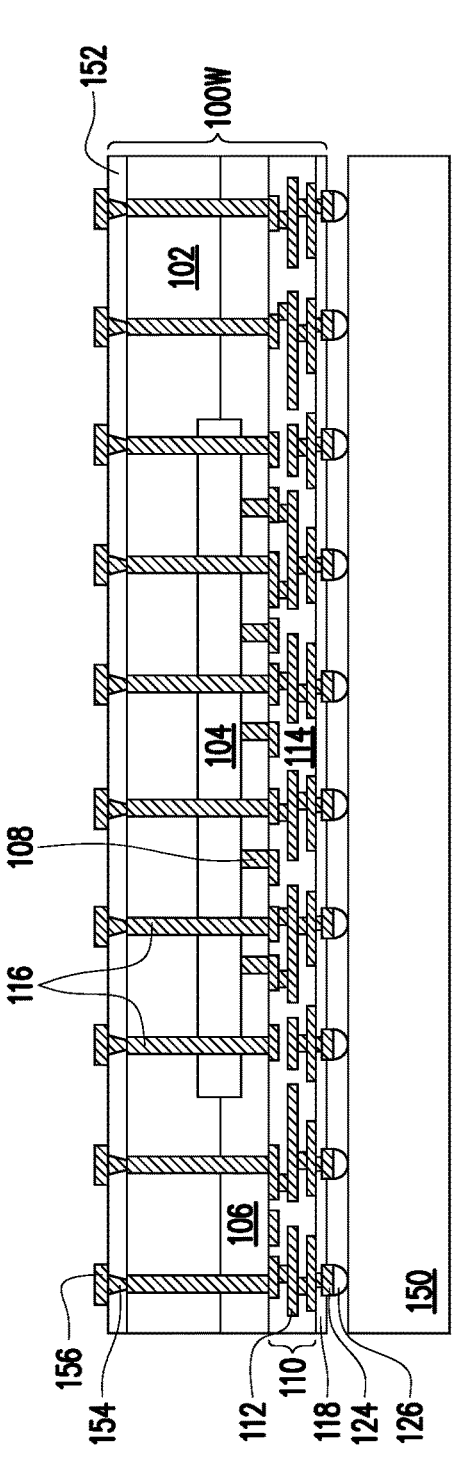

In FIG. 3D, openings are formed through the dielectric layer 152 and vias 154 and contact pads 156 are formed over the TSVs 116 to electrically couple the TSVs 116 to the contact pads 156. The patterning to form the openings may be done by an acceptable process, such as by exposing the dielectric layer 152 to light when the dielectric layer 152 is a photo-sensitive material or by etching using, for example, an anisotropic etch. If the dielectric layer 152 is a photosensitive material, the dielectric layer 152 can be developed after the exposure.

The vias 154 and contact pads 156 may be formed by a plating process, including, for example, forming a seed layer over the dielectric layer 152 and in the openings. Then, a photoresist layer can be formed over the dielectric layer 152 and opening formed therein corresponding to the contact pads 156. Then, the vias 154 and contact pads 156 may be plated using a electrochemical plating or electroplating process. The photoresist layer can be removed and the now exposed seed layer removed by an etching process.

Figure 3E:
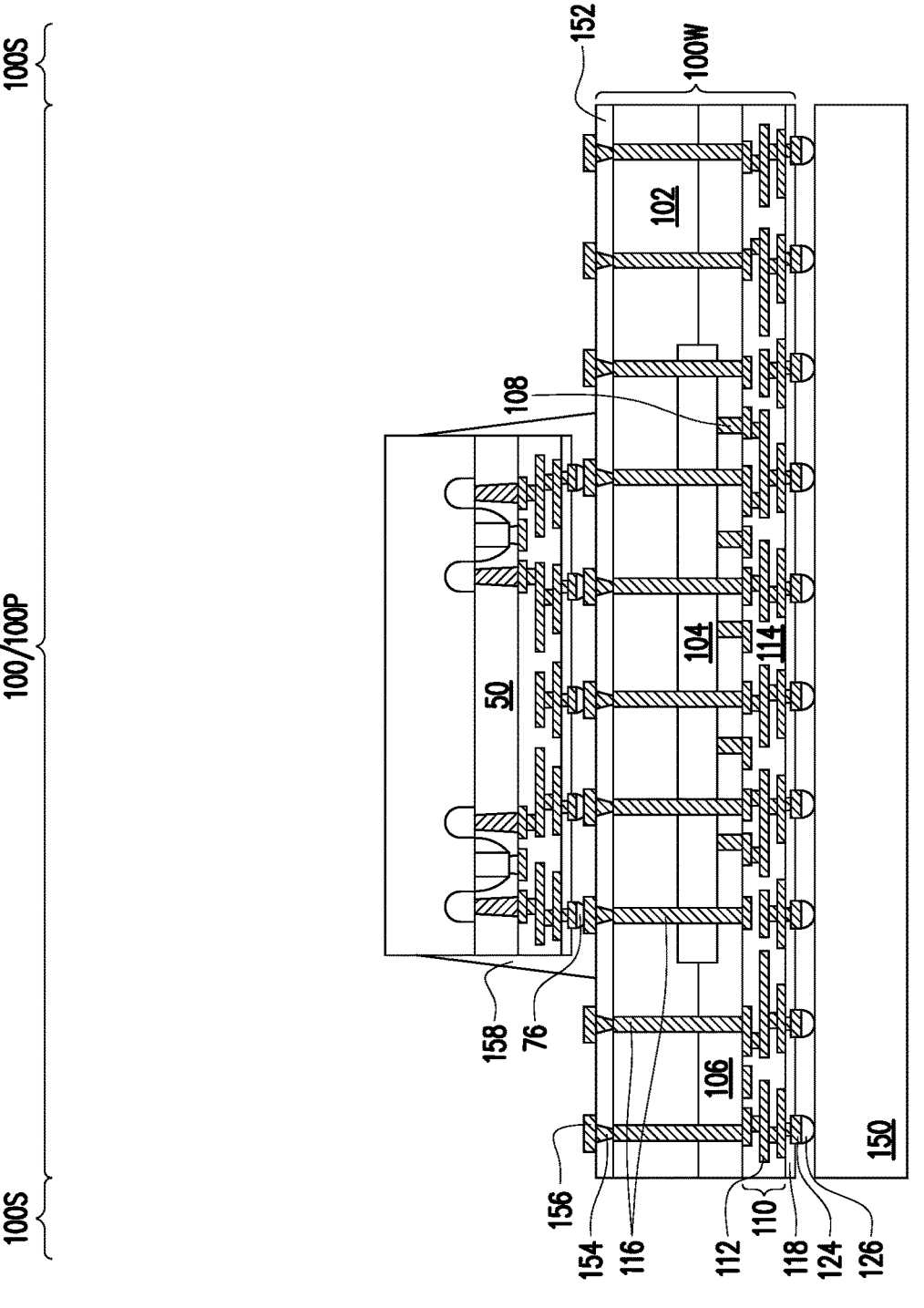

In FIG. 3E, the integrated circuit die 50 is mounted to the contact pads of the wafer 100W using the solder regions 76 of the integrated circuit die 50. In some embodiments, the integrated circuit die 50 may be mounted using a pick and place process, and reflowing the solder regions 76 to couple the contact pads 156 to the die connectors 74. In some embodiments, some of the contact pads 156 may remain exposed and unbonded after mounting the integrated circuit die 50. In some embodiments, an underfill 158 is formed between the integrated circuit die 50 and the wafer 100W, surrounding the solder regions 76 and the joints between the solder regions 76 and the contact pads 156. The underfill 158 may reduce stress and protect the joints resulting from the reflowing of the solder region 76. The underfill 158 may be formed by a capillary flow process after the integrated circuit die 50 is attached, or may be formed by a suitable deposition method before the integrated circuit die 50 is attached. In some embodiments, the underfill 158 may extend up sidewalls of the integrated circuit die 50. A vertical extent of the underfill 158 may extend to a portion of the semiconductor substrate 52 (see FIG. 1B) of the integrated circuit die 50 in some embodiments, such as illustrated in FIG. 3E. In other embodiments, the entire sidewall of the integrated circuit die 50 may be covered by the underfill 158. In yet other embodiments, the underfill 158 may be positioned entirely below the integrated circuit die 50 or may extend along the sidewall of the integrated circuit die 50 to a lesser vertical extent.

Figure 3F:
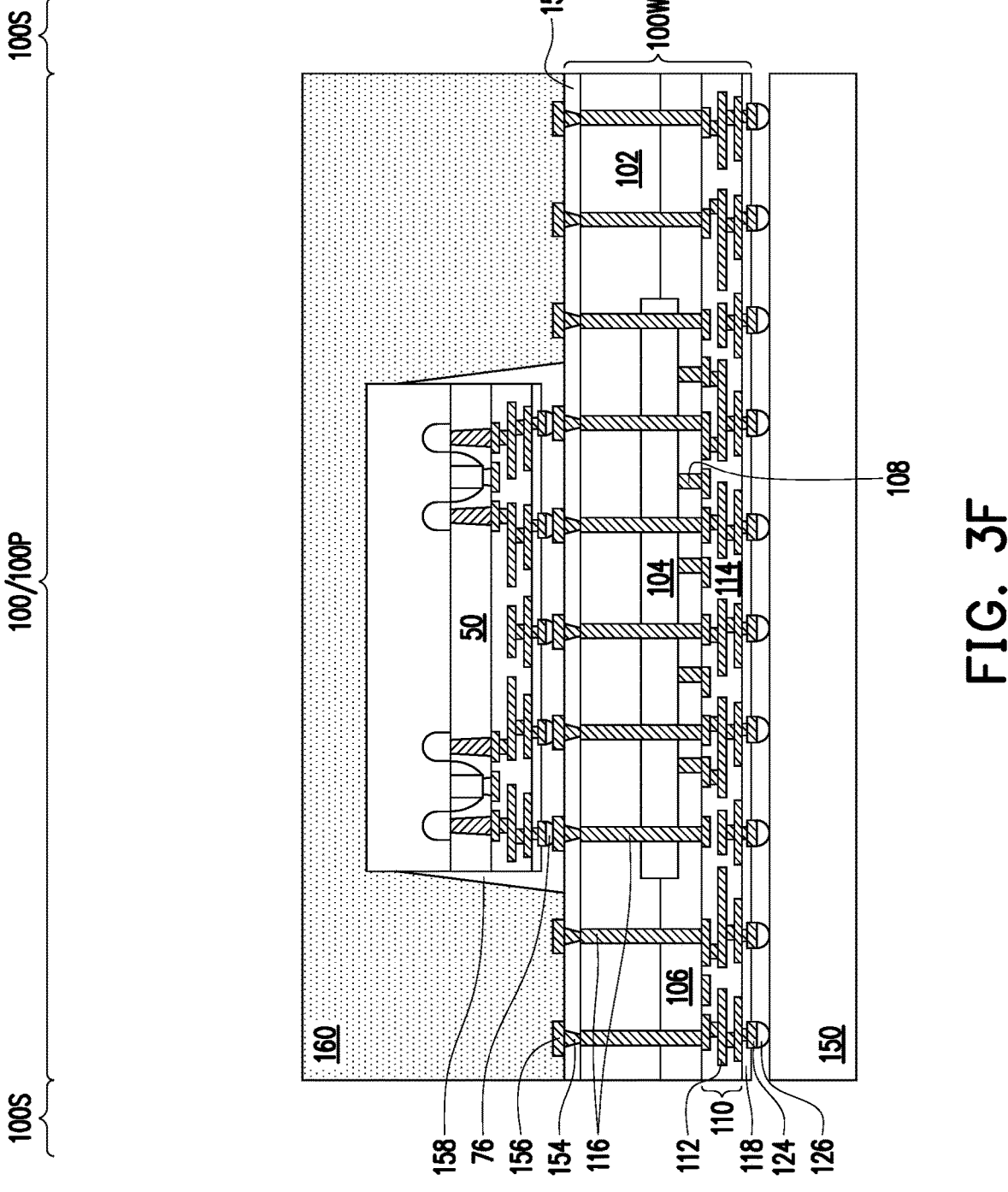

In FIG. 3F, a first encapsulant 160 is formed on and around the various components. After formation, the encapsulant 160 laterally encapsulates the integrated circuit die 50 and is disposed over any of the contact pads 156 which are not coupled. The encapsulant 160 may be a molding compound, epoxy, or the like. The encapsulant 160 may be applied by compression molding, transfer molding, or the like, and may be formed over the polymer dielectric layer 152, contacting an upper surface thereof. The encapsulant 160 may be applied in liquid or semi-liquid form and then subsequently cured. The encapsulant 160 laterally surrounds the underfill 158, including a portion of the underfill 158 which extends along a sidewall of the integrated circuit die 50.

Figure 3G:
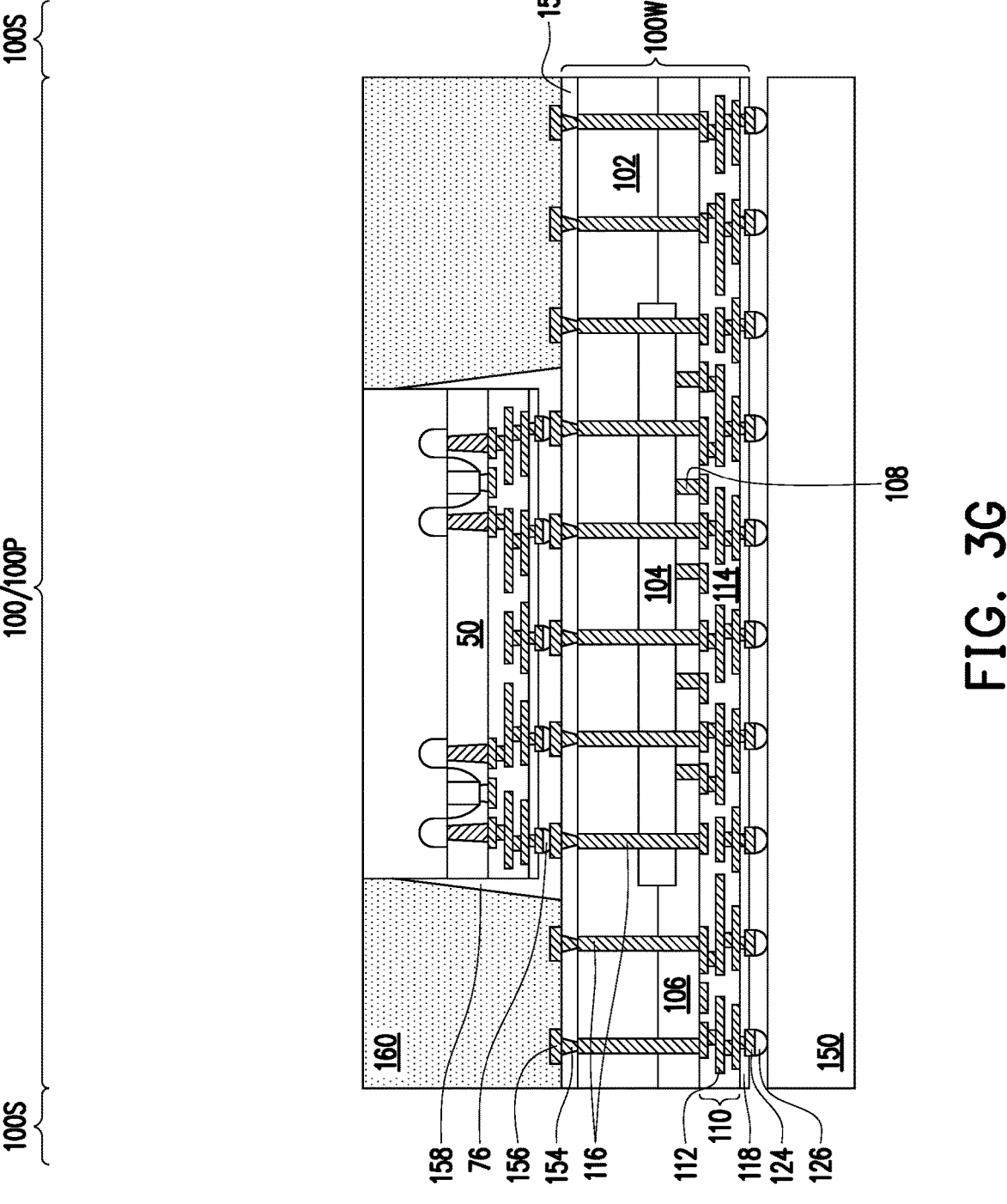

In FIG. 3G, a planarization process is then performed on the encapsulant 160 to level an upper surface of the encapsulant 160 with an upper surface of the integrated circuit die 50 (e.g., the substrate 52). Such upper surfaces are substantially coplanar after the planarization process within process variations. The planarization process may be, for example, a chemical-mechanical polish (CMP), a grinding process, or the like.

Figure 3H:
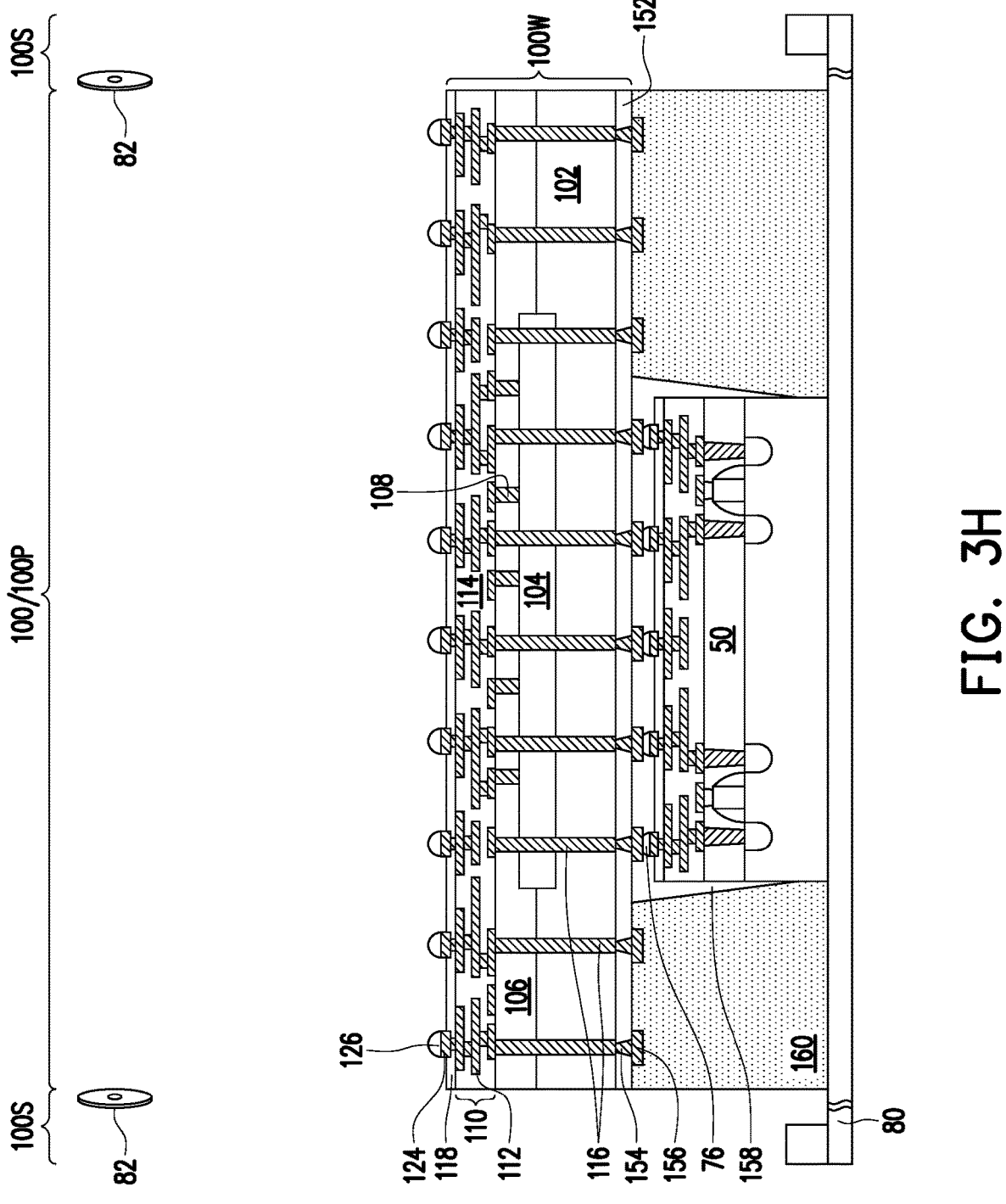

In FIG. 3H, after formation of the encapsulant 160 and the planarization thereof, a singulation process 82 may be used to separate the package regions 100P of the first package devices 100 from one another, for example, into the first package devices 100A and 100B. The singulation process 82 may include a mechanical process such as a sawing process, a cutting process, or the like. In some embodiments, the singulation process 82 may include an etching process, lasering process, mechanical process, and/or combinations thereof. The singulation is performed along the scribe line regions 100S through the passivation layer 118, interconnect structure 110, ILD 106, substrate 102, polymer dielectric layer 152, and encapsulant 160. In some embodiments, the wafer may be removed from the carrier 150 and rotated to be face up and adhered to a handling apparatus 80, such as a frame, tape, or carrier. Then the wafer may be cut from the front side of the wafer through to the back side of the wafer. After singulation, the completed first package device 100 may be cleaned to remove any adhesive residue, such as adhesive residue used to attach the electrical connectors 126 to the carrier 150.

Figure 3I:
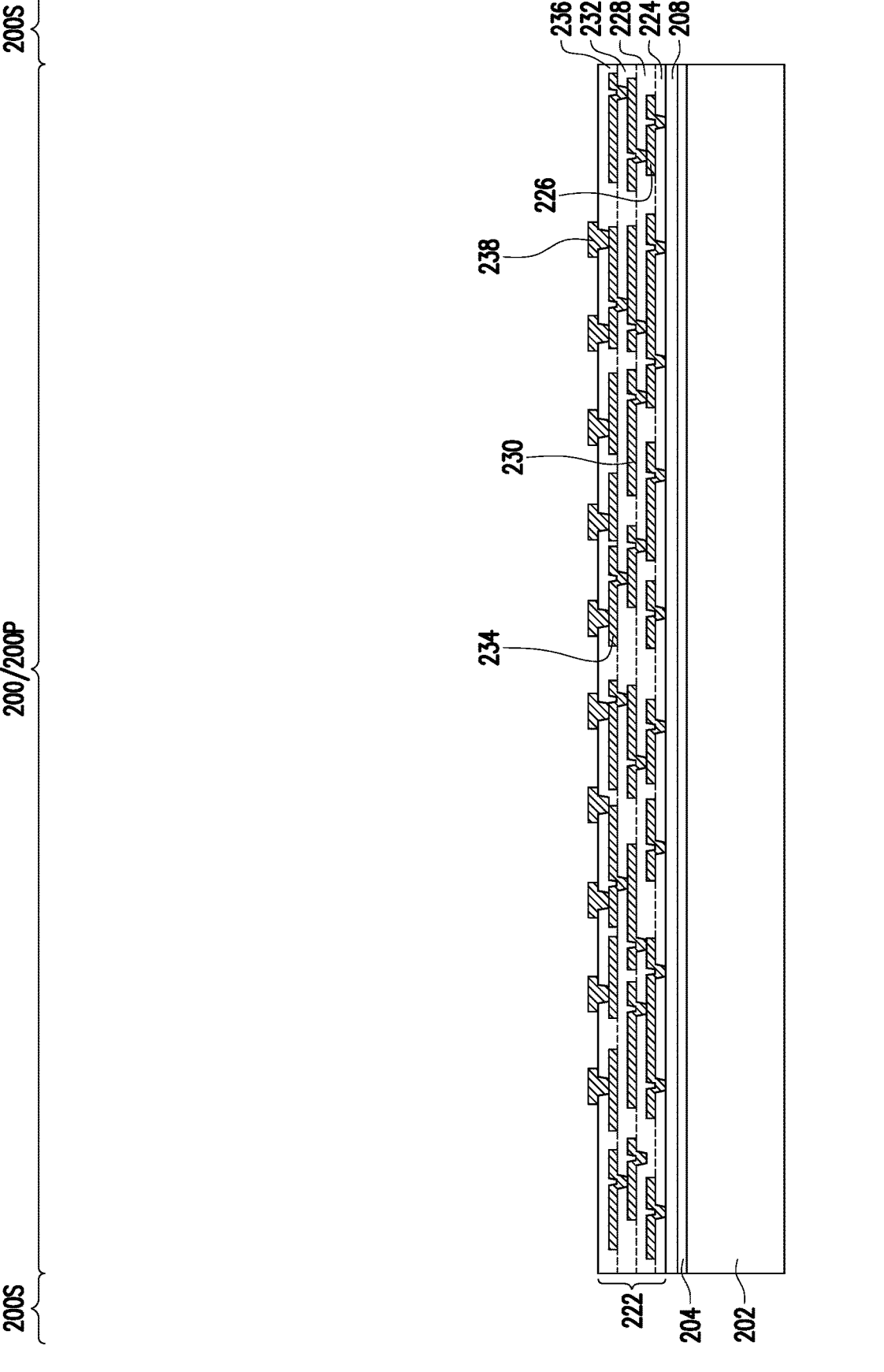

In FIGS. 3I through 3M, a second package device 200 is formed which includes the first package device 100. In FIG. 3I, a workpiece includes a carrier substrate 202, which is prepared for receiving first package devices 100. The carrier substrate 202 may be a semiconductor substrate or another type of substrate, such as a glass carrier substrate, a ceramic carrier substrate, or the like. The carrier substrate 202 may be a wafer, such that multiple packages can be formed on the carrier substrate 202 simultaneously. A release layer 204 is formed on the carrier substrate 202. The release layer 204 may be formed of a polymer-based material, which may be removed along with the carrier substrate 202 from the overlying structures that will be formed in subsequent steps. In some embodiments, the release layer 204 is an epoxy-based thermal-release material, which loses its adhesive property when heated, such as a light-to-heat-conversion (LTHC) release coating. In other embodiments, the release layer 204 may be an ultra-violet (UV) glue, which loses its adhesive property when exposed to UV lights. The release layer 204 may be dispensed as a liquid and cured, may be a laminate film laminated onto the carrier substrate 202, or may be the like. The top surface of the release layer 204 may be leveled and may have a high degree of planarity.

Next, in FIG. 3I, in some embodiments, a redistribution structure 222 may be formed on the release layer 204. In the embodiment shown, a dielectric layer 208 is formed on the release layer 204, while in other embodiments the dielectric layer 208 may be omitted. The redistribution structure 222 is formed on the dielectric layer 208 (if used, or on the release layer 204) and includes a first dielectric layer 224, a metallization pattern 226 (sometimes referred to as redistribution layers or redistribution lines), and a dielectric layer 228. Two additional metallization patterns 230 and 234 are illustrated in the shown embodiment, but it should be understood that fewer or more metallization patterns may be utilized. The metallization patterns 230 and 234 are separated from each other by additional dielectric layer 232. An upper dielectric layer 236 is formed over the upper metallization pattern 234. The redistribution structure 222 is optional. In some embodiments, a dielectric layer (e.g., the dielectric layer 208) without a redistribution structure is formed on the release layer 204 in lieu of the redistribution structure 222.

The dielectric layer 208 (if used) may be formed on the release layer 204. The bottom surface of the dielectric layer 208 may be in contact with the top surface of the release layer 204. In some embodiments, the dielectric layer 208 is formed of a polymer, such as polybenzoxazole (PBO), polyimide, benzocyclobutene (BCB), or the like. In other embodiments, the dielectric layer 208 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 208 may be formed by any acceptable deposition process, such as spin coating, CVD, laminating, the like, or a combination thereof. The dielectric layer 224 may be formed using similar materials and processes as the dielectric layer 208. In some embodiments, the dielectric layer 208 may be a different material than the dielectric layer 224 and may act as an etch stop.

The metallization pattern 226 may be formed on the dielectric layer 224. As an example to form metallization pattern 226, a seed layer is formed over the dielectric layer 224. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 226. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 226. In some embodiments, prior to forming the seed layer, openings in the dielectric layer 224 may be made so that when the seed layer and metallization pattern 226 is formed, the metallization pattern 226 extends through the dielectric layer 224 where the openings were made so that conductive vias are formed through the dielectric layer 224. The openings may be made using an acceptable photo-etching process (see, e.g., description below with respect to the dielectric layer 228).

The dielectric layer 228 may be formed on the metallization pattern 226 and the dielectric layer 224. In some embodiments, the dielectric layer 228 is formed of a polymer, which may be a photo-sensitive material such as PBO, polyimide, BCB, or the like, that may be patterned using a lithography mask. In other embodiments, the dielectric layer 228 is formed of a nitride such as silicon nitride; an oxide such as silicon oxide, PSG. BSG, BPSG; or the like. The dielectric layer 228 may be formed by spin coating, lamination, CVD, the like, or a combination thereof. The dielectric layer 228 is then patterned to form openings exposing portions of the metallization pattern 226. The patterning may be formed by an acceptable process, such as by exposing the dielectric layer 228 to light when the dielectric layer 228 is a photo-sensitive material or by etching using, for example, an anisotropic etch. If the dielectric layer 228 is a photo-sensitive material, the dielectric layer 228 can be developed after the exposure.

Following the formation of the openings in the dielectric layer 228, a second metallization pattern 230 may be formed on the dielectric layer 228 and in the openings in the dielectric layer 228 to contact the metallization pattern 226. The second metallization pattern 230 may be formed using processes and materials similar to those discussed above with respect to the metallization pattern 226. Portions of the second metallization pattern 230 may extend through the openings in the dielectric layer 228 and contact the metallization pattern 226, thereby forming conductive vias through the dielectric layer 228.

Following the formation of the second metallization pattern 230 another dielectric layer 232 may be formed on the metallization pattern 230 and the dielectric layer 228. The dielectric layer 232 may be formed using processes and materials similar to those discussed above with respect the dielectric layer 228. Further, openings may be formed in the dielectric layer 232 which expose portions of the second metallization pattern 230 using similar processes as those used to form the openings in the dielectric layer 228.

A third metallization pattern 234 may then be formed on the dielectric layer 232 and in the openings of the dielectric layer 232. The third metallization pattern 234 may be formed using processes and materials similar to those discussed above with respect to the metallization pattern 226. Portions of the third metallization pattern 234 may extend through the openings in the dielectric layer 232 and contact the metallization pattern 230, thereby forming conductive vias through the dielectric layer 232.

An upper dielectric layer 236 may be formed over the uppermost metallization pattern (e.g., the third metallization pattern 234) using processes and materials similar to those described above with respect to the dielectric layer 228. Openings corresponding to subsequently formed under bump metallizations (UBMs) 238 may be formed through the upper dielectric layer 236 using similar processes as those used to form the openings in the dielectric layer 228. The openings may expose portions of the upper uppermost metallization pattern.

It should be appreciated that the redistribution structure 222 may include any number of dielectric layers and metallization patterns. If more dielectric layers and metallization patterns are to be formed, steps and processes discussed above may be repeated. If fewer dielectric layers and metallization patterns are desired, then steps and processes discussed above may be omitted as needed. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically couple the various conductive lines.

Rather than form contact pads for direct metal-to-metal bonding, UBMs 238 are formed for connecting first package devices to the redistribution structure 222. The UBMs 238 have bump portions on and extending along the major surface of the dielectric layer 236, and have via portions extending through the dielectric layer 236 to physically and electrically couple the metallization pattern 234. The UBMs 238 may be formed of the same material as the metallization pattern 226. In some embodiments, the UBMs 238 have a different size than the metallization patterns 226, 230, and 234.

Figure 3J:
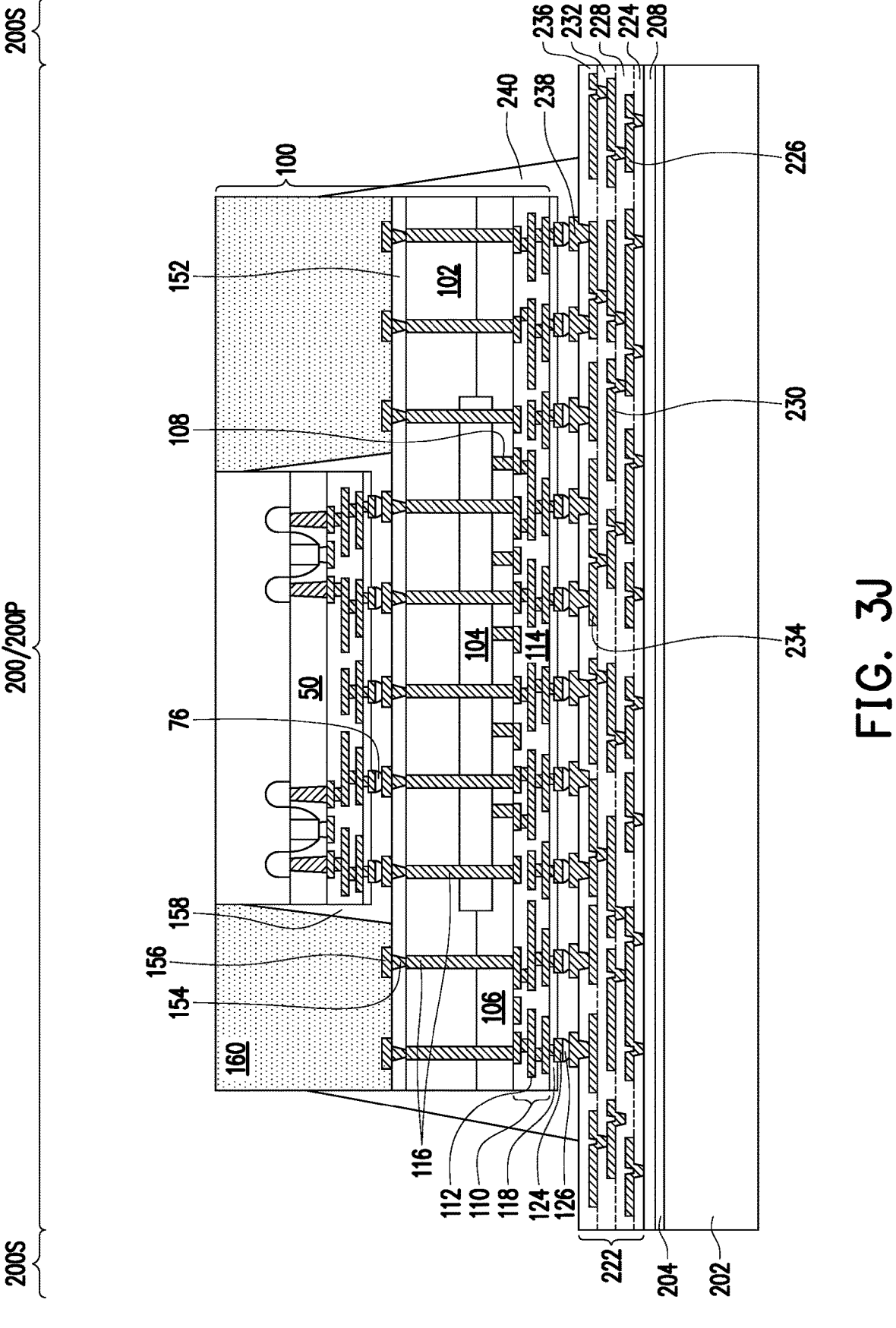

In FIG. 3J, first package devices 100 are attached to the carrier substrate 102 or redistribution structure 222 in a face-down manner, such that the front-sides of the first package devices 100 are attached to the redistribution structure 222. One first package devices 100 is placed in each package region 200P. The first package devices 100 may be placed by, e.g., a pick-and-place process. The first package devices 100 may be attached to the redistribution structure 222 by aligning the electrical connectors 126 to the UBMs 238 and reflowing the electrical connectors 126 to attach the first package devices 100 to the redistribution structure 222 both electrically and physically.

In some embodiments, an underfill 240 is formed between the first package devices 100 and the redistribution structure 222, surrounding the electrical connectors 126 and the joints between the electrical connectors 126 and the UBMs 238. The underfill 240 may reduce stress and protect the joints resulting from the reflowing of the electrical connectors 126. The underfill may be formed by a capillary flow process after the first package devices 100 are attached, or may be formed by a suitable deposition method before the first package devices 100 are attached. In some embodiments, the underfill 240 may extend up sidewalls of the first package devices 100. A vertical extent of the underfill 240 may extend to a portion of the first encapsulant 160 of the first package devices 100 in some embodiments, such as illustrated in FIG. 3J. In other embodiments, the entire sidewall of the first package devices 100 may be covered by the underfill 240. In yet other embodiments, the underfill 240 may be positioned entirely below the first package devices 100 or may extend along the sidewall of the first package devices 100 to a lesser vertical extent.

Figure 3K:
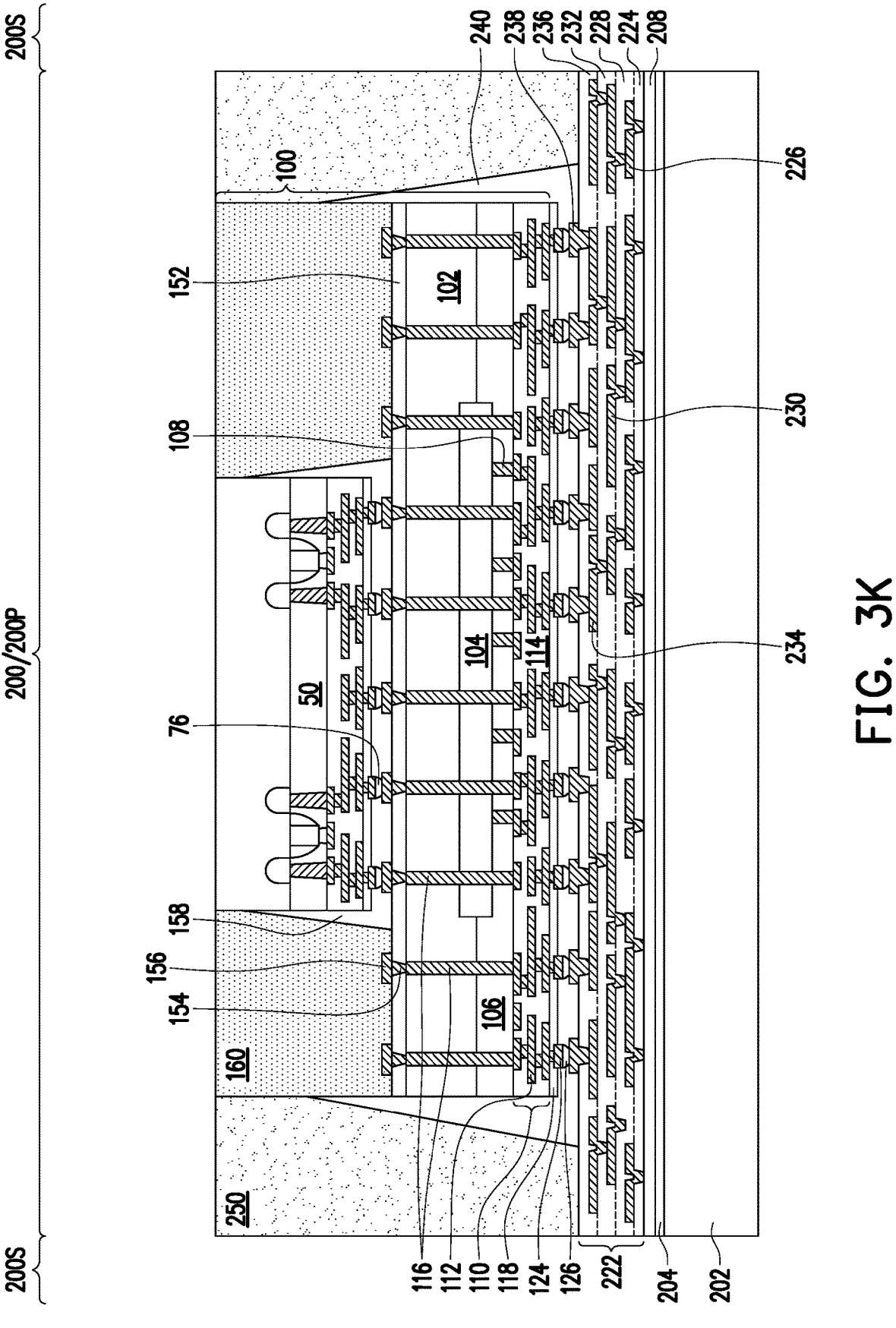

In FIG. 3K, a second encapsulant 250 is formed on and around the various components. After formation, the second encapsulant 250 laterally encapsulates the first package devices 100 and is disposed over any UBMs 238 which are not coupled. The second encapsulant 250 may be a molding compound, epoxy, or the like. The second encapsulant 250 may be applied by compression molding, transfer molding, or the like, and may be formed over the dielectric layer 236, contacting an upper surface thereof. The second encapsulant 250 may be applied in liquid or semi-liquid form and then subsequently cured. The second encapsulant 250 laterally surrounds the underfill 240, including a portion of the underfill 240 which extends along a sidewall of the first package devices 100. In some embodiments, a portion of the underfill 240 may be sandwiched between the first encapsulant 160 and the second encapsulant 250. A portion of the second encapsulant 250 may also be in contact with sidewalls of the first encapsulant 160, as well as disposed over an upper surface of the integrated circuit die 50 and first encapsulant 160. A planarization process is then performed on the second encapsulant 250 to level an upper surface of the second encapsulant 250 with an upper surface of the first package devices 100 (e.g., the upper surface of the first encapsulant 160 and upper surface of the integrated circuit die 50). Such upper surfaces are substantially coplanar after the planarization process within process variations. The planarization process may be, for example, a chemical-mechanical polish (CMP), a grinding process, or the like.

Figure 3L:
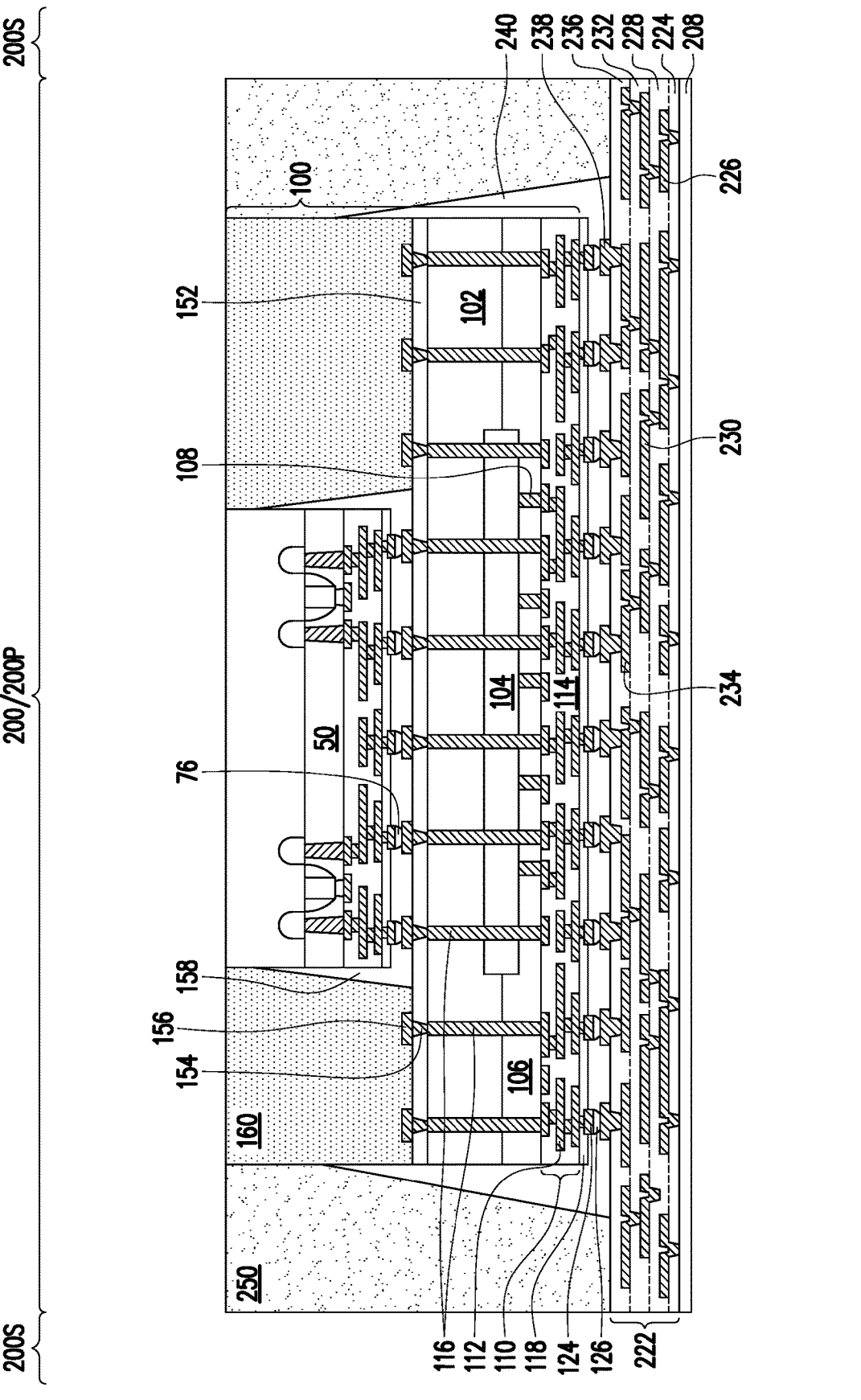

In FIG. 3L, a carrier substrate de-bonding is performed to detach (or "de-bond") the carrier substrate 202 (see FIG. 3K) from the second package device 200. In accordance with some embodiments, the de-bonding includes projecting a light such as a laser light or an UV light on the release layer 204 so that the release layer 204 decomposes under the heat of the light and the carrier substrate 202 can be removed.

Figure 3M:
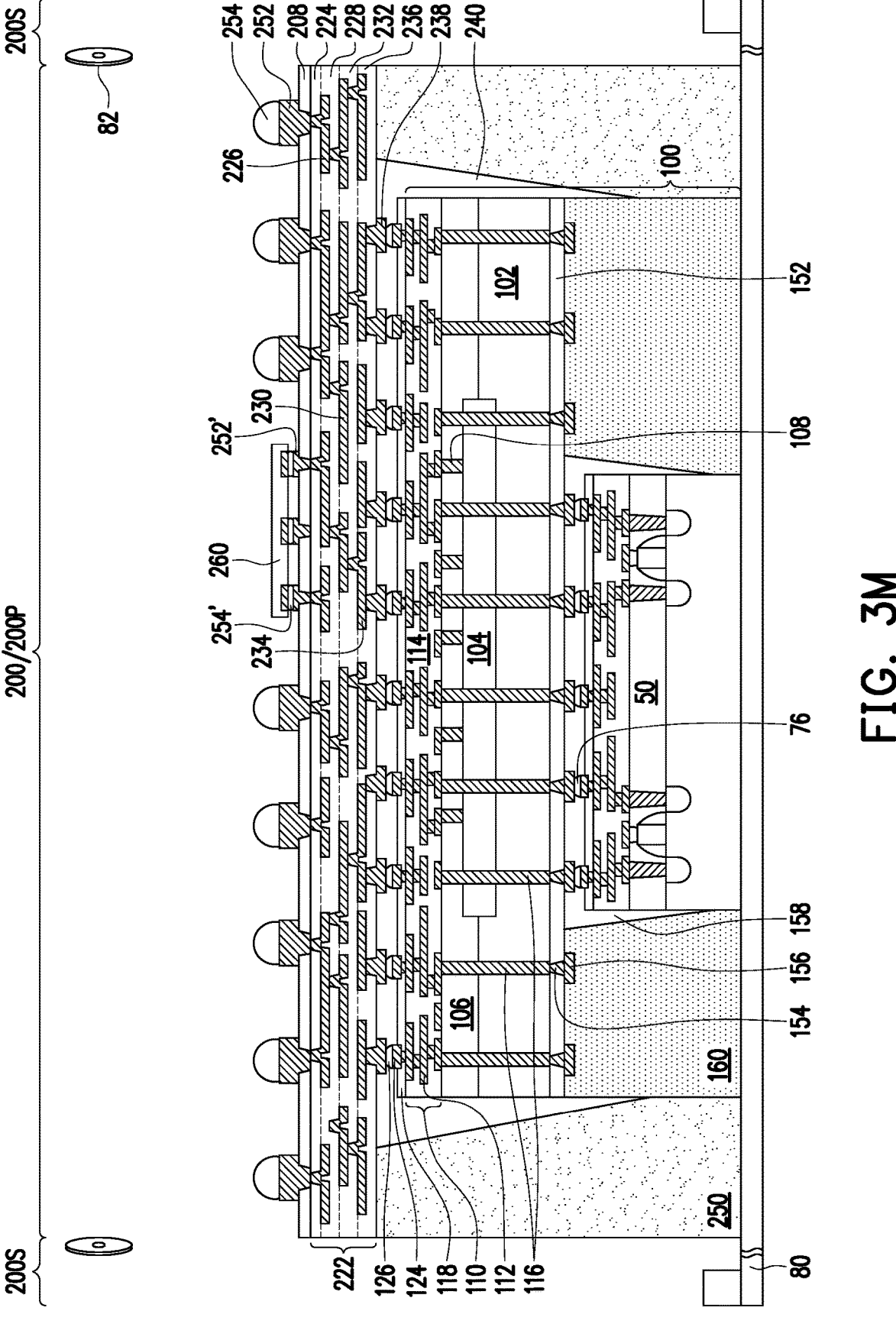

In FIG. 3M, the structure is then flipped over and placed on a handling apparatus 80, such as a frame, tape, or carrier, such as a blue tape for singulation. Openings are formed in the dielectric layer 208 to expose the metallization pattern 226. In some embodiments, via portions of the metallization pattern 226 may be exposed, while in other embodiments the metallization pattern 226 may not have the via portions and line portions of the metallization pattern 226 may be exposed. Conductive connectors 254 are formed in the openings of the dielectric layer 208. In some embodiments, under-bump metallurgies (UBMs) 252 may be formed prior to forming the conductive connectors 254. In other embodiments, the conductive connectors 254 may be formed on the exposed portions of the metallization pattern 226. In embodiments utilizing UBMs 252, the UBMs 252 have bump portions on and extending along the major surface of the dielectric layer 208, and have via portions extending through the dielectric layer 208 to physically and electrically couple the metallization pattern 226. The UBMs 252 may be formed of the same material as the metallization pattern 226. The conductive connectors 254 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 254 may include a conductive material such as solder, copper, aluminum, gold, nickel, silver, palladium, tin, the like, or a combination thereof. In some embodiments, the conductive connectors 254 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 254 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In some embodiments, conductive connectors 254' may be formed using processes and materials similar to the conductive connectors 254, but may be formed to be smaller than the conductive connectors 254. Corresponding UBMs 252' may likewise be formed prior to forming the conductive connectors 254', in some embodiments. In such embodiments, an integrated surface mount device (SMD) 260 may be attached to the conductive connectors 254', for example, by a pick and place process. The SMD 260 may be interspersed among the conductive connectors 254.

Next, a singulation process 82 is performed by separating package regions 200P from one another along scribe line regions 200S, e.g., between the package regions 200P. The singulation process 82 may be like unto the singulation process 82 described above with respect to FIG. 3H.

Figure 4:
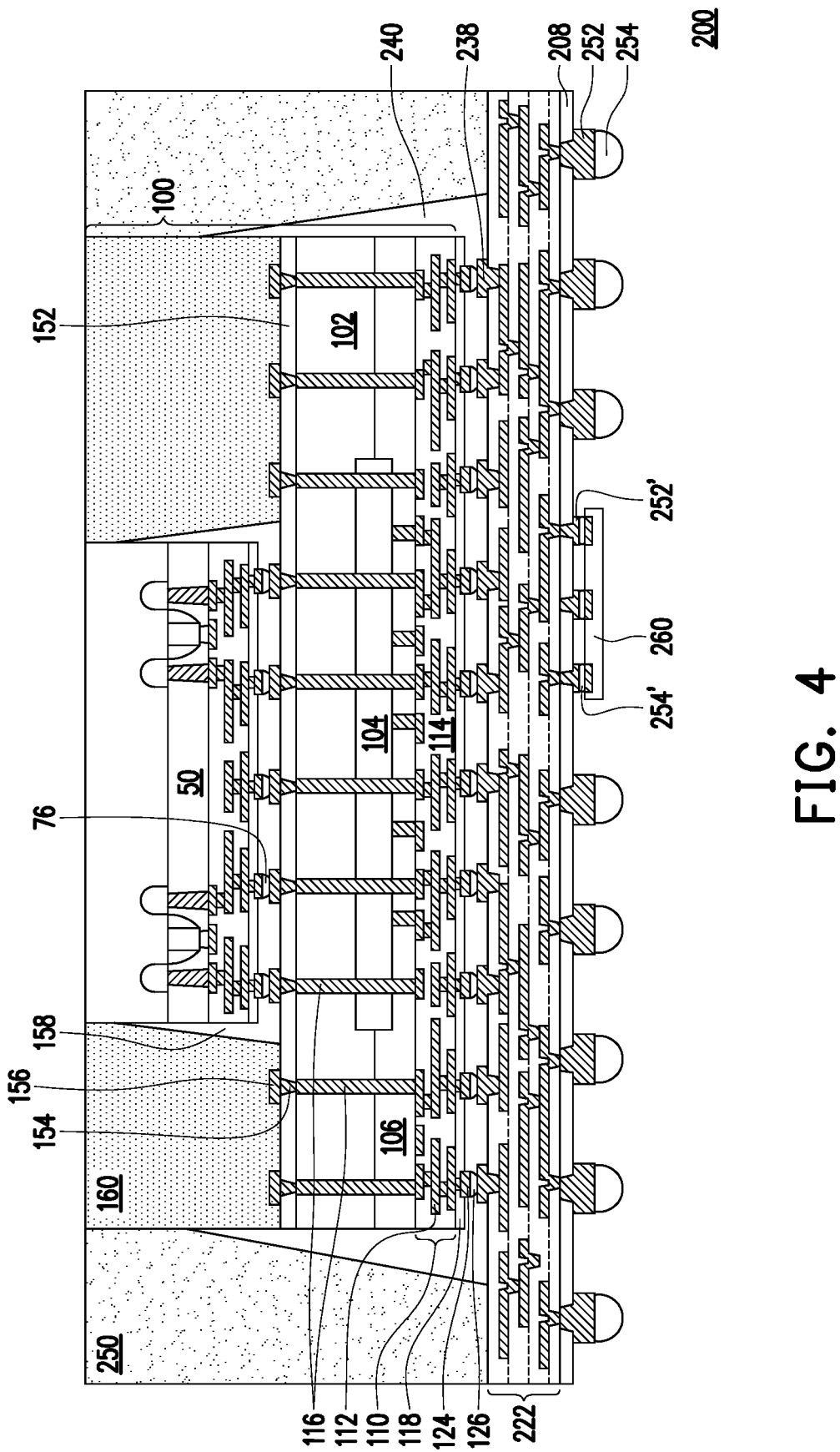
FIGS. 4, 5, and 6 illustrate integrated circuit packages resulting from processes illustrated in FIGS. 2, 3A, 3B, 3C, 3D, 3E, 3F, 3G, 3H, 3I, 3J, 3K, 3L, and 3M, in accordance with some embodiments.

A resulting second package device 200 is illustrated in FIG. 4. In accordance with some embodiments, the second package device 200 includes a first package device 100 mounted via electrical connectors 126 to a redistribution structure 222 to form an integrated device which may be an integrated fan out device in a chip-on-wafer-on-substrate structure. The first package device 100 includes an integrated circuit die 50 mounted by solder regions 76 to a back side of a device portion of a wafer. In some embodiments, excess contact pads 156 and or UBMs 238 may be covered by the first encapsulant 160 or the second encapsulant 250, respectively. In some embodiments, a portion of the underfill 240 may be interposed between the first encapsulant 160 and the second encapsulant 250. Utilizing solder mounting for a chip-on-wafer-on-substrate structure provides reduced processing time and reduced production costs over a direct bonding technique.

Figure 5:
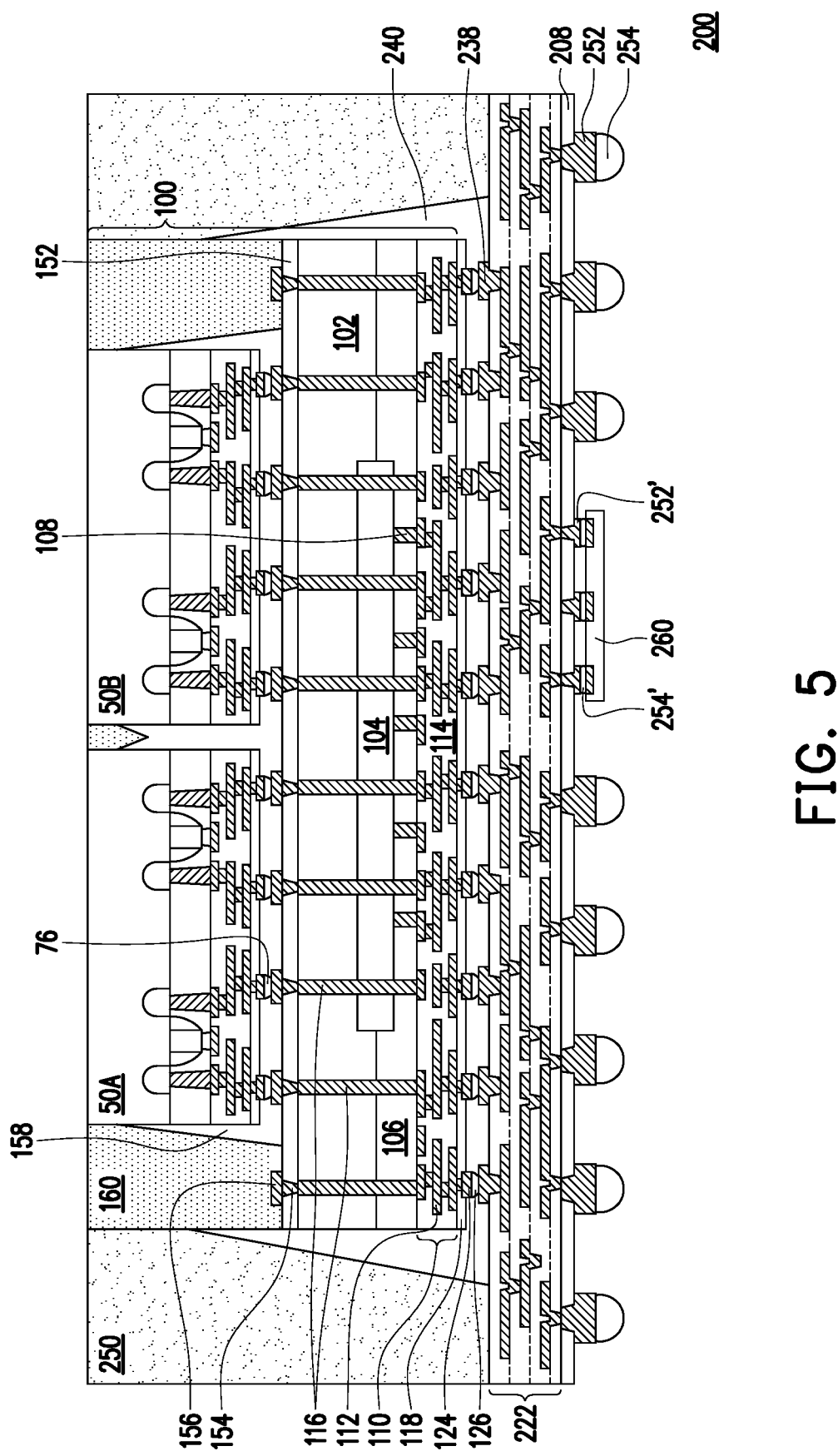
Figure 6:
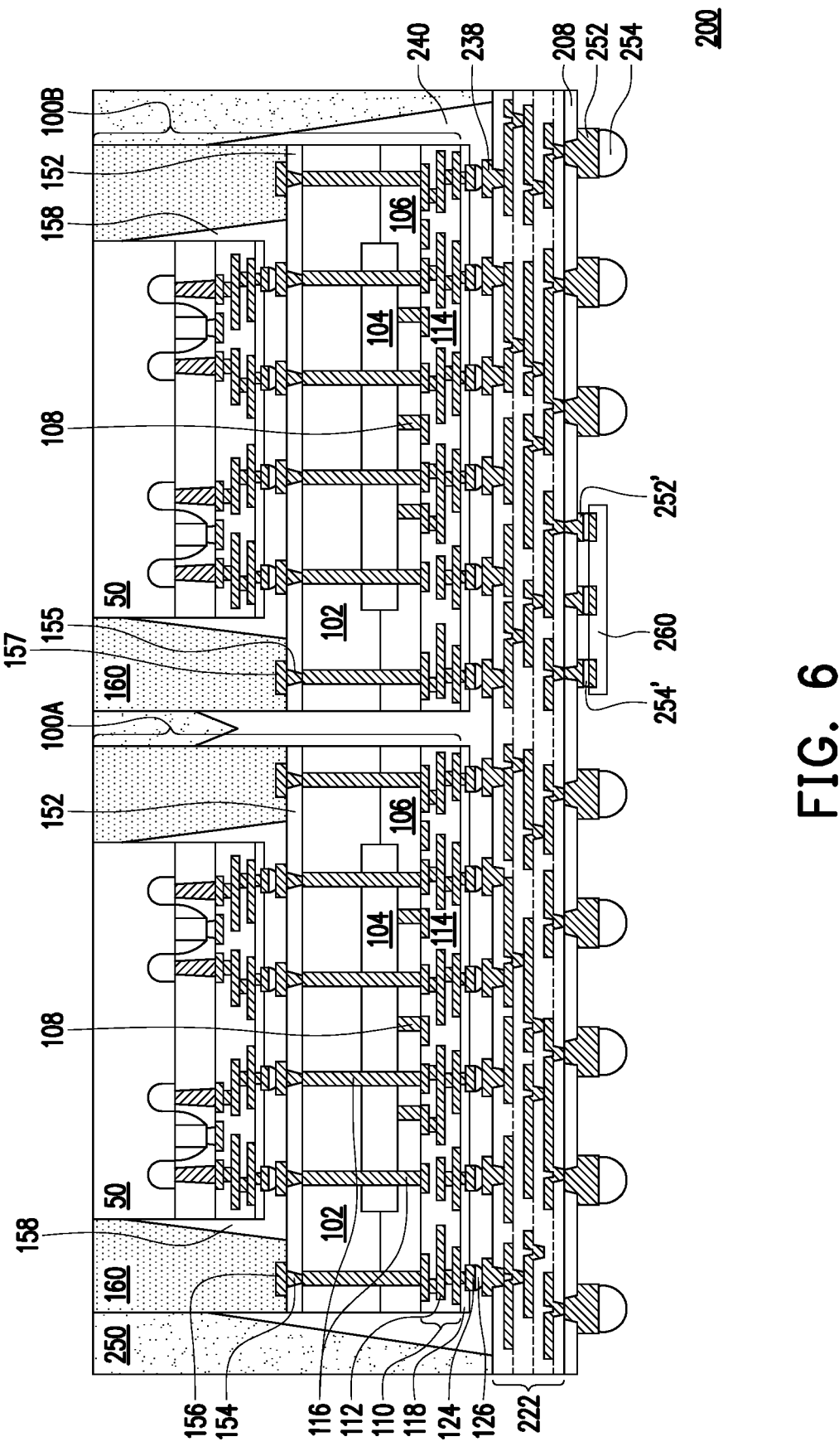

FIGS. 5 and 6 provide variations on the second package device 200 of FIG. 4. In FIG. 5, the first package device 100 includes two or more integrated circuit dies 50A and 50B. As noted in FIG. 5, the underfill 158 may extend between the two or more integrated circuit dies 50A and 50B and may form a v-shaped depression in the underfill 158. In FIG. 6, the second package device 200 includes a first package device 100A and a first package device 100B. As noted in FIG. 6, the underfill 240 may be interposed between the first encapsulant 160 of the first package device 100A and the first encapsulant 160 of the first package device 100B. The underfill 240 may also form a v-shaped depression in the underfill 240 between the first package devices 100A and 100B. The embodiments of FIGS. 5 and 6 may be combined such that one or both of the first package devices 100A or 100B includes two or more of the integrated circuit dies 50A and 50B.

FIGS. 2, 7A, 7B, 7C, 7D, 7E, 7F, 7G, 7H, 7I, 7J, 7K, 7L, 7M, and 8 are cross-sectional views of intermediate stages in the manufacturing of first package devices 100, in accordance with some embodiments. The elements depicted in these Figures utilize like references for like elements as those discussed above for FIGS. 2, 3A, 3B, 3C, 3D, 3E, 3F, 3G, 3H, 3I, 3J, 3K, 3L, 3M, and 4. In FIGS. 7A, 7B, 7C, 7D, 7E, 7F, 7G, 7H, 7I, 7J, 7K, 7L, 7M, and 8, a second package device 200 is formed which is similar to the second package device 200 described above, except that the first package devices 100 utilized in the second package device 200 have the integrated circuit die 50 attached to a front side of the wafer 100W, as described in greater detail below.

In FIGS. 7A through 7H, first package devices 100 are formed by packaging one or more integrated circuit dies 50 in respective package regions 100P. The package regions 100P are separated by scribe line regions 100S. The package regions 100P will be singulated along the scribe line regions 100S in subsequent processing to form the first package devices 100. Processing of one package region 100P is illustrated, but it should be appreciated that any number of package regions 100P can be simultaneously processed to form any number of first package devices 100. The processes described below may be utilized to form first package devices 100 using low-cost bonding techniques in face-to-back chip-on-wafer structures to form reliable, yet low cost devices. The first package devices 100 may be system-on-integrated-chips (SoIC) devices, although other types of packages may be formed.

Then, in FIGS. 7I through 7M, the first package devices 100 are utilized in an integrated circuit package 200. The first package devices 100 are attached to a redistribution structure and used in a chip-on-wafer-on-substrate or chip-on-wafer-on-wafer structure. FIG. 8 illustrates the final completed structure.

Figures 7A, 7B:
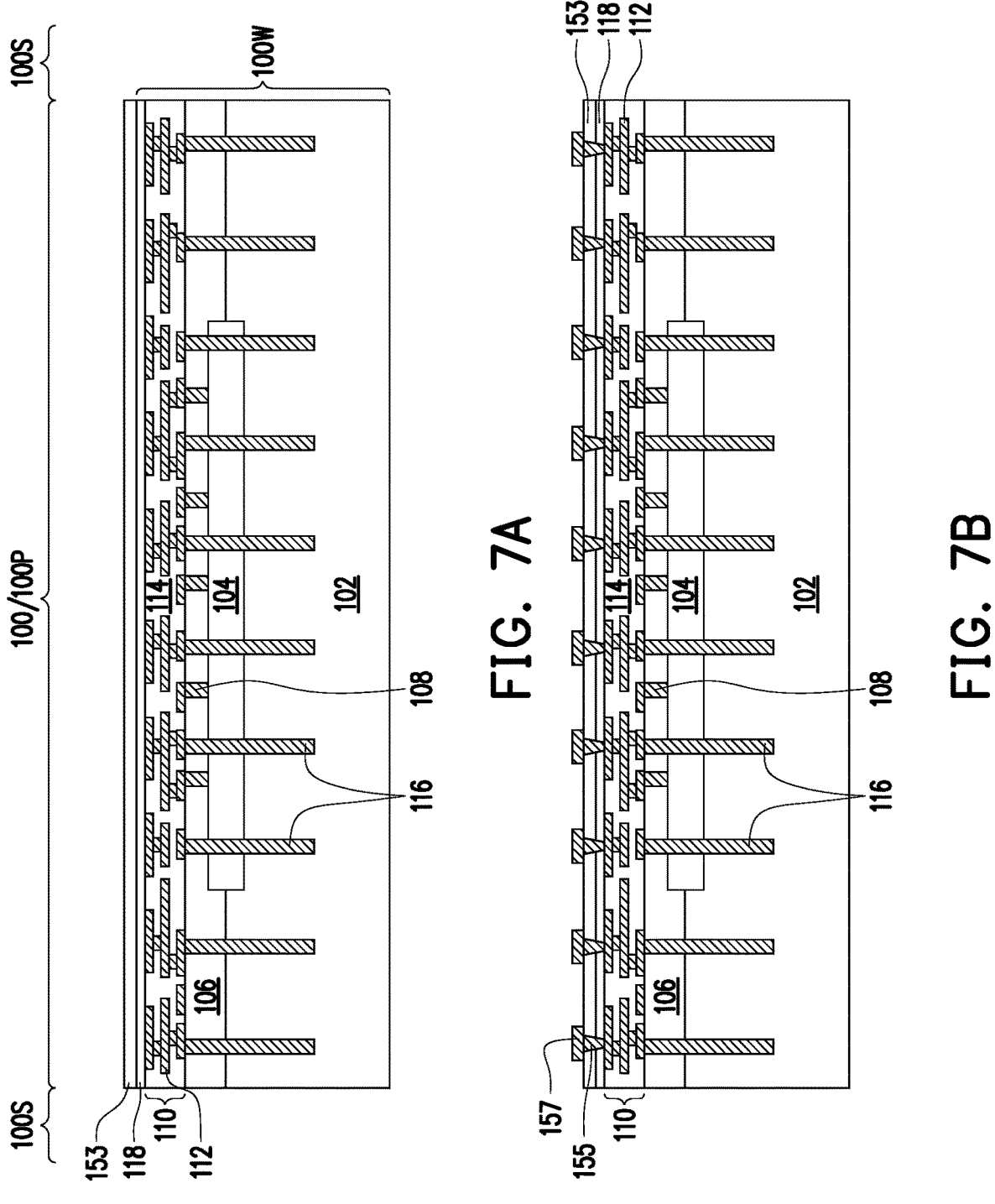
FIGS. 7A, 7B, 7C, 7D, 7E, 7F, 7G, 7H, 7I, 7J, 7K, 7L, and 7M are cross-sectional views of intermediate stages in the manufacturing of integrated circuit packages, in accordance with some embodiments.

Referring to FIG. 7A, the structure depicted in FIG. 7A follows from the structure depicted in FIG. 2 after an optional dielectric layer 153 is deposited over the passivation layer 118. The optional dielectric layer 153 may be deposited using materials and processes similar to that described above with respect to the dielectric layer 152, described above.

In FIG. 7B, vias 155 and contact pads 157 are formed at a front side of the wafer 100W. In accordance with some embodiments, openings are formed through the dielectric layer 153 and vias 155 and contact pads 157 are formed over the redistribution structure 11 to electrically couple the TSVs 116 to the contact pads 157. The patterning to form the openings may be done by an acceptable process, such as by exposing the dielectric layer 153 to light when the dielectric layer 153 is a photo-sensitive material or by etching using, for example, an anisotropic etch. If the dielectric layer 153 is a photo-sensitive material, the dielectric layer 153 can be developed after the exposure.

The vias 155 and contact pads 157 may be formed by a plating process, including, for example, forming a seed layer over the dielectric layer 153 and in the openings. Then, a photoresist layer can be formed over the dielectric layer 153 and opening formed therein corresponding to the contact pads 1557. Then, the vias 155 and contact pads 157 may be plated using a electrochemical plating or electroplating process. The photoresist layer can be removed and the now exposed seed layer removed by an etching process.

Figure 7C:
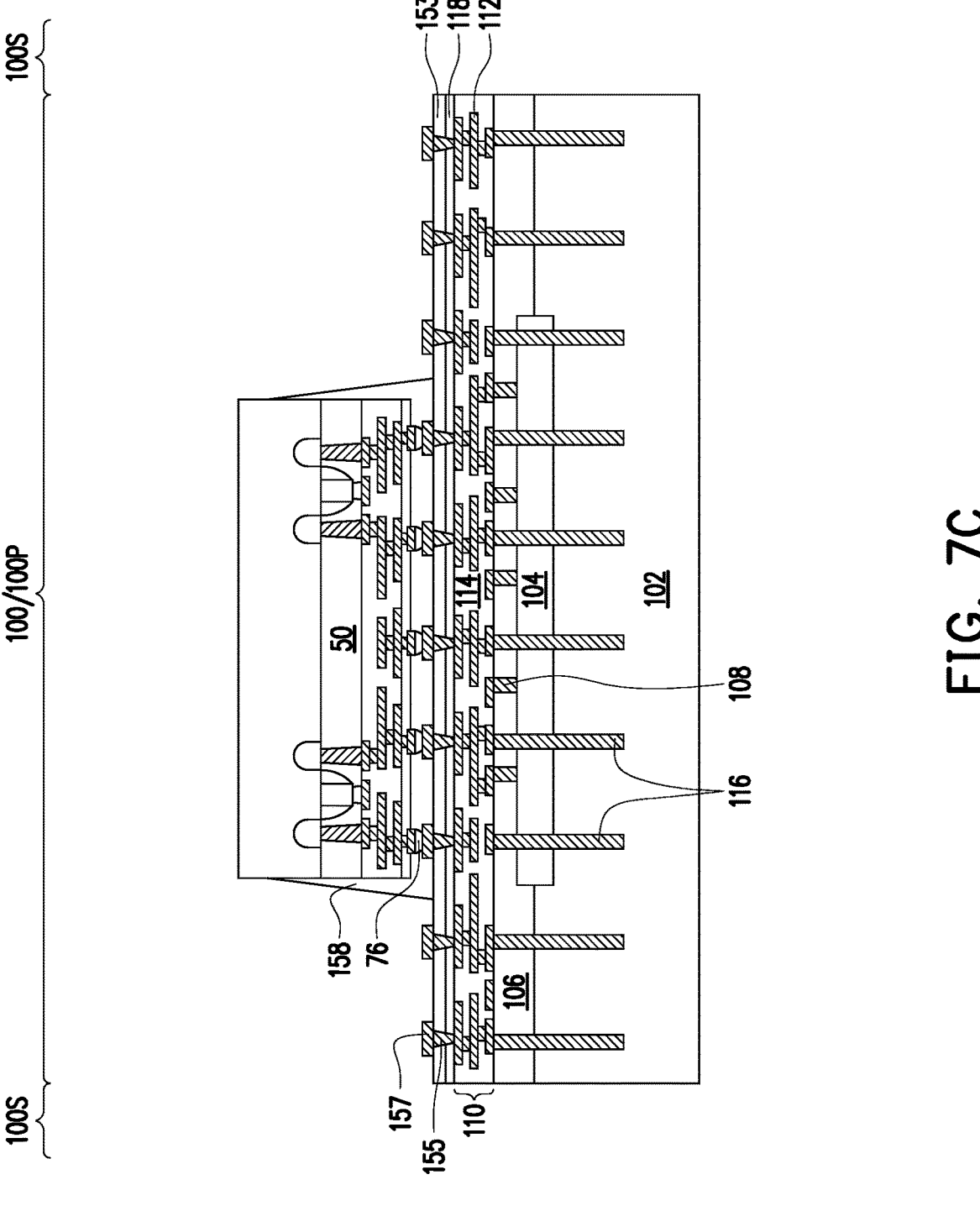

In FIG. 7C, an integrated circuit die 50 is mounted face-to-face on the wafer 100W in each of the package areas 100P. The integrated circuit die 50 is mounted to the contact pads of the wafer 100W using the solder regions 76 of the integrated circuit die 50. In some embodiments, the integrated circuit die 50 may be mounted using a pick and place process, and reflowing the solder regions 76 to couple the contact pads 157 to the die connectors 74. In some embodiments, some of the contact pads 157 may remain exposed and unbonded after mounting the integrated circuit die 50. In some embodiments, an underfill 158 is formed between the integrated circuit die 50 and the wafer 100W, surrounding the solder regions 76 and the joints between the solder regions 76 and the contact pads 157. The underfill 158 may be formed by a capillary flow process after the integrated circuit die 50 is attached, or may be formed by a suitable deposition method before the integrated circuit die 50 is attached. In some embodiments, the underfill 158 may extend up sidewalls of the integrated circuit die 50. A vertical extent of the underfill 158 may extend to a portion of the semiconductor substrate 52 (see FIG. 1B) of the integrated circuit die 50 in some embodiments, such as illustrated in FIG. 7C. In other embodiments, the entire sidewall of the integrated circuit die 50 may be covered by the underfill 158. In yet other embodiments, the underfill 158 may be positioned entirely below the integrated circuit die 50 or may extend along the sidewall of the integrated circuit die 50 to a lesser vertical extent.

Figure 7D:
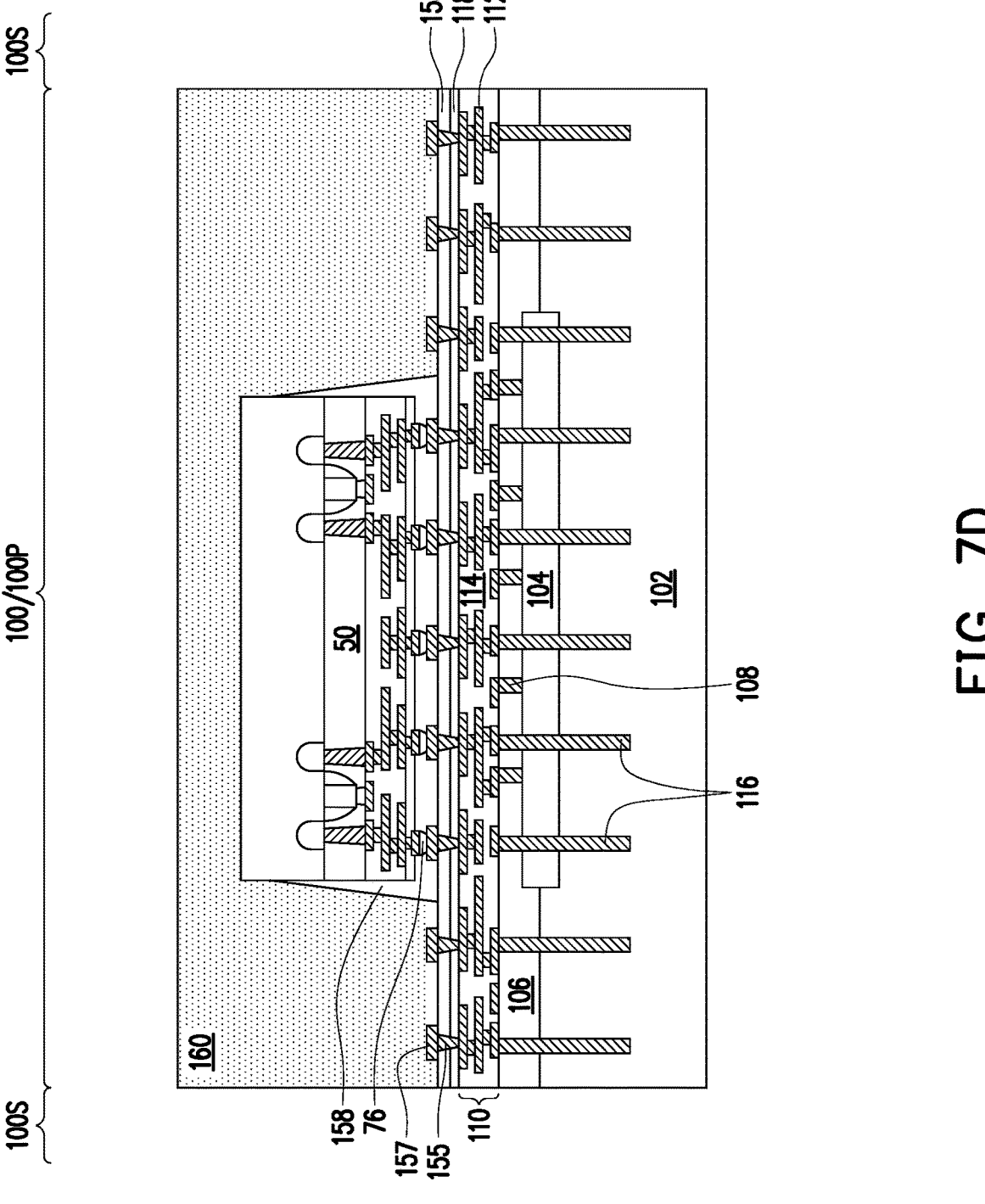

In FIG. 7D, a first encapsulant 160 is formed on and around the various components. After formation, the encapsulant 160 laterally encapsulates the integrated circuit die 50 and is disposed over any of the contact pads 157 which are not coupled. The encapsulant 160 may be a molding compound, epoxy, or the like. The encapsulant 160 may be applied by compression molding, transfer molding, or the like, and may be formed over the dielectric layer 153, contacting an upper surface thereof. The encapsulant 160 may be applied in liquid or semi-liquid form and then subsequently cured. The encapsulant 160 laterally surrounds the underfill 158, including a portion of the underfill 158 which extends along a sidewall of the integrated circuit die 50.

Figure 7E:
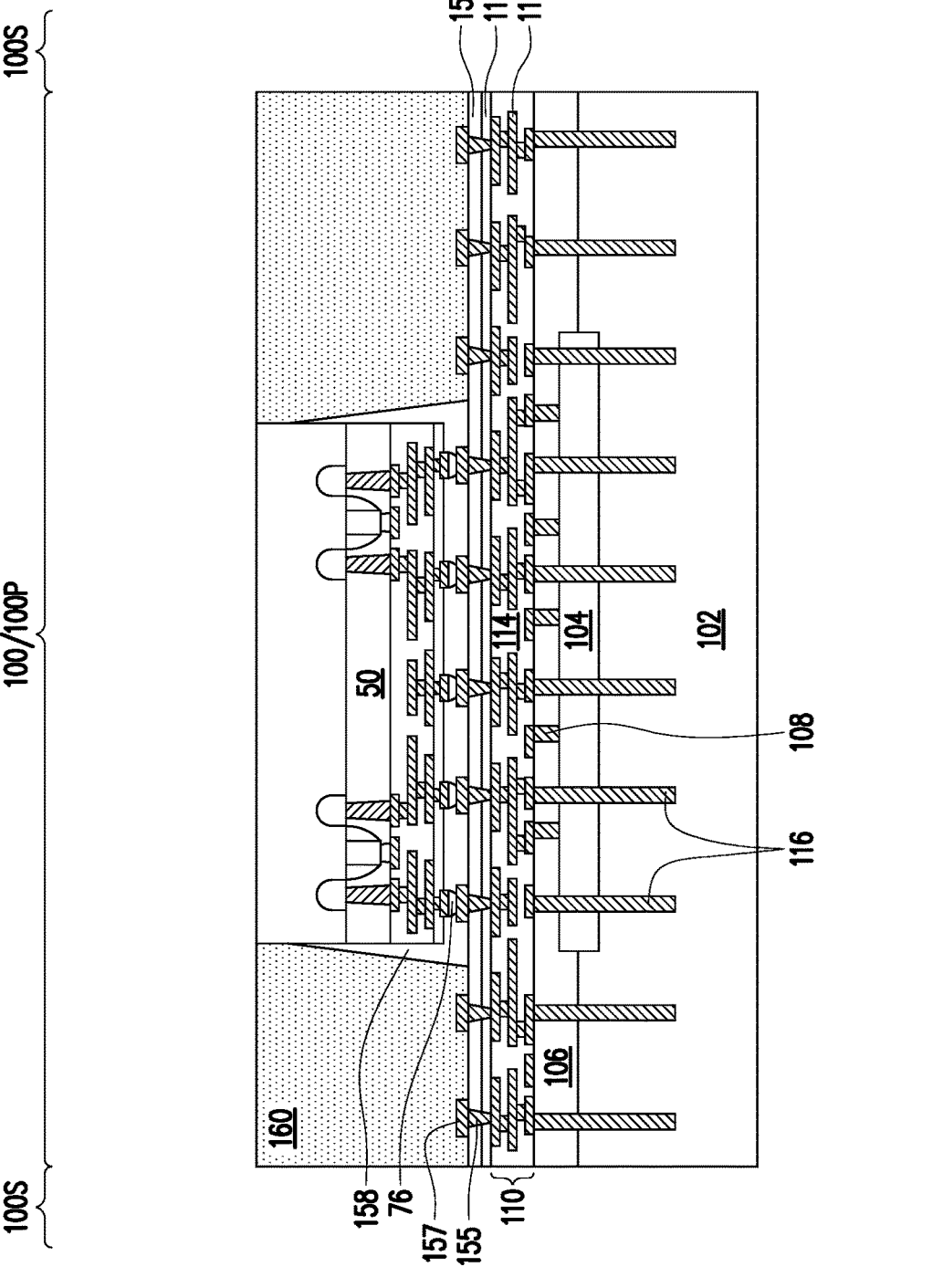

In FIG. 7E, a planarization process is then performed on the encapsulant 160 to level an upper surface of the encapsulant 160 with an upper surface of the integrated circuit die 50 (e.g., the substrate 52). Such upper surfaces are substantially coplanar after the planarization process within process variations. The planarization process may be, for example, a chemical-mechanical polish (CMP), a grinding process, or the like.

Figure 7F:
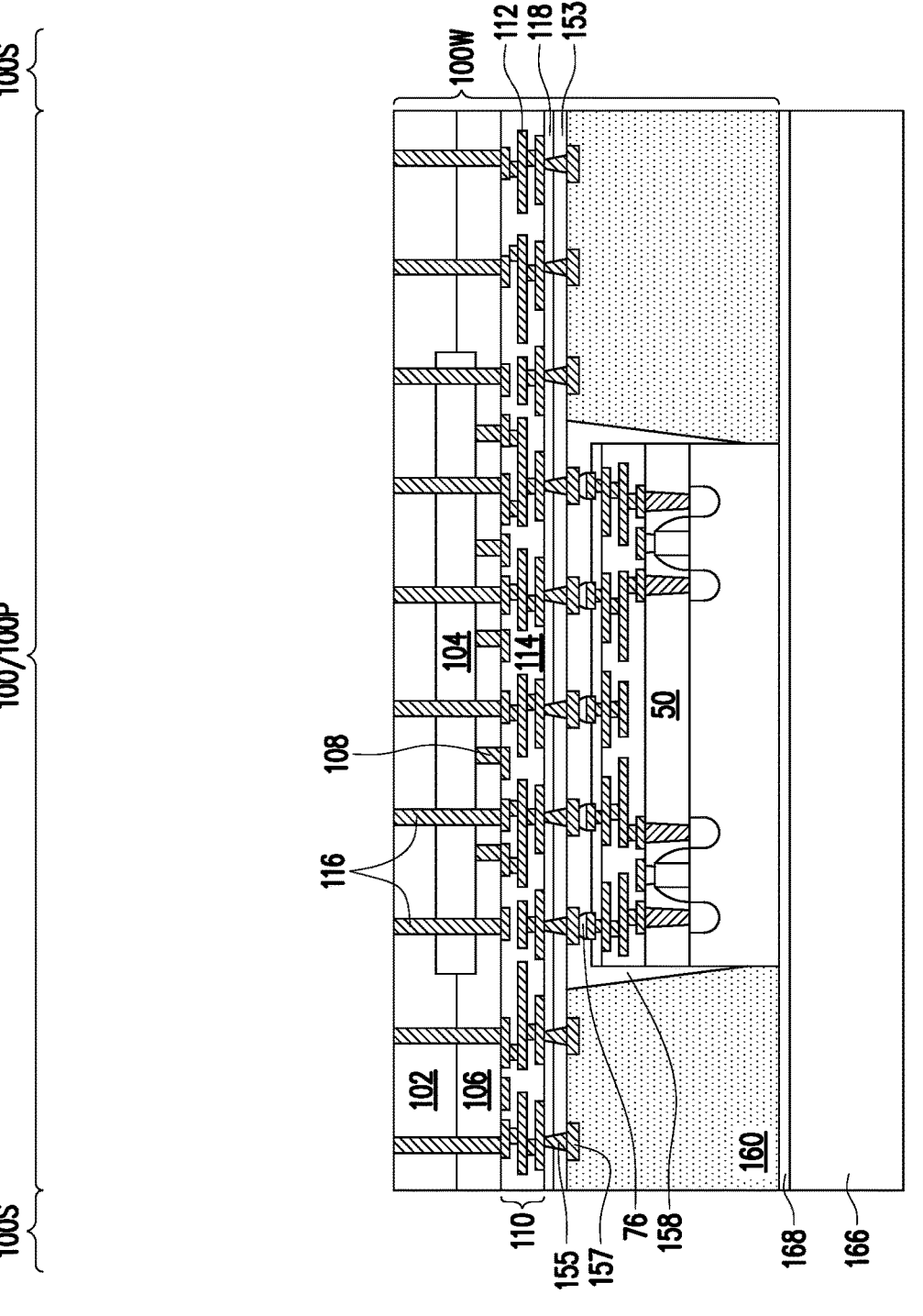

In FIG. 7F, the wafer 100W is flipped over and placed on a support carrier 166. The support carrier substrate 166 is provided, and a release layer 168 is formed on the carrier substrate 166. The carrier substrate 166 may be a glass carrier substrate, a ceramic carrier substrate, or the like. The carrier substrate 166 may be a wafer, such that multiple packages can be formed on the carrier substrate 166 simultaneously.

The release layer 168 may be formed of a polymer-based material, which may be removed along with the carrier substrate 166 from the overlying structures that will be formed in subsequent steps. In some embodiments, the release layer 168 is an epoxy-based thermal-release material, which loses its adhesive property when heated, such as a light-to-heat-conversion (LTHC) release coating. In other embodiments, the release layer 168 may be an ultra-violet (UV) glue, which loses its adhesive property when exposed to UV lights. The release layer 168 may be dispensed as a liquid and cured, may be a laminate film laminated onto the carrier substrate 166, or may be the like. The top surface of the release layer 168 may be leveled and may have a high degree of planarity.

Also illustrated in FIG. 7F, the back side of the wafer 100W may be thinned to expose the TSVs 116. The thinning may be accomplished through a backside grinding process performed on the substrate 102 to thin the wafer 100W. Due to the backside grinding. TSVs 116 of the wafer 100W device die are revealed.

Figure 7G:
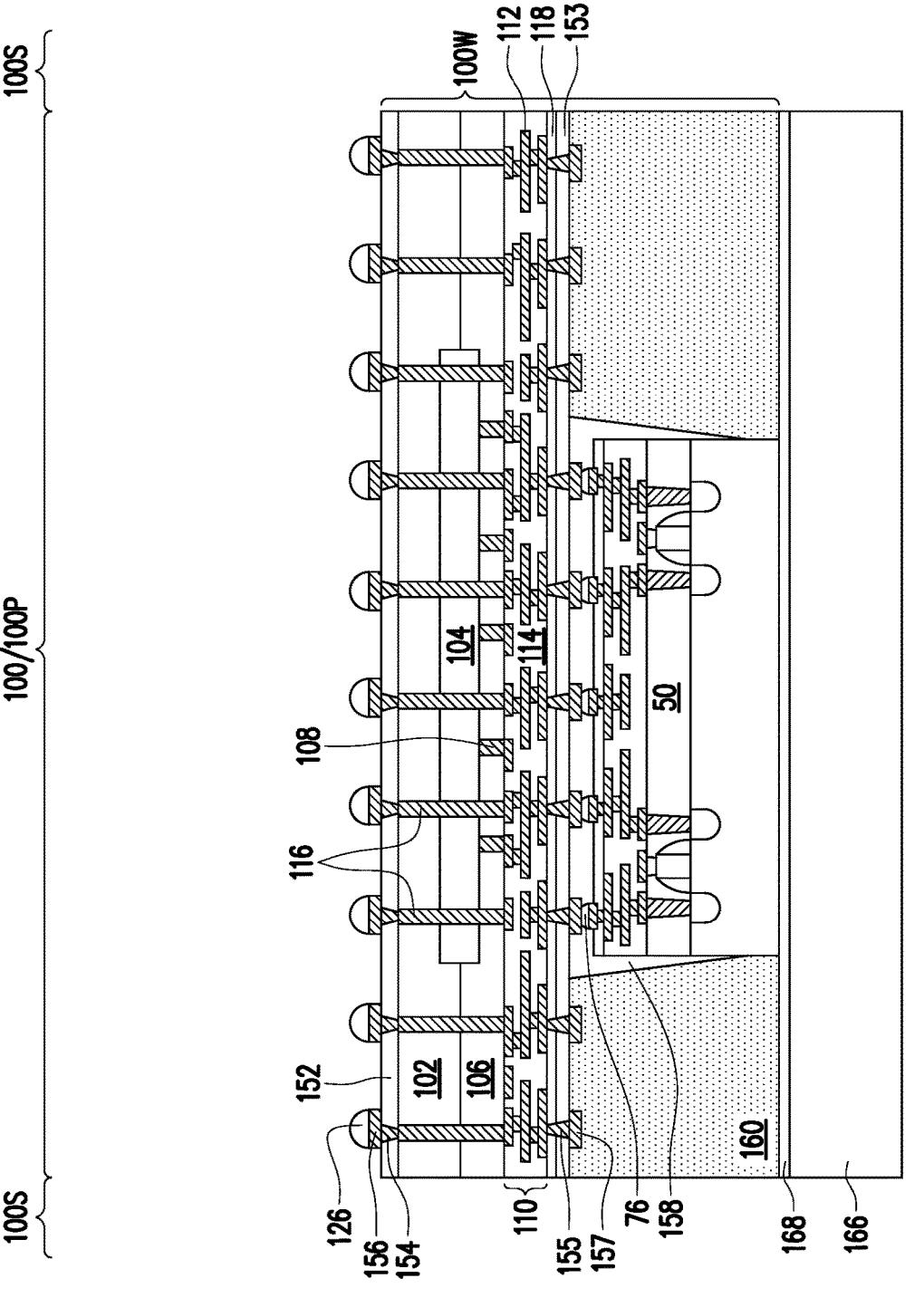

In FIG. 7G, a dielectric layer 152 may be deposited over the backside of the wafer 100W. The dielectric layer 152 may be formed from any suitable material such as a polyimide, polybenzoxazole (PBO), benzocyclobutene (BCB), or the like, using any suitable process, such as by spin coating or the like. Adding the dielectric layer 152 provides additional thickness to the wafer 100W after thinning the wafer 100W to expose the TSVs 116. Openings are formed through the dielectric layer 152 and vias 154 and contact pads 156 are formed over the TSVs 116 to electrically couple the TSVs 116 to the contact pads 156. The patterning to form the openings may be done by an acceptable process, such as by exposing the dielectric layer 152 to light when the dielectric layer 152 is a photo-sensitive material or by etching using, for example, an anisotropic etch. If the dielectric layer 152 is a photo-sensitive material, the dielectric layer 152 can be developed after the exposure.

The vias 154 and contact pads 156 may be formed by a plating process, including, for example, forming a seed layer over the dielectric layer 152 and in the openings. Then, a photoresist layer can be formed over the dielectric layer 152 and opening formed therein corresponding to the contact pads 156. Then, the vias 154 and contact pads 156 may be plated using an electrochemical plating or electroplating process. The photoresist layer can be removed and the now exposed seed layer removed by an etching process.

FIG. 7G further illustrates the formation of electrical connectors 126, which may be formed through plating, printing, stenciling, ball dropping, and so forth, or the like, utilizing eutectic materials such as solder. Electrical connectors 126 may also include nickel, Electroless Nickel Immersion Gold (ENIG), Electroless Nickel Electroless Palladium Immersion Gold (ENEPIG), and/or the like. In accordance with some embodiments, the formation of electrical connectors 126 may include forming Under-Bump Metallurgies (UBMs) (e.g., as contact pads 156), placing solder balls on the UBMs, and then reflowing the solder balls. The resulting electrical connectors 126 thus may include solder regions. In accordance with other embodiments, the formation of electrical connectors 126 includes performing a plating process to form solder layers over the UBMs, and then reflowing the solder layers.

Figure 7H:
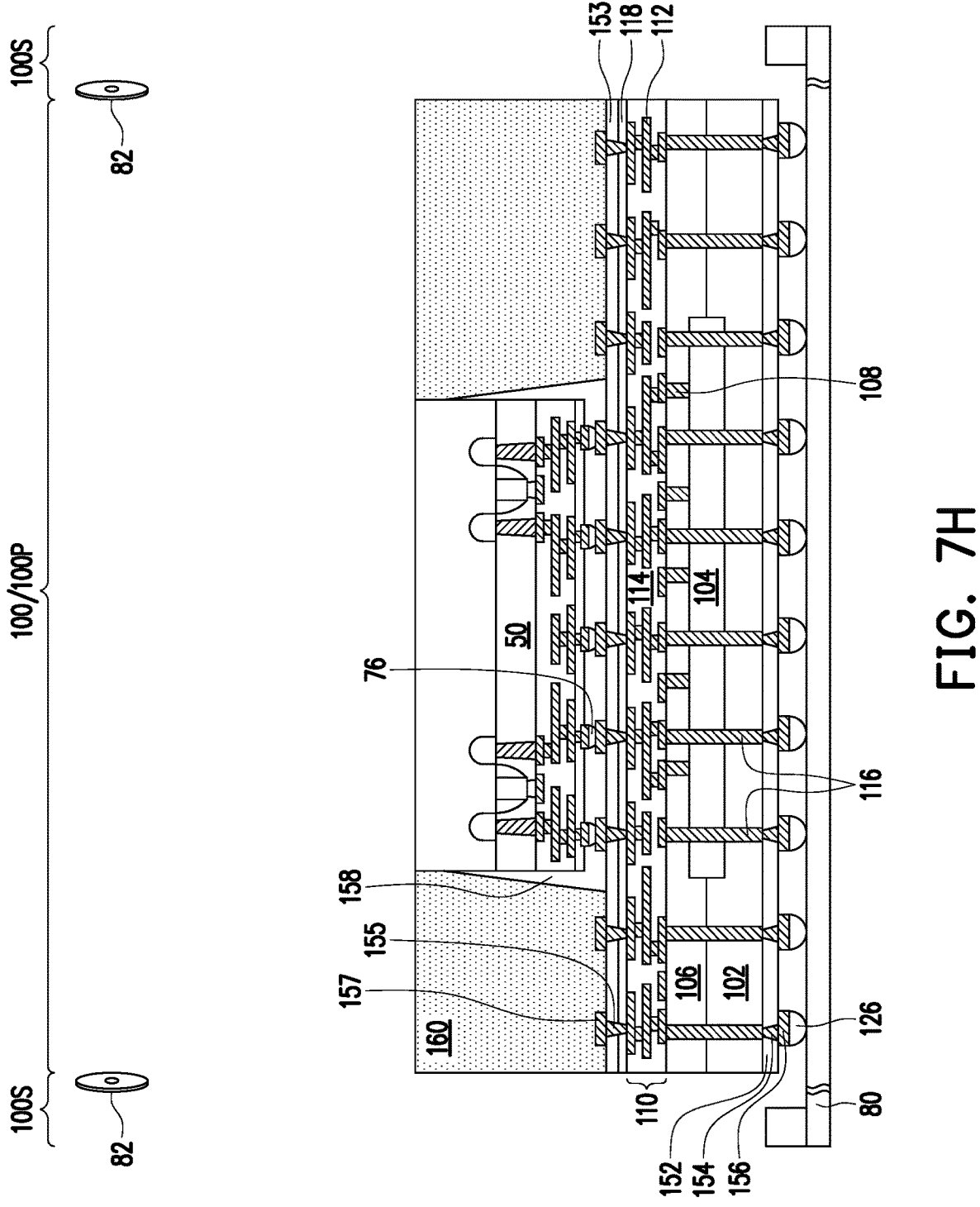

In FIG. 7H, after formation of the electrical connectors 126, the structure in FIG. 7G is flipped over in FIG. 7H and placed on a handling apparatus 80, such as such as a frame, tape, or carrier. A carrier substrate de-bonding is performed to detach (or "de-bond") the carrier substrate 166 (see FIG. 7G) from the wafer 100W. In accordance with some embodiments, the de-bonding includes projecting a light such as a laser light or an UV light on the release layer 168 so that the release layer 168 decomposes under the heat of the light and the carrier substrate 166 can be removed. Next, a singulation process may be performed to singulate the package regions 100P into the first package device 100. In the illustrated embodiment, the wafer may be cut from the front side of the wafer through to the back side of the wafer, however, in other embodiments, the singulation may occur while the wafer 100W is attached to the carrier substrate 166. After singulation, the completed first package device 100 may be cleaned to remove any adhesive residue, such as adhesive residue used to attach the electrical connectors 126 to the handling apparatus 80.

In FIGS. 7I through 7M, a second package device 200 is formed which includes the first package device 100. The process to form the second package device 200 of FIG. 8 (which results from the singulation of the structure illustrated in FIG. 7M) utilizes like processes and materials as those used to form the second package device 200 of FIG. 4, except that the first package device 100 used in FIGS. 7I through 7M is the first package device 100 singulated from the structure of FIG. 7H. The processes will be briefly discussed, however, details are omitted for the sake of brevity and one may obtain more detail from the discussion of the processes describe above with respect to FIGS. 3I to 3M.

Figure 7I:
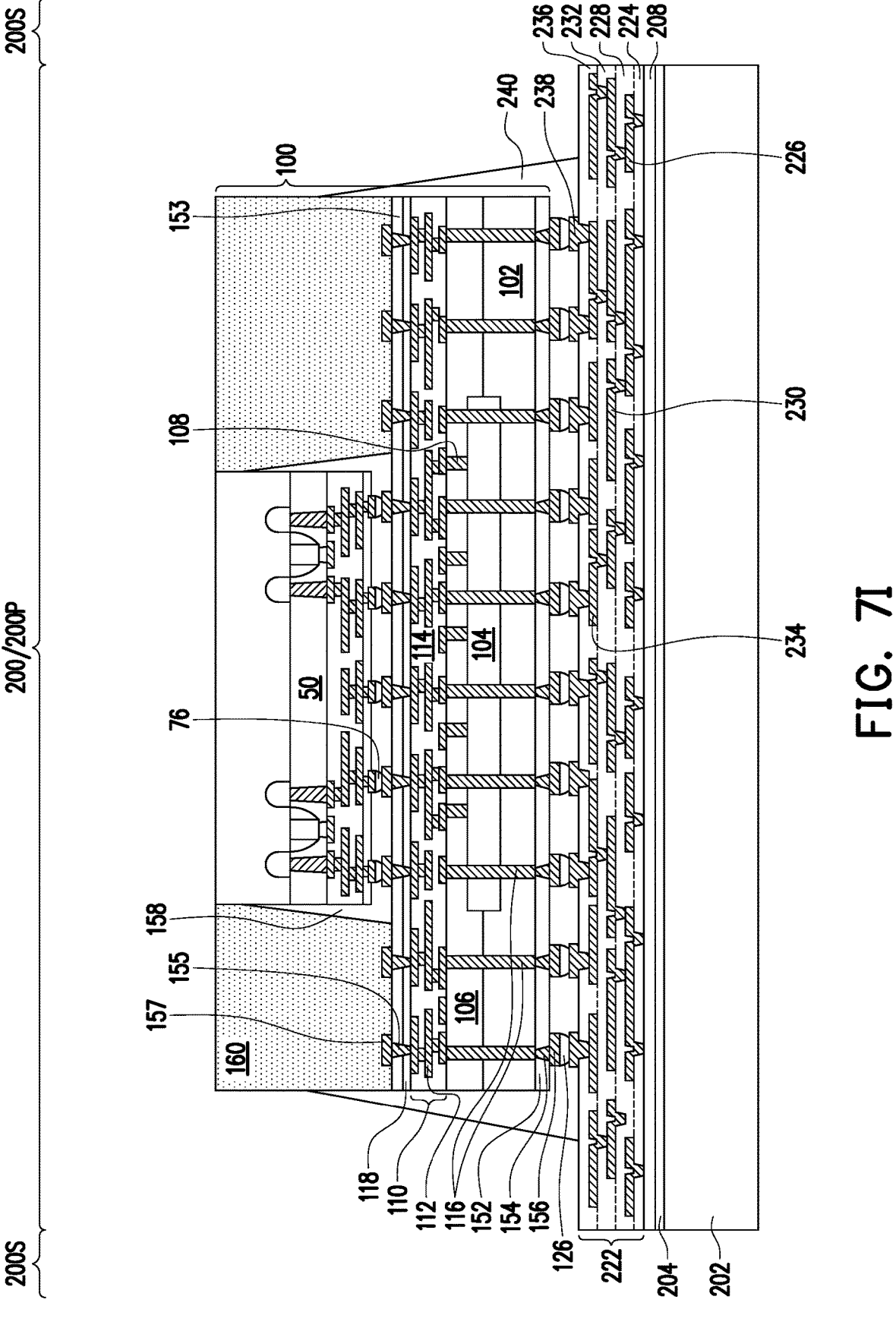
Figure 8:
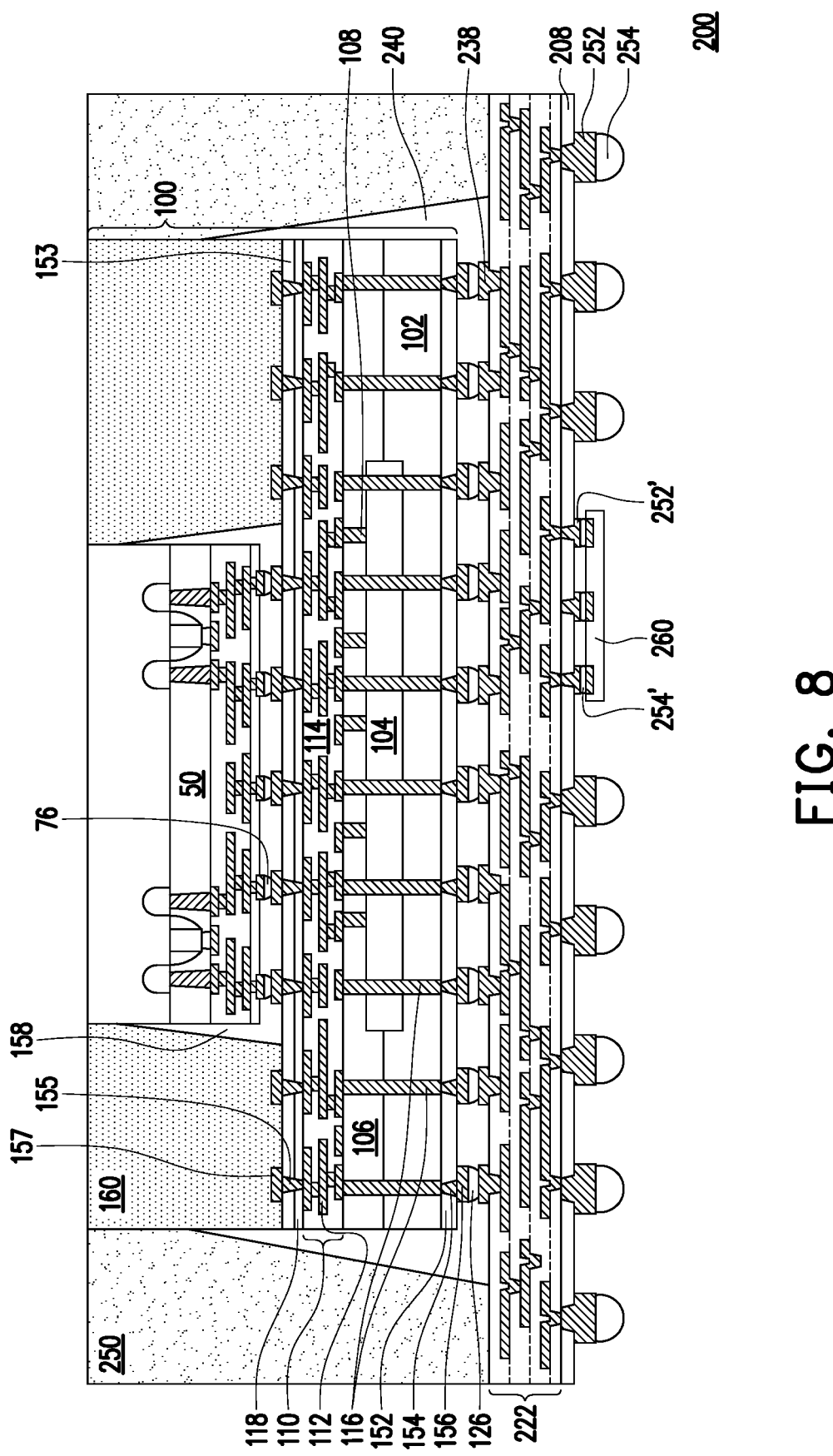
FIGS. 8, 9, and 10 illustrate integrated circuit packages resulting from processes illustrated in FIGS. 7A, 7B, 7C, 7D, 7E, 7F, 7G, 7H, 7I, 7J, 7K, 7L, and 7M, and 3M, in accordance with some embodiments.

In FIG. 7I, a workpiece includes a carrier substrate 202, which is prepared and a release layer 204 formed thereover. A redistribution structure 222 may be formed on the release layer 204. UBMs 238 are formed for connecting first package devices (e.g., first package device 100) to the redistribution structure 222. Then first package devices 100 are connected to the UBMs 238 using the electrical connectors 126. In some embodiments, an underfill 240 is formed between the first package devices 100 and the redistribution structure 222, surrounding the electrical connectors 126 and the joints between the electrical connectors 126 and the UBMs 238.

Figure 7J:
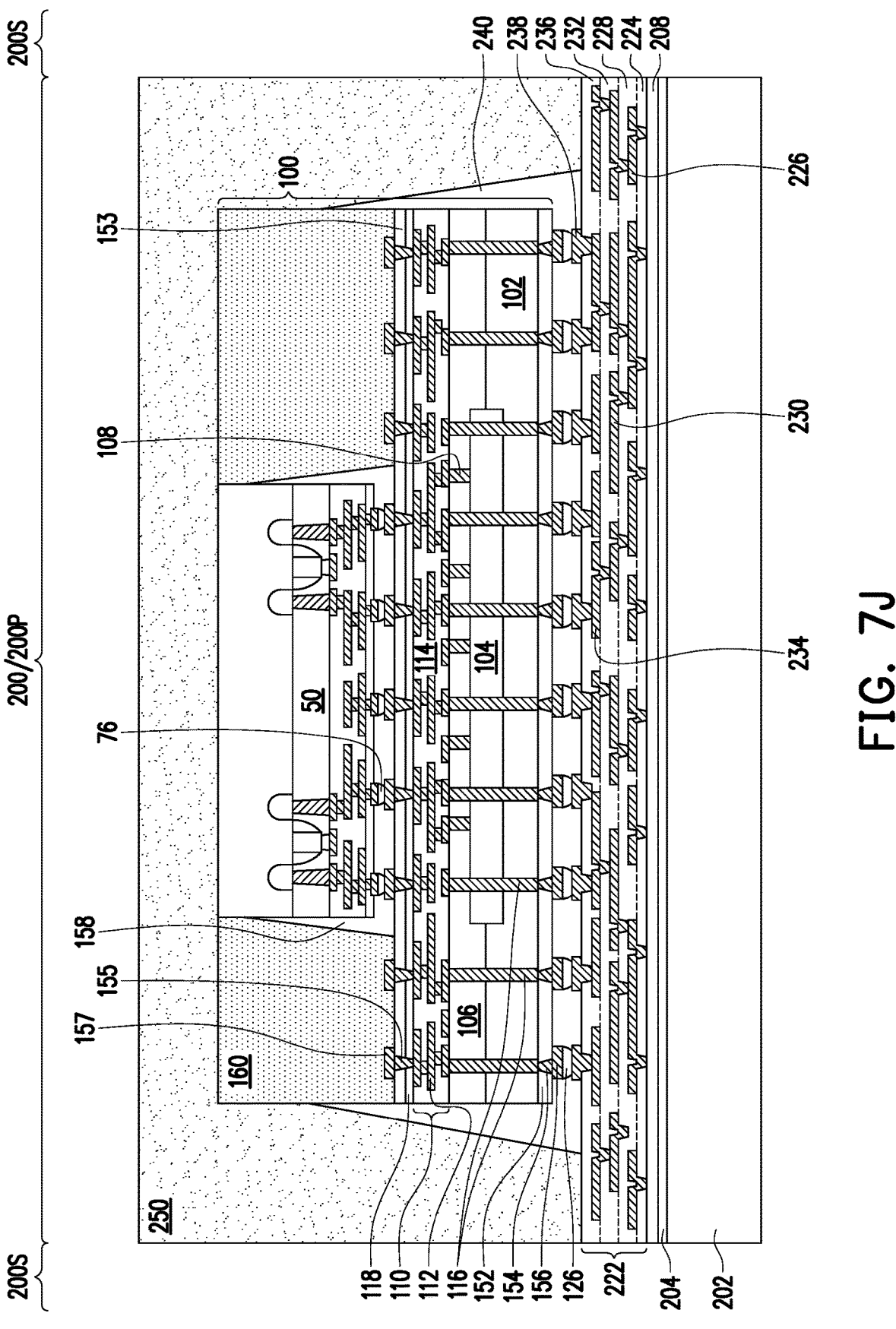

In FIG. 7J, a second encapsulant 250 is formed on and around the various components. After formation, the second encapsulant 250 laterally encapsulates the first package devices 100 and is disposed over any UBMs 238 which are not coupled. The second encapsulant 250 laterally surrounds the underfill 240, including a portion of the underfill 240 which extends along a sidewall of the first package devices 100. In some embodiments, a portion of the underfill 240 may be sandwiched between the first encapsulant 160 and the second encapsulant 250. A portion of the second encapsulant 250 may also be in contact with sidewalls of the first encapsulant 160, as well as disposed over an upper surface of the integrated circuit die 50 and first encapsulant 160.

Figure 7K:
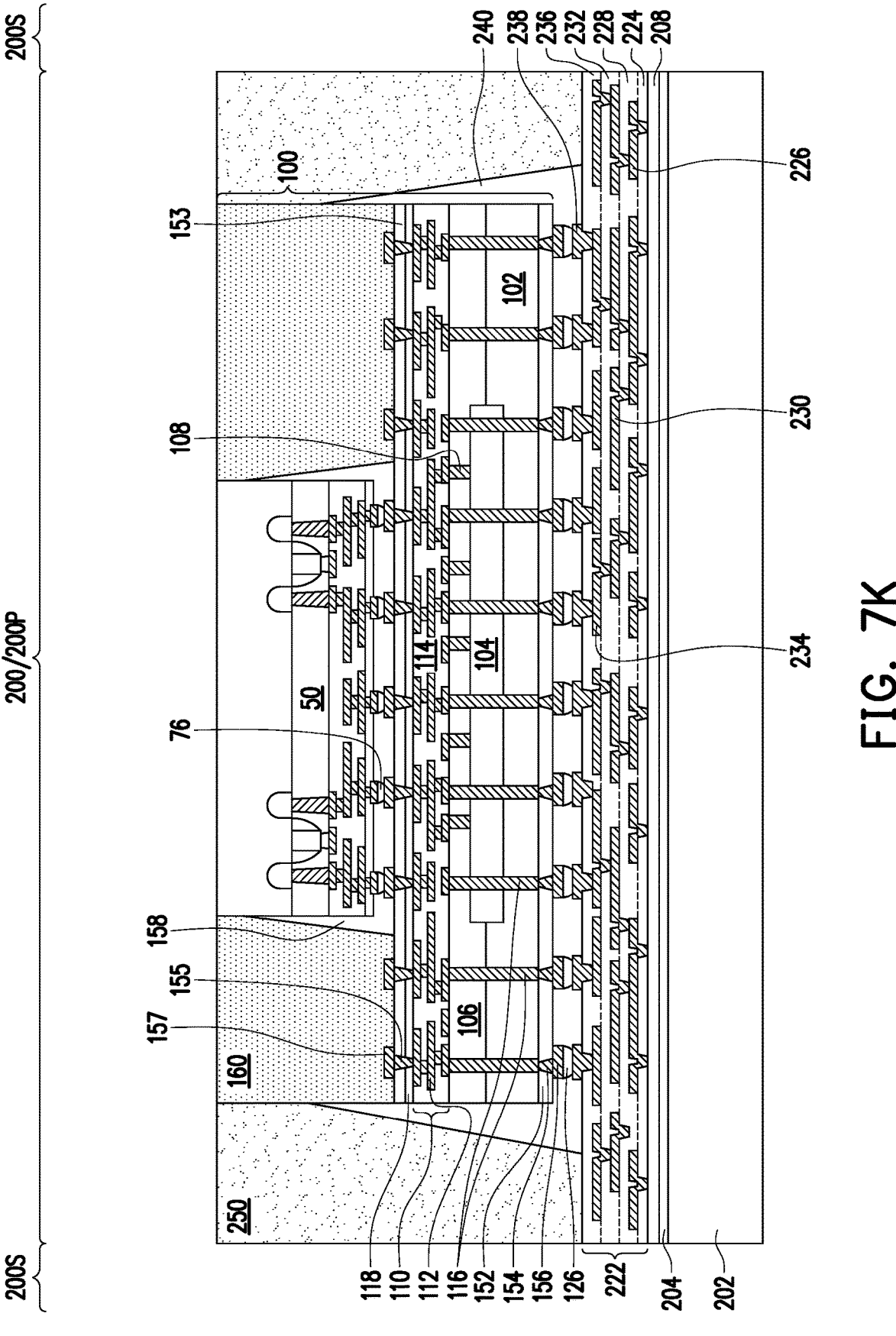

In FIG. 7K, a planarization process is then performed on the second encapsulant 250 to level an upper surface of the second encapsulant 250 with an upper surface of the first package devices 100 (e.g., the upper surface of the first encapsulant 160 and upper surface of the integrated circuit die 50). Such upper surfaces are substantially coplanar after the planarization process within process variations. The planarization process may be, for example, a chemical-mechanical polish (CMP), a grinding process, or the like.

Figure 7L:
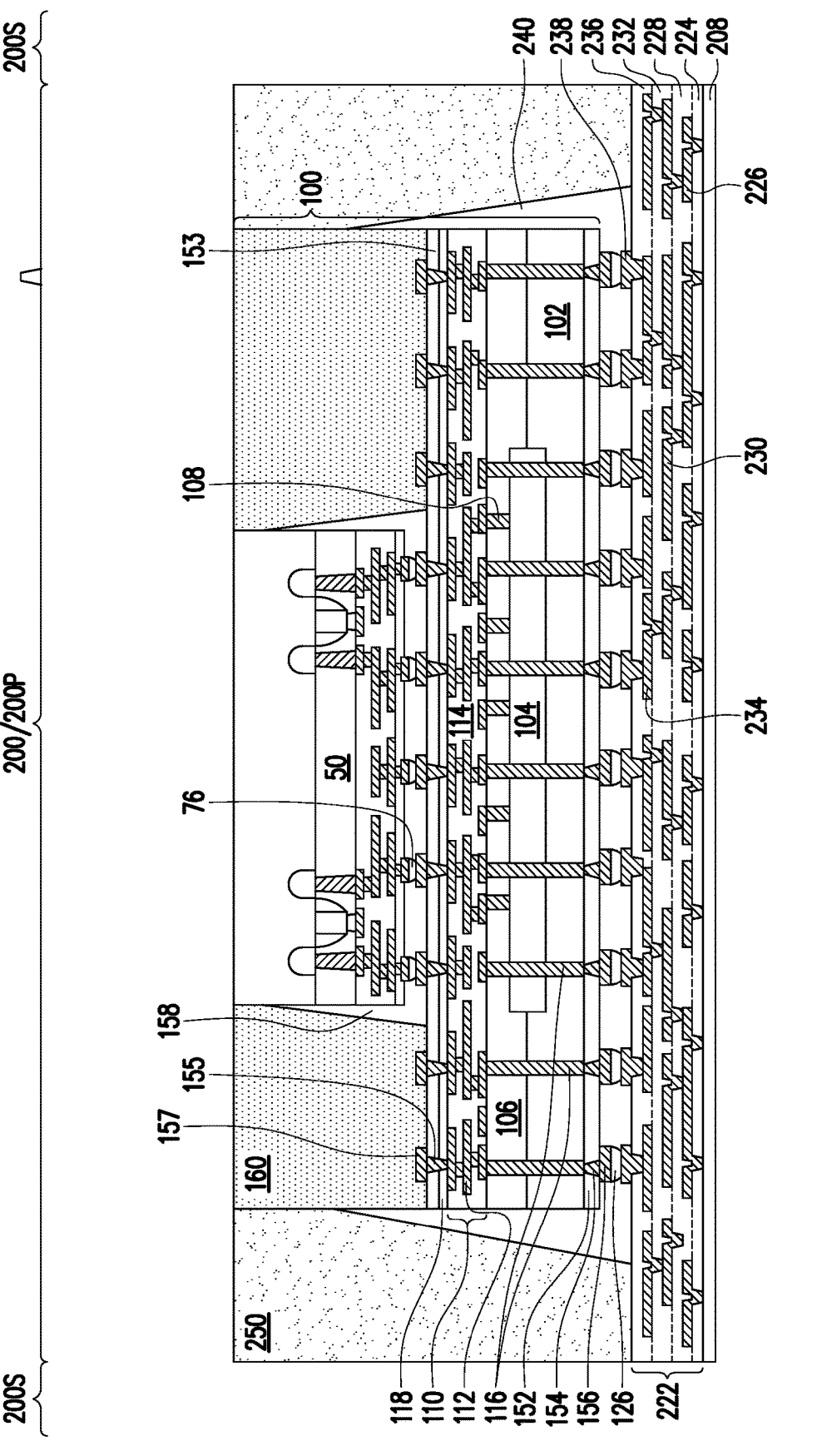

In FIG. 7L, a carrier substrate de-bonding is performed to detach (or "de-bond") the carrier substrate 202 (see FIG. 7K) from the second package device 200.

Figure 7M:
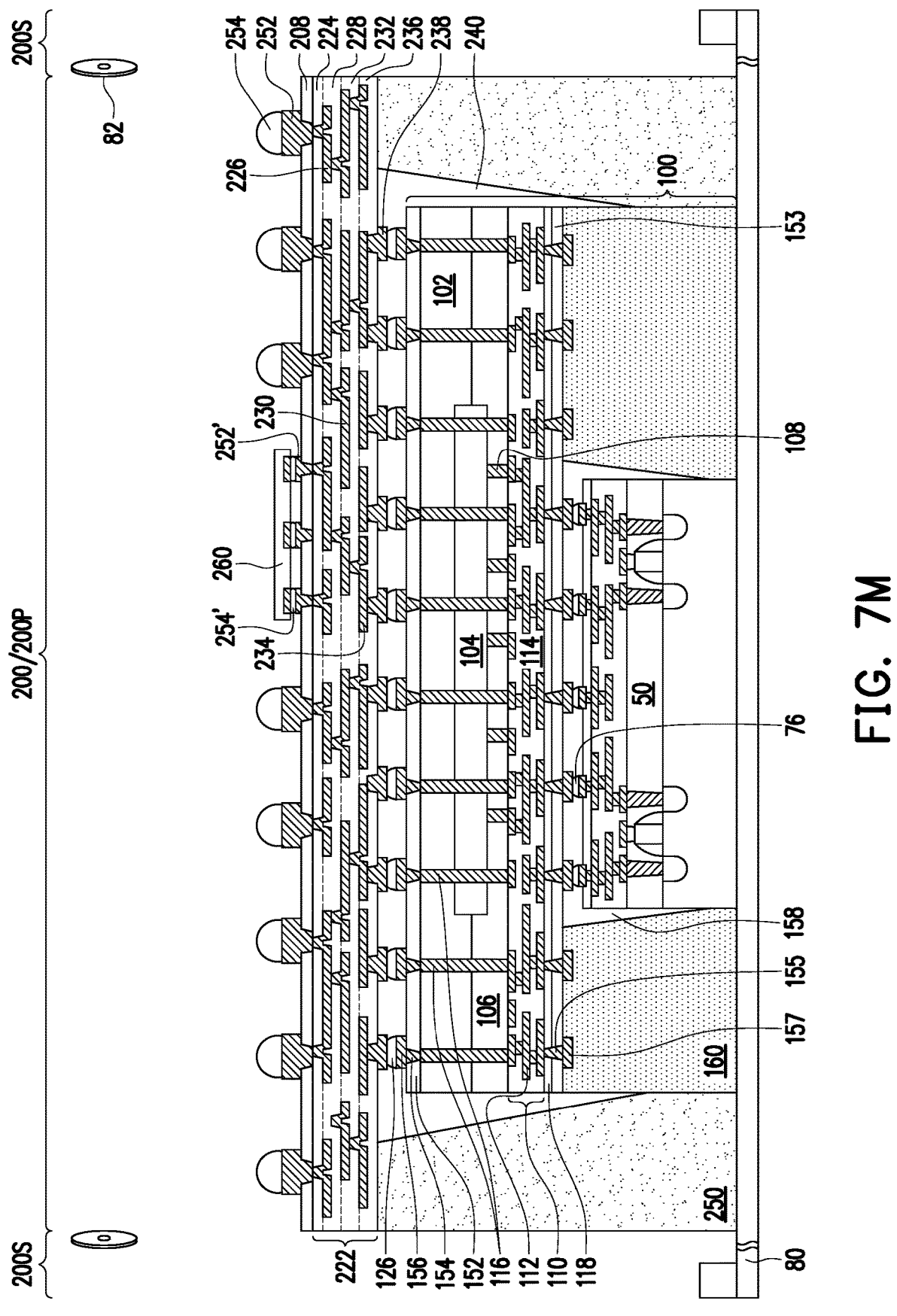

In FIG. 7M, the structure is then flipped over and placed on a handling apparatus 80, such as a frame, tape, or carrier, such as a blue tape for singulation. Conductive connectors 254 are formed in the openings of the dielectric layer 208. In some embodiments, under-bump metallurgies (UBMs) 252 may be formed prior to forming the conductive connectors 254. In other embodiments, the conductive connectors 254 may be formed on the exposed portions of the metallization pattern 226. The conductive connectors 254 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. In some embodiments, conductive connectors 254' may be formed using processes and materials similar to the conductive connectors 254, but may be formed to be smaller than the conductive connectors 254. Corresponding UBMs 252' may likewise be formed prior to forming the conductive connectors 254', in some embodiments. In such embodiments, an integrated surface mount device (SMD) 260 may be attached to the conductive connectors 254', for example, by a pick and place process. The SMD 260 may be interspersed among the conductive connectors 254.

Next, a singulation process 82 is performed by separating package regions 200P from one another along scribe line regions 200S, e.g., between the package regions 200P. The singulation process 82 may be like unto the singulation process 82 described above with respect to FIG. 3H.

A resulting second package device 200 is illustrated in FIG. 8. In accordance with some embodiments, the second package device 200 includes a first package device 100 mounted via electrical connectors 126 to a redistribution structure 222 to form an integrated device which may be an integrated fan out device in a chip-on-wafer-on-substrate structure. The first package device 100 includes an integrated circuit die 50 mounted by solder regions 76 to a front side of a device portion of a wafer. In some embodiments, excess contact pads 156 and or UBMs 238 may be covered by the first encapsulant 160 or the second encapsulant 250, respectively. In some embodiments, a portion of the underfill 240 may be interposed between the first encapsulant 160 and the second encapsulant 250. Utilizing solder mounting for a chip-on-wafer-on-substrate or chip-on-wafer-on-wafer structure provides reduced processing time and reduced production costs over a direct bonding technique.

Figure 9:
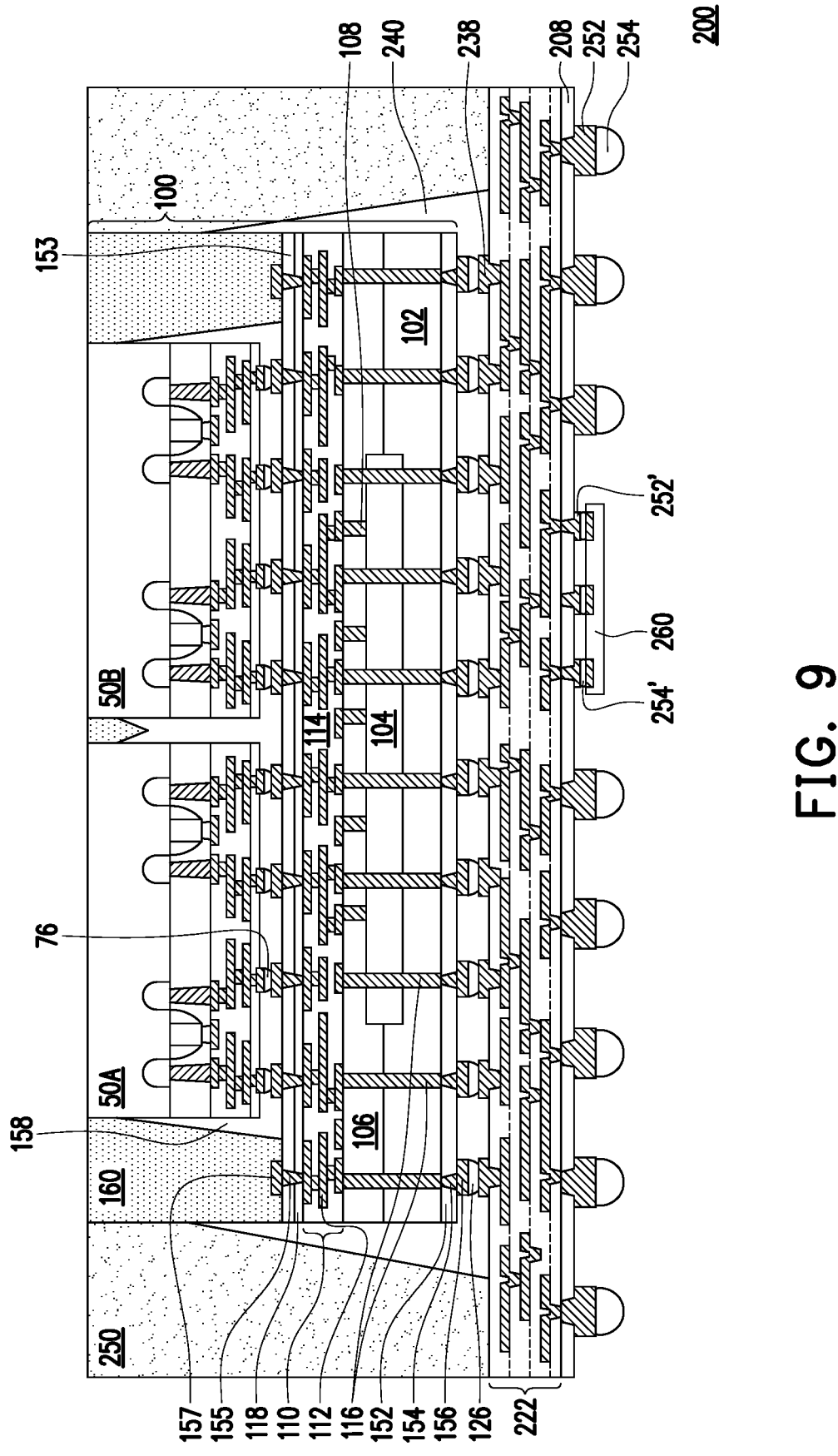
Figure 10:
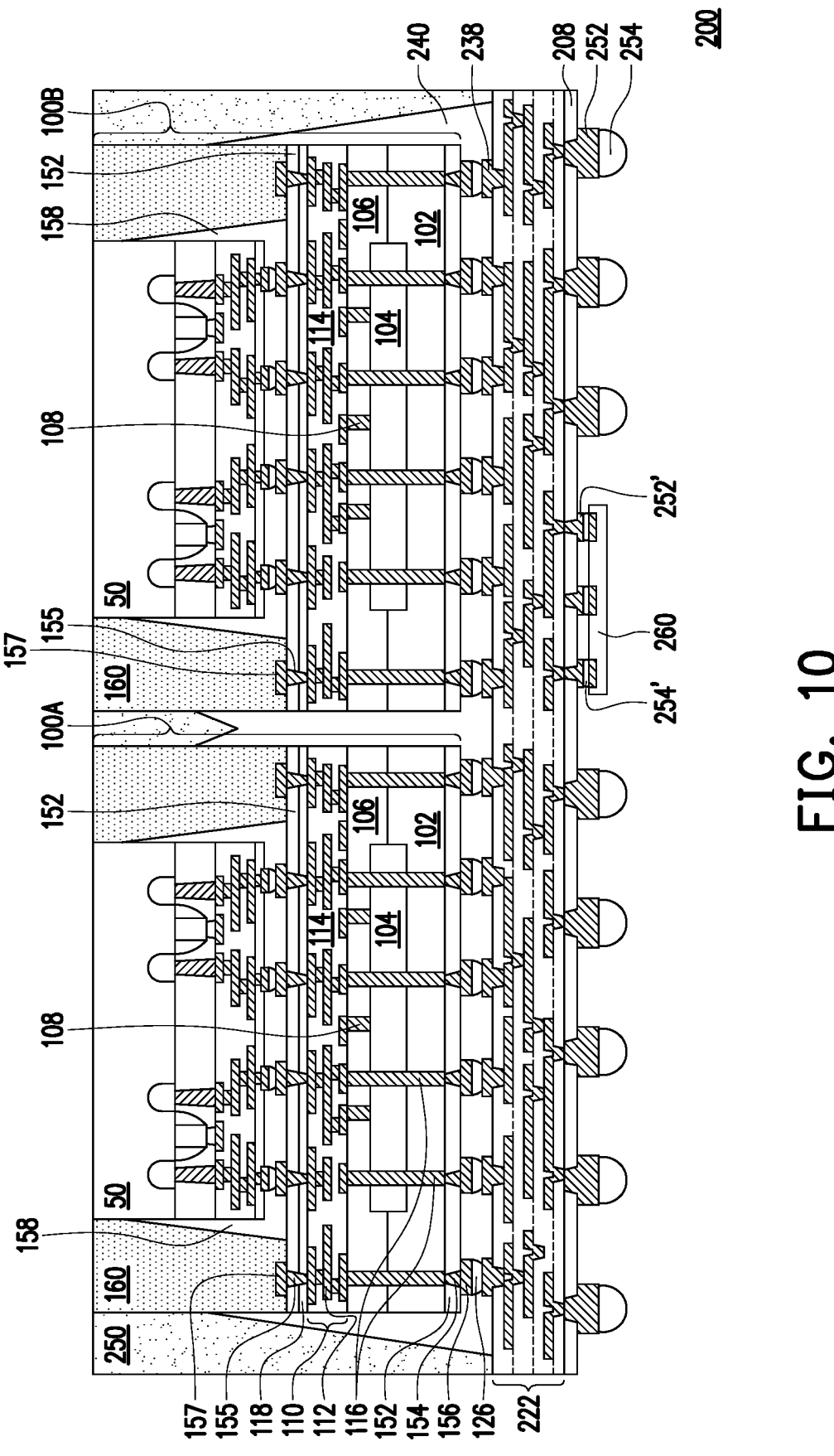

FIGS. 9 and 10 provide variations on the second package device 200 of FIG. 8. In FIG. 9, the first package device 100 includes two or more integrated circuit dies 50A and 50B. As noted in FIG. 9, the underfill 158 may extend between the two or more integrated circuit dies 50A and 50B and may form a v-shaped depression in the underfill 158. In FIG. 10, the second package device 200 includes a first package device 100A and a first package device 100B. As noted in FIG. 10, the underfill 240 may be interposed between the first encapsulant 160 of the first package device 100A and the first encapsulant 160 of the first package device 100B. The underfill 240 may also form a v-shaped depression in the underfill 240 between the first package devices 100A and 100B. The embodiments of FIGS. 9 and 10 may be combined such that one or both of the first package devices 100A or 100B includes two or more of the integrated circuit dies 50A and 50B.

FIGS. 11A, 11B, 11C, 11D, and 12 are cross-sectional views of intermediate stages in the manufacturing of package device 300, in accordance with some embodiments. The elements depicted in these Figures utilize like references for like elements as those discussed above for FIGS. 2, 3A, 3B, 3C, 3D, 3E, 3F, 3G, 3H, 3I, 3J, 3K, 3L, 3M, and 4. In FIGS. 11A, 11B, 11C, 11D, and 12, a package device 300 is formed which is similar to the second package device described above with respect to FIG. 8, except that an additional device 270 is mounted to the redistribution structure 222 adjacent the first package device 100.

Figure 11A:
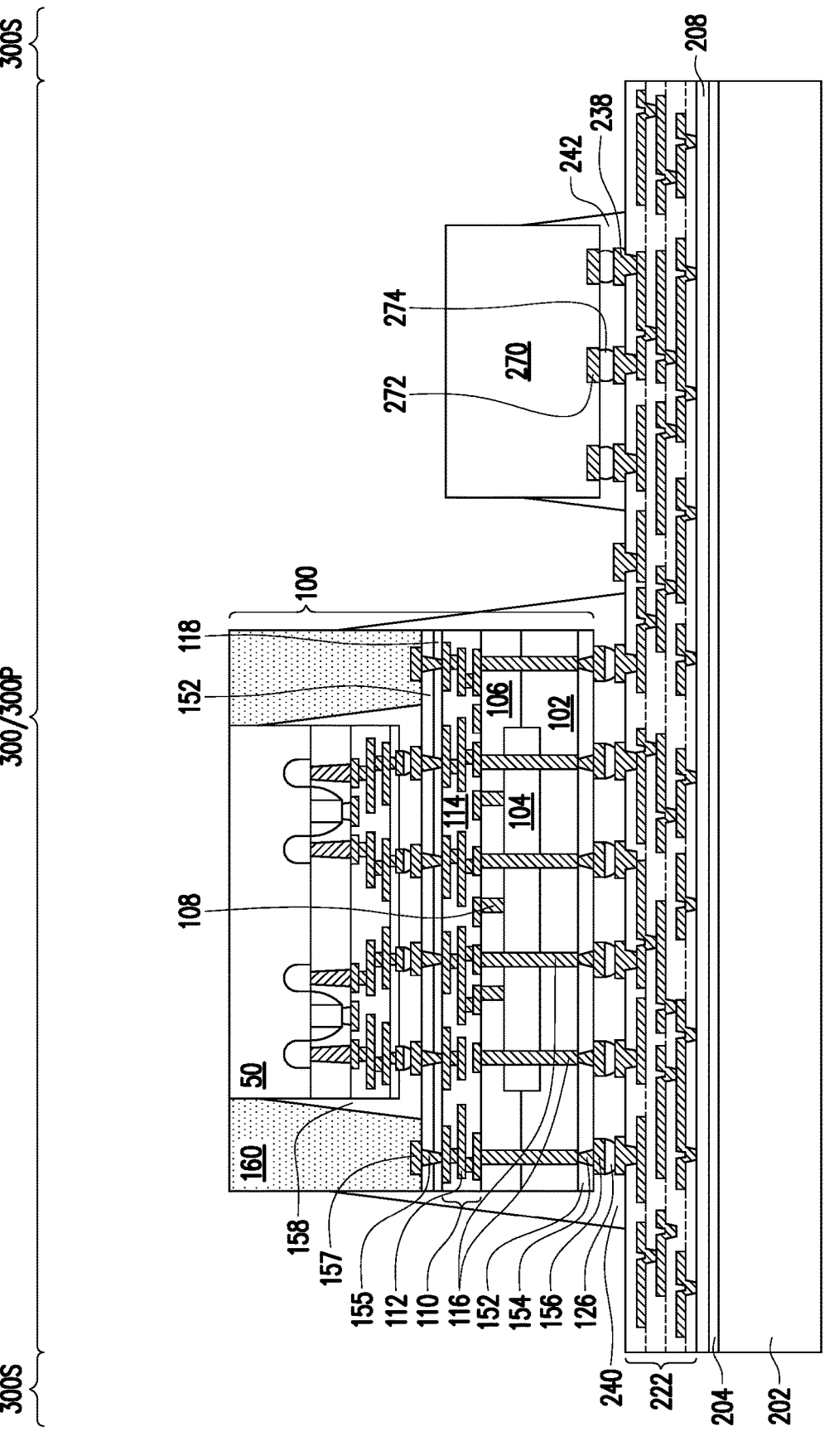
FIGS. 11A, 11B, 11C, and 11D are cross-sectional views of intermediate stages in the manufacturing of integrated circuit packages, in accordance with some embodiments.

The device 270 may be any of the devices listed above for the integrated circuit die 50. In one embodiment, the device 270 may, for example, be a voltage controller regulator device which provides voltage signals, for example, to the first package device 100. In another embodiment, the device 270 may, for example, be a memory device, such as a memory cube, which provides memory storage functions for a system on integrated circuit device (e.g., integrated circuit die 50) in the first package device 100. Embodiments may include multiples of devices 270 as needed. In FIG. 11A, the first package device 100 and device 270 are each attached to the redistribution structure 222. The device 270 can include contact pads 272 and electrical connectors 274, which may be similar to the contact pads 156 and electrical connectors 126, respectively. The first package device 100 and device 270 may be place by any suitable process, such as by pick and place processes, and the electrical connectors 126 and 274 reflowed to complete the bonding. In some embodiments, an underfill 240 and underfill 242 are formed between the first package devices 100 and the redistribution structure 222 and between the devices 270 and the redistribution structure 222, respectively, surrounding the electrical connectors 126 and electrical connectors 274 and the joints between the electrical connectors 126 and the UBMs 238 and between the electrical connectors 274 and the UBMs 238.

Figure 11B:
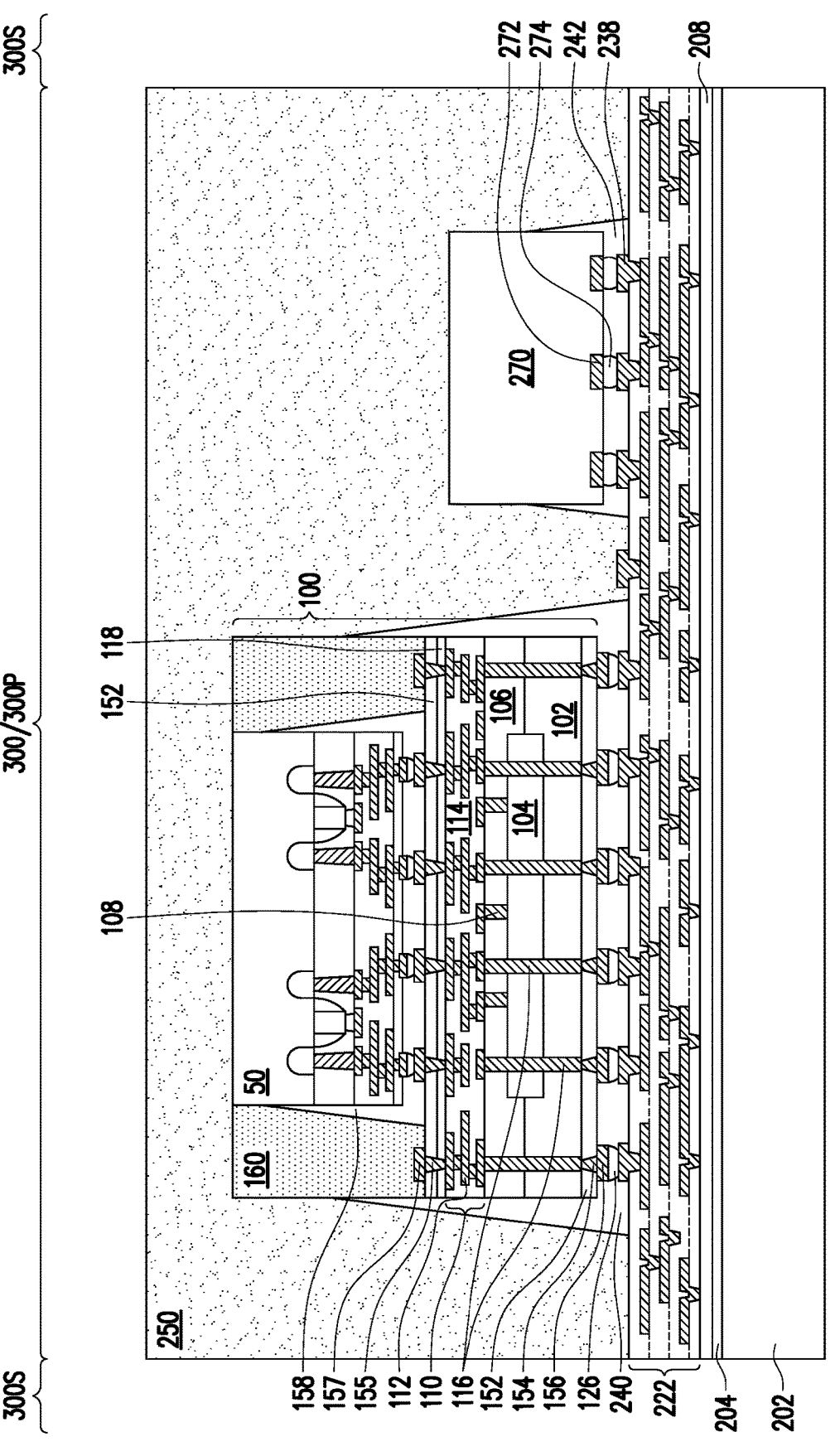

In FIG. 11B, a second encapsulant 250 is formed on and around the various components. After formation, the second encapsulant 250 laterally encapsulates the first package devices 100 and devices 270 and is disposed over any UBMs 238 which are not coupled. The second encapsulant 250 laterally surrounds the underfill 240 and underfill 242, including a portion of the underfill 240 and 242 which extends along a sidewall of the first package devices 100 and devices 270, respectively. In some embodiments, a portion of the underfill 240 may be sandwiched between the first encapsulant 160 and the second encapsulant 250. A portion of the second encapsulant 250 may also be in contact with sidewalls of the first encapsulant 160, as well as disposed over an upper surface of the integrated circuit die 50 and first encapsulant 160.

Figure 11C:
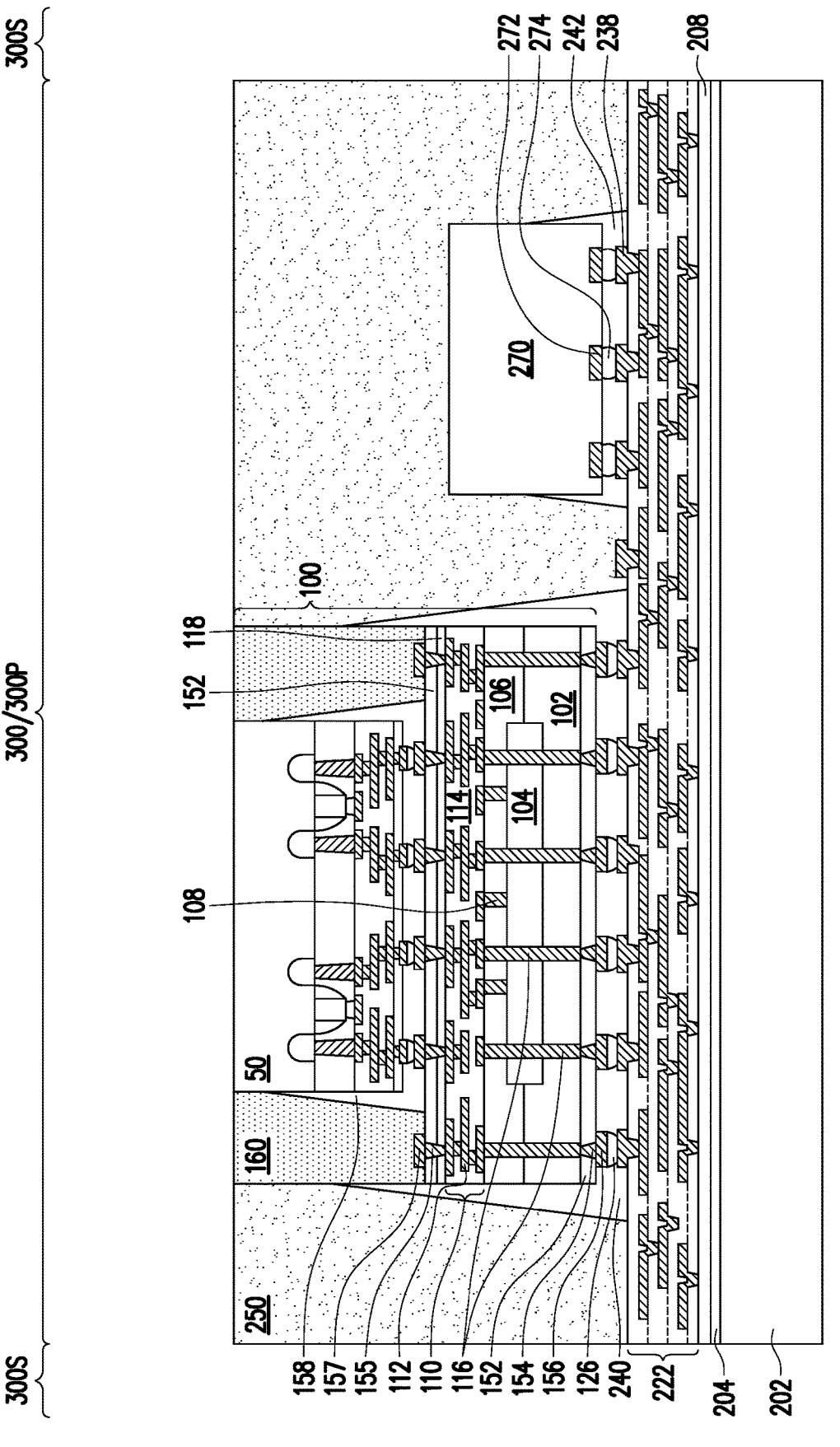

In FIG. 11C, a planarization process is then performed on the second encapsulant 250 to level an upper surface of the second encapsulant 250 with an upper surface of the first package devices 100 (e.g., the upper surface of the first encapsulant 160 and upper surface of the integrated circuit die 50). Such upper surfaces are substantially coplanar after the planarization process within process variations. The planarization process may be, for example, a chemical-mechanical polish (CMP), a grinding process, or the like. Following the planarization process, the device 270 may, in some embodiments, remain encased in the second encapsulant 250, while in other embodiments, the device 270 may be as tall as or taller than the first package device 100, in which case an upper surface of the device 270 may be level with the upper surface of the encapsulant 250.

Figure 11D:
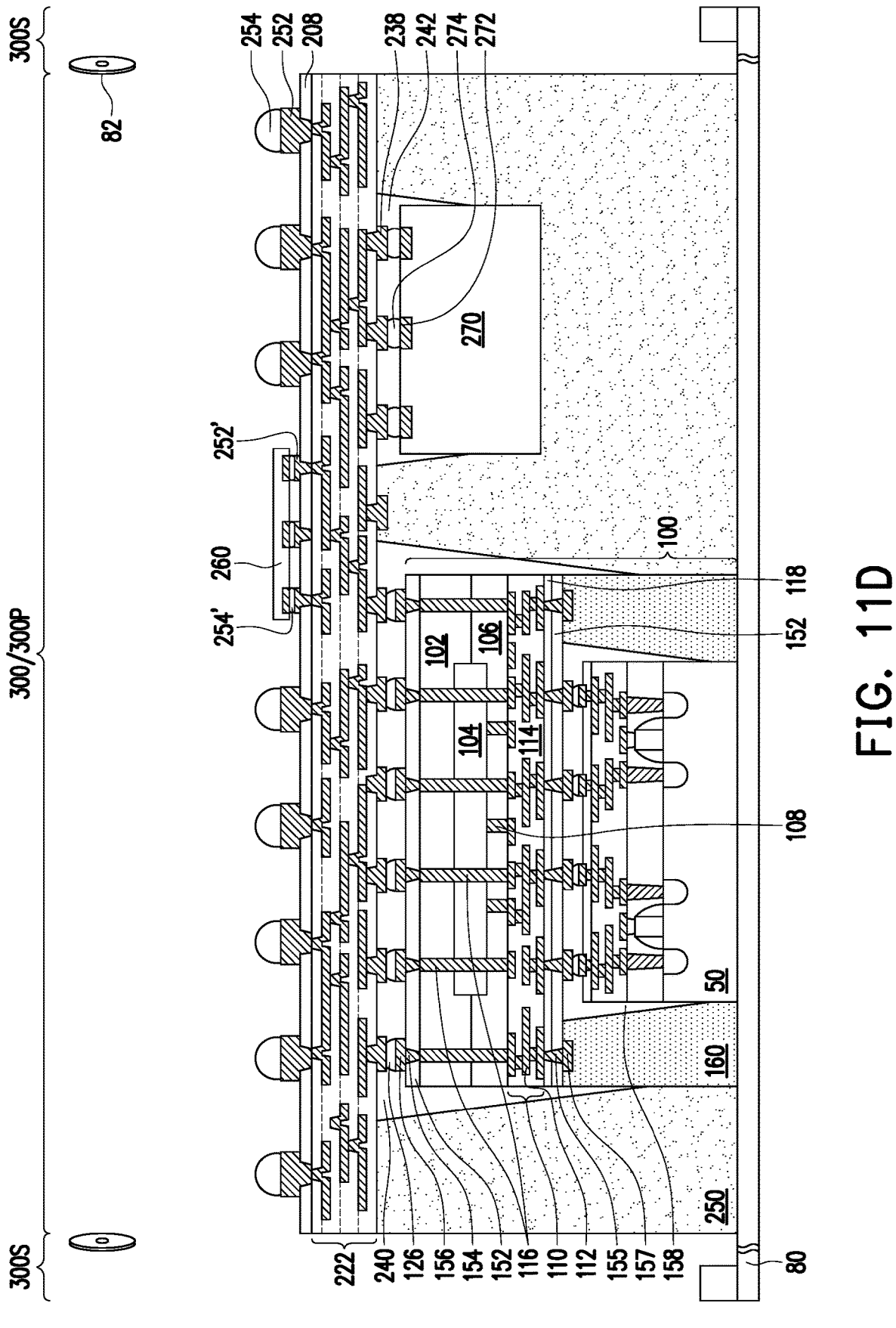

In FIG. 11D, a carrier substrate de-bonding is performed to detach (or "de-bond") the carrier substrate 202 (see FIG. 7K) from the second package device 200. The structure is then flipped over and placed on a handling apparatus 80, such as a frame, tape, or carrier, such as a blue tape for singulation. Conductive connectors 254 are formed in the openings of the dielectric layer 208. In some embodiments, under-bump metallurgies (UBMs) 252 may be formed prior to forming the conductive connectors 254. In other embodiments, the conductive connectors 254 may be formed on the exposed portions of the metallization pattern 226. The conductive connectors 254 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. In some embodiments, conductive connectors 254' may be formed using processes and materials similar to the conductive connectors 254, but may be formed to be smaller than the conductive connectors 254. Corresponding UBMs 252' may likewise be formed prior to forming the conductive connectors 254', in some embodiments. In such embodiments, an integrated surface mount device (SMD) 260 may be attached to the conductive connectors 254', for example, by a pick and place process. The SMD 260 may be interspersed among the conductive connectors 254.

Next, a singulation process 82 is performed by separating package regions 300P from one another along scribe line regions 300S, e.g., between the package regions 300P. The singulation process 82 may be like unto the singulation process 82 described above with respect to FIG. 3H.

Figure 12:
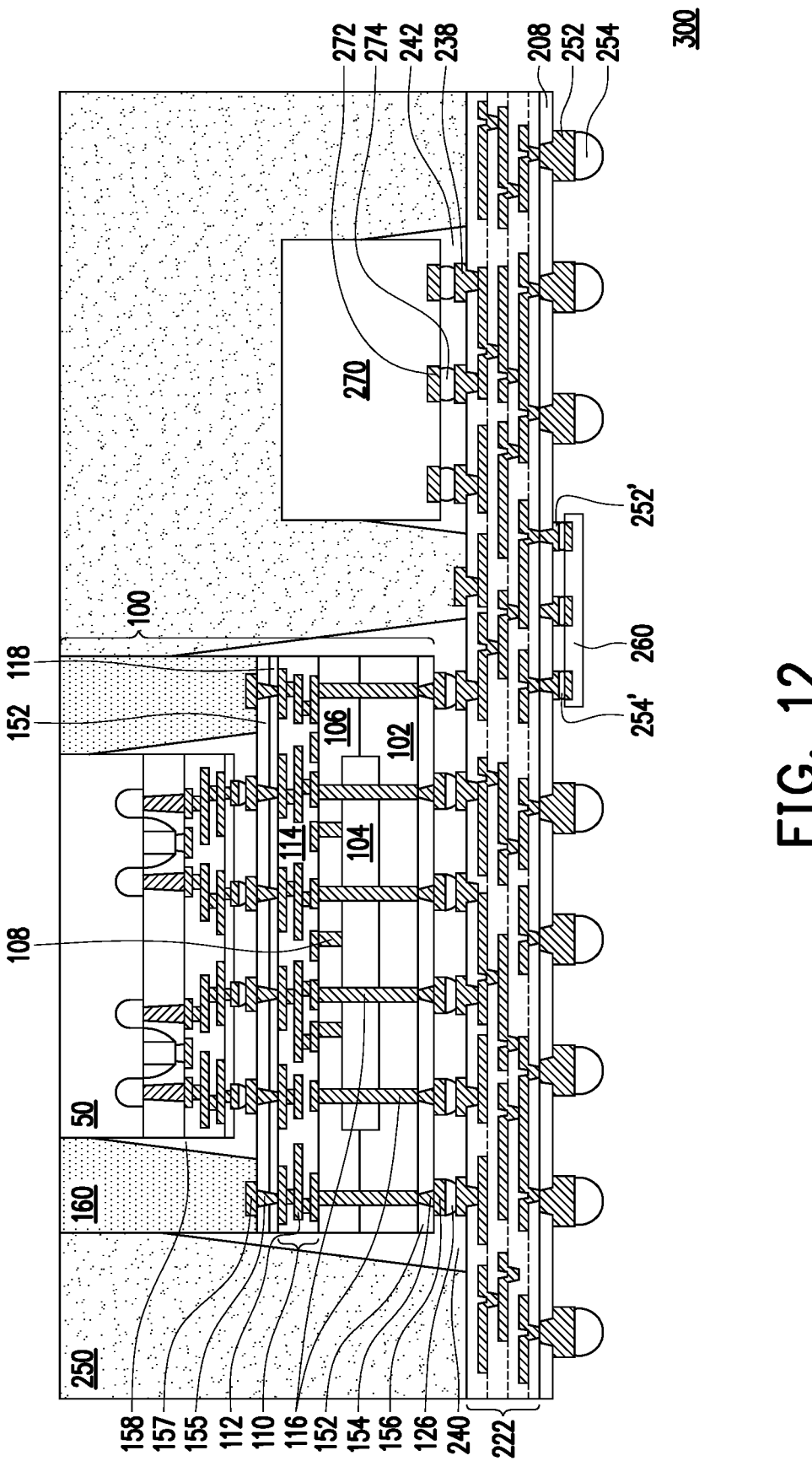
FIGS. 12 and 13 illustrate integrated circuit packages resulting from processes illustrated in FIGS. 11A, 11B, 11C, and 11D, in accordance with some embodiments.

A resulting second package device 300 is illustrated in FIG. 12. In accordance with some embodiments, the second package device 300 includes a first package device 100 mounted via electrical connectors 126 to a redistribution structure 222 to form an integrated device which may be an integrated fan out device in a chip-on-wafer-on-substrate or chip-on-wafer-on-wafer structure. The second package device 300 also includes a device 270 mounted via electrical connectors 274 to the redistribution structure 222. An encapsulant laterally surrounds both the first package device 100 and the device 270. The first package device 100 includes an integrated circuit die 50 mounted by solder regions 76 to a front side of a device portion of a wafer. In some embodiments, excess contact pads 156 and or UBMs 238 may be covered by the first encapsulant 160 or the second encapsulant 250, respectively. In some embodiments, a portion of the underfill 240 may be interposed between the first encapsulant 160 and the second encapsulant 250. Utilizing solder mounting for a chip-on-wafer-on-substrate or chip-on-wafer-on-wafer structure provides reduced processing time and reduced production costs over a direct bonding technique.

Figure 13:
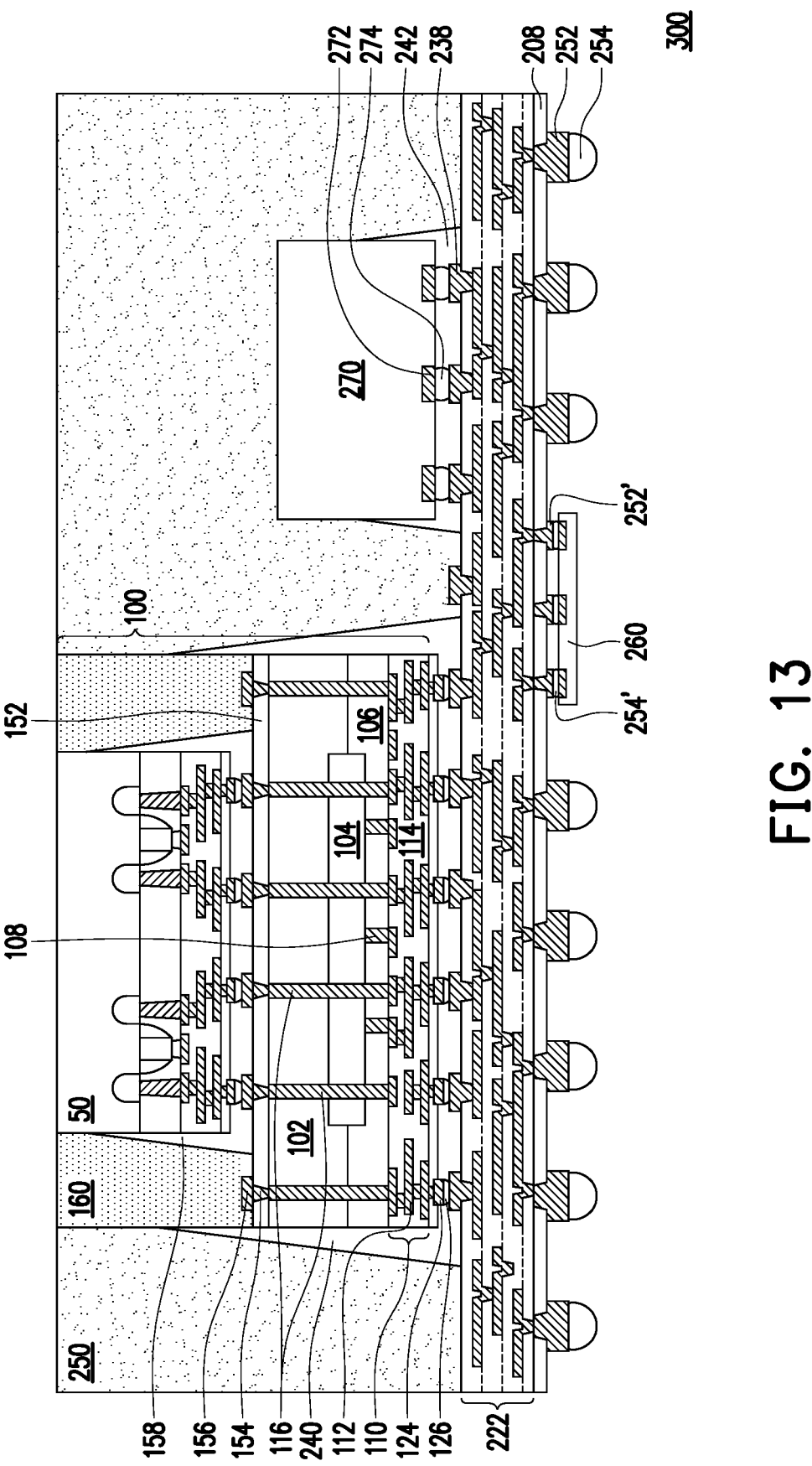

An alternative to FIG. 12 is provided in FIG. 13 which utilizes the first package device 100 as illustrated in FIG. 4. The second package device 300 otherwise may be formed as described above with respect to FIGS. 11A, 11B, 11C, and 11D. In accordance with some embodiments, the second package device 300 of FIG. 13 includes a first package device 100 mounted via electrical connectors 126 to a redistribution structure 222 to form an integrated device which may be an integrated fan out device in a chip-on-wafer-on-substrate or chip-on-wafer-on-wafer structure. The second package device 300 also includes a device 270 mounted via electrical connectors 274 to the redistribution structure 222. An encapsulant laterally surrounds both the first package device 100 and the device 270. The first package device 100 includes an integrated circuit die 50 mounted by solder regions 76 to a back side of a device portion of a wafer. In some embodiments, excess contact pads 156 and or UBMs 238 may be covered by the first encapsulant 160 or the second encapsulant 250, respectively. In some embodiments, a portion of the underfill 240 may be interposed between the first encapsulant 160 and the second encapsulant 250. Utilizing solder mounting for a chip-on-wafer-on-substrate or chip-on-wafer-on-wafer structure provides reduced processing time and reduced production costs over a direct bonding technique.

Figure 14:
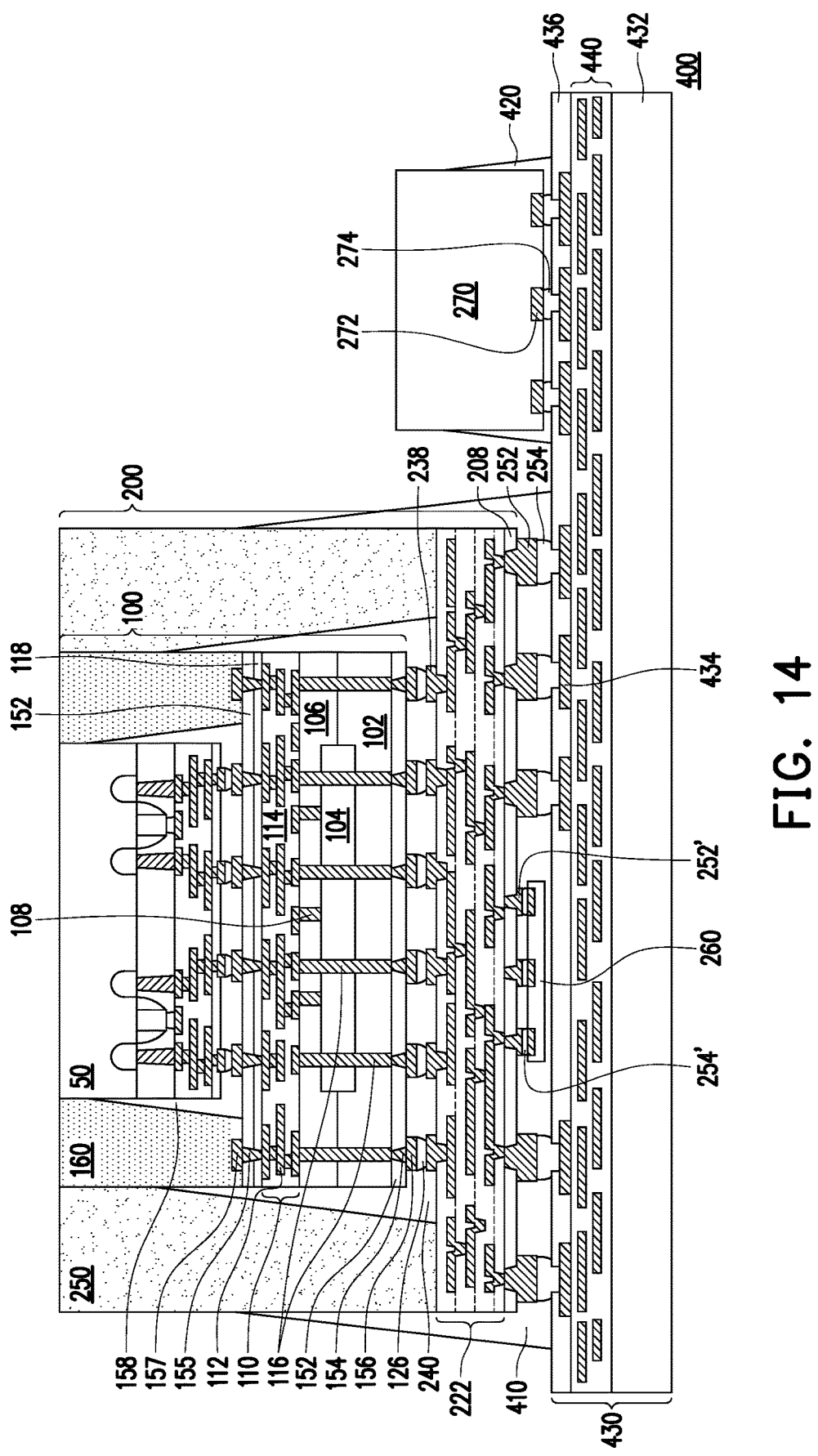
FIGS. 14 and 15 illustrate integrated circuit packages including devices illustrated in FIGS. 4, 5, 6, 8, 9, and 10, in accordance with some embodiments.
Figure 15:
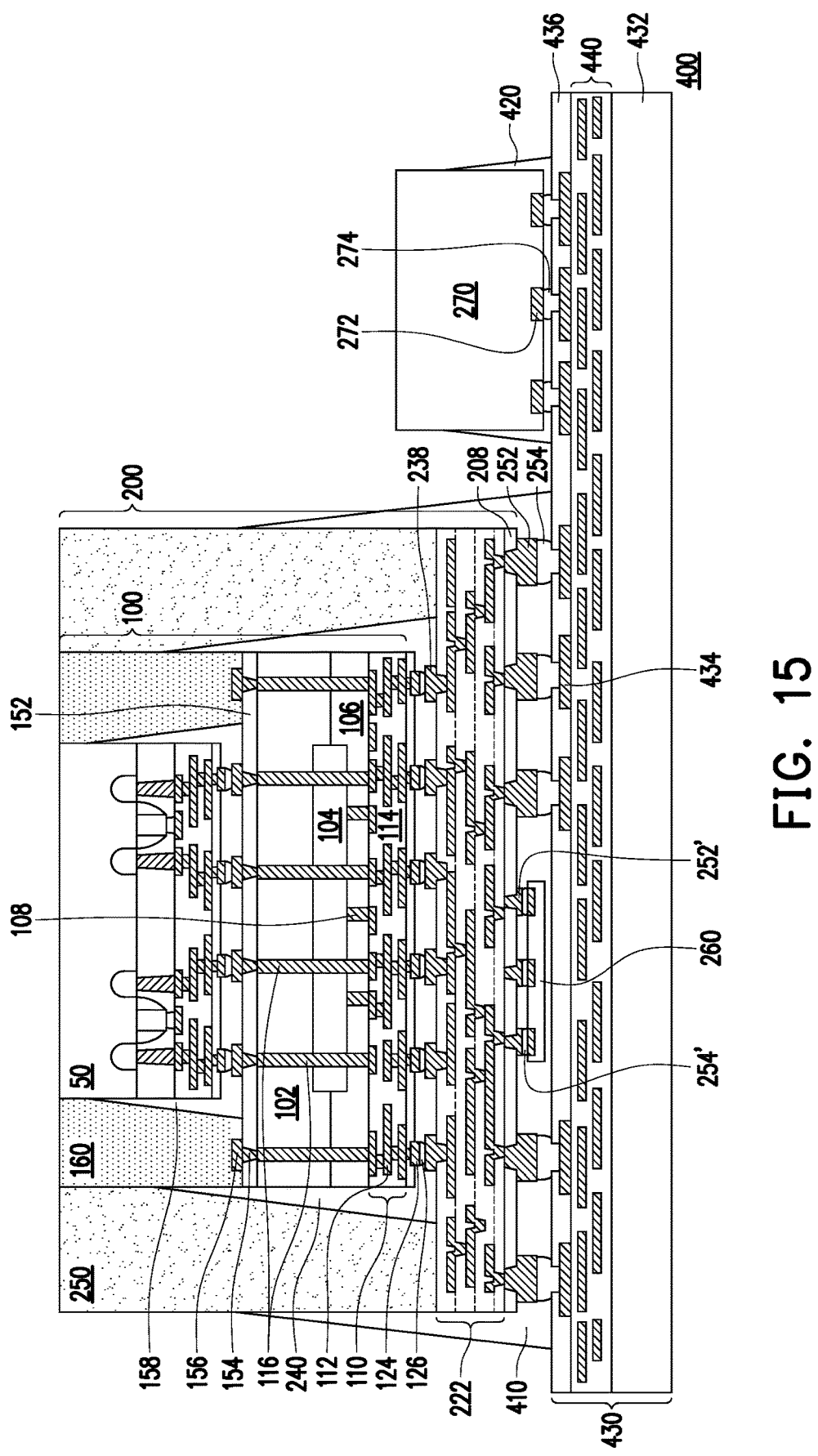

FIGS. 14 and 15 illustrate a third package device 400, in accordance with some embodiments. Like references are used for like components. In FIGS. 14 and 15, second package device 200 may be mounted to a package substrate 430 using the conductive connectors 254 to form third package device 400. The package substrate 430 may be a printed circuit board (PCB). The package substrate 430 may include a substrate core 432 and bond pads 434 over the substrate core 432. An optional redistribution structure 440 may also be used over the substrate core 432. The substrate core 432 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 432 may be an SOI substrate. Generally, an SOI substrate includes a layer of a semiconductor material such as epitaxial silicon, germanium, silicon germanium, SOI, SGOI, or combinations thereof. The substrate core 432 may be an organic substrate. The substrate core 432 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 432.

The substrate core 432 may include active and passive devices (not shown). A wide variety of devices such as transistors, capacitors, resistors, combinations of these, and the like may be used to generate the structural and functional requirements of the design for the device stack. The devices may be formed using any suitable methods. The a redistribution structure 440 may include metallization layers and vias, with the bond pads 434 being physically and/or electrically coupled to the metallization layers and vias.

In some embodiments, the conductive connectors 254 are reflowed to attach the second package device component 200 to the bond pads 434. The conductive connectors 254 electrically and/or physically couple the package substrate 430, including metallization layers in the redistribution structure 440, to the second package device 200. In some embodiments, a solder resist 436 is formed over the substrate core 432. The conductive connectors 254 may be disposed in openings in the solder resist 436 to be electrically and mechanically coupled to the bond pads 434. The solder resist 436 may be used to protect areas of the substrate core 432 and/or redistribution structure 440 from external damage.

The conductive connectors 254 may have an epoxy flux (not shown) formed thereon before they are reflowed with at least some of the epoxy portion of the epoxy flux remaining after the second package device 200 is attached to the package substrate 430. This remaining epoxy portion may act as an underfill to reduce stress and protect the joints resulting from reflowing the conductive connectors 254. In some embodiments, an optional underfill 410 may be formed between the second package device 200 and the package substrate 430 and surrounding the conductive connectors 254. The underfill 410 may be formed by a capillary flow process after the second package device 200 is attached or may be formed by a suitable deposition method before the second package device 200 is attached.

In like manner, device 270 may be attached to the package substrate 430 using the electrical connectors 274, which also may have an epoxy flux (not shown) formed thereon before they are reflowed. In some embodiments, an optional underfill 420 may be formed between the device 270 and the package substrate 430 and surrounding the electrical connectors 274. The underfill 420 may be formed by a capillary flow process after the device 270 is attached or may be formed by a suitable deposition method before the device 270 is attached. An optional third encapsulant may be deposited over the second semiconductor device 200 and device 270, where a portion of the underfill 410 may be interposed between the third encapsulant and the second encapsulant 250.

In FIG. 14, the first package device 100 utilized in the second semiconductor device 200 is consistent with those disclosed above and discussed with respect to FIGS. 8, 9, and 10, which include a integrated circuit die 50 face-to-face with a package region 100P of a wafer 100W. In FIG. 15, the first package device 100 utilized in the second semiconductor device 200 is consistent with those disclosed above and discussed with respect to FIGS. 4, 5, and 6, which include an integrated circuit die 50 face-to-back with a package region 100P of a wafer 100W.

Embodiments may achieve advantages. By utilizing solder bonded devices to form 3D stacked structures, costs can be significantly reduced. Thus, a low-cost integrated fan out device may be used in applications which would normally preclude use of such an advantageous technology. For example, low cost mobile devices may use embodiment devices to provide system functionalities at a reduced production cost. An integrated fan out device may also include an adjacent memory cube and/or voltage regulator device bonded in a similar manner and encapsulated in an encapsulant so that a the integrated fan out device includes logic and memory components. The resulting device is formed in a manner similar to a chip-on-wafer-on-wafer or chip-on-wafer-on-substrate device, but with reduced processing costs.

One embodiment is a method including forming a first package, which may include mounting a first integrated circuit device to a first wafer by a first set of solder connectors, depositing a first underfill between the first integrated circuit device and the first wafer, forming a first encapsulant laterally surrounding the first integrated circuit device, and singulating the first package, the first package including the first integrated circuit device and a first portion of the first wafer. The method also includes mounting the first package to a second wafer by a second set of solder connectors. The method also includes depositing a second underfill between the first package and the second wafer, the second wafer including an interconnect structure. The method also includes forming a second encapsulant laterally surrounding the first package. The method also includes singulating a second package from the second wafer, the second package including the first package and a second portion of the second wafer.

In an embodiment, the method may include, prior to singulating the second package, flipping over the second wafer, forming first conductive connectors at a front side of the second wafer, and forming a third set of solder connectors on a front side of the second wafer on the first conductive connectors. In an embodiment, the method may include forming second conductive connectors at the front side of the second wafer, the second conductive connectors smaller than the first conductive connectors, and mounting a first integrated package device to the second conductive connectors. In an embodiment, the method may include preparing the first wafer by forming the second set of solder connectors on a front side of the first wafer, securing the first wafer to a handling apparatus, thinning a backside of the first wafer to reveal a set of through-vias, forming a polymer layer over the backside of the first wafer, and forming first conductive connectors through the polymer layer to contact the set of through-vias; and mounting the first integrated circuit device to the first wafer by the first set of solder connectors on the first conductive connectors. In an embodiment, after mounting the first integrated circuit device, one of the first conductive connectors is free from solder. In an embodiment, the first integrated circuit device is mounted to a front side of the first wafer. In an embodiment, the method further includes depositing a first underfill between the first integrated circuit device and the first workpiece, and depositing a second underfill between the first package and the second workpiece, where the second underfill extends up sidewalls of the first package, the second underfill interposed between the first encapsulant and the second encapsulant. In an embodiment, the method may include mounting a second structure to the second wafer adjacent the first package, and forming the second encapsulant to laterally surround the second structure. In an embodiment, the second structure is a second integrated circuit die, the second encapsulant extending over an upper surface of the second structure. In an embodiment, the method may include mounting the second package to a substrate, mounting a second integrated circuit die to the substrate adjacent the second package, and depositing a third underfill between the second package and the substrate and a fourth underfill between the second integrated circuit die and the substrate.

Another embodiment is a method including depositing a passivation layer over a first workpiece and forming a first set of connectors through the passivation layer, the first set of connectors electrically coupled to a first interconnect of the first workpiece. The method also includes attaching a first device die to the first set of connectors by corresponding first solder connectors. The method may include depositing a first underfill between the first device die and the first workpiece. The method also includes encapsulating the first device die in a first encapsulant. The method also includes forming a second set of connectors on the first workpiece opposite the first set of connectors. The method also includes singulating a first package from the first workpiece, the first package including the first device die. The method also includes attaching the second set of connectors of the first package to a second workpiece by corresponding second solder connectors. The method also may include depositing a second underfill between the first package die and the second workpiece. The method also includes encapsulating the first package in a second encapsulant. The method also includes forming a third set of connectors on the second workpiece on a side of the second workpiece opposite the first package. The method also includes singulating a second package from the second workpiece, the second package including the first package.

In an embodiment, the passivation layer is a first passivation layer, and the method may include thinning a backside of the first workpiece, the backside of the first workpiece opposite the first passivation layer, the thinning exposing a set of through-vias extending through the first workpiece to contact the first interconnect; depositing a second passivation layer on the backside of the first workpiece; and forming the second set of connectors on the second passivation layer, the second set of connectors electrically coupled to the set of through-vias. In an embodiment, a first subset of the first set of connectors remains unbonded after attaching the first device die, where the first encapsulant covers and laterally surrounds the first subset of the first set of connectors. In an embodiment, the method further includes depositing an underfill between the first package die and the second workpiece, where the underfill extends along sidewalls of the first encapsulant. In an embodiment, the second encapsulant also encapsulates the second device die.

Another embodiment is a device including a first die and a second die, the second die having greater lateral extents than the first die, the first die bonded to the second die by a first set of solder connectors. The device may also include a first underfill disposed between the first die and the second die. The device also includes a first encapsulant laterally surrounding the first die, where sidewalls of the second die are colinear with sidewalls of the first encapsulant, the first die, the second die, and the first encapsulant forming a first package. The device also includes a third die which may include a redistribution structure, the first package solder bonded to the redistribution structure to form an integrated fan out device. The device also may include a second underfill disposed between the first package and the third die. The device also includes a second encapsulant laterally surrounding the first package and extending laterally to an edge of the redistribution structure.

In an embodiment, a second underfill is disposed between the first package and the third die, where the second underfill is interposed between the first encapsulant and the second encapsulant. In an embodiment, the device may include a fourth die bonded to the redistribution structure at a same side as the first package, the fourth die encapsulated within the second encapsulant, the fourth die electrically coupled to the first die. In an embodiment, the device may include a package substrate, the integrated fan out device bonded to the package substrate; and a fourth die bonded to the package substrate, the fourth die electrically coupled to the first die. In an embodiment, the first die is bonded to the second die such that a face of the first die is bonded to a face of the second die, the second die including through-vias extending away from an interface of the first die and second die, a second set of connectors coupled to the through-vias, the second set of connectors bonding the first package to the redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first package, comprising:
   mounting a first integrated circuit device to a first workpiece by a first set of connectors,
   depositing a first underfill between the first integrated circuit device and the first workpiece;
   forming a first encapsulant laterally surrounding the first integrated circuit device, and
   separating the first package, the first package including the first integrated circuit device and a first portion of the first workpiece;
   mounting the first package to a second workpiece by a second set of connectors, the second workpiece including an interconnect structure;
   depositing a second underfill between the first package and the second workpiece, wherein the second underfill extends up sidewalls of the first package;
   forming a second encapsulant laterally surrounding the first package, wherein the second underfill is interposed between the first encapsulant and the second encapsulant; and
   separating a second package from the second workpiece, the second package including the first package and a second portion of the second workpiece.

2. The method of claim 1, further comprising:
   prior to separating the second package, flipping over the second workpiece;
   forming first conductive connectors at a front side of the second workpiece; and
   forming a third set of connectors on a front side of the second workpiece on the first conductive connectors.

3. The method of claim 2, further comprising:
   forming second conductive connectors at the front side of the second workpiece, the second conductive connectors smaller than the first conductive connectors; and
   mounting a first integrated package device to the second conductive connectors.

4. The method of claim 1, further comprising:
   preparing the first workpiece, comprising:
   forming the second set of connectors on a front side of the first workpiece,
   securing the first workpiece to a handling apparatus,
   thinning a backside of the first workpiece to reveal a set of through-vias, forming a polymer layer over the backside of the first workpiece, and forming first conductive connectors through the polymer layer to contact the set of through-vias; and mounting the first integrated circuit device to the first workpiece by the first set of connectors on the first conductive connectors.

5. The method of claim 4, wherein after mounting the first integrated circuit device, one of the first conductive connectors is free from solder.

6. The method of claim 1, wherein the first integrated circuit device is mounted to a front side of the first workpiece.

7. The method of claim 1, further comprising:

mounting a second structure to the second workpiece adjacent the first package; and forming the second encapsulant to laterally surround the second structure.

8. The method of claim 7, wherein the second structure is a second integrated circuit die, the second encapsulant extending over an upper surface of the second structure.

9. The method of claim 1, further comprising:

mounting the second package to a substrate;

mounting a second integrated circuit die to the substrate adjacent the second package; and depositing a third underfill between the second package and the substrate and a fourth underfill between the second integrated circuit die and the substrate.

10. A method comprising:

depositing a passivation layer over a first workpiece;

forming a first set of connectors through the passivation layer, the first set of connectors electrically coupled to a first interconnect of the first workpiece;

attaching a first device die to the first set of connectors by corresponding first connectors;

encapsulating the first device die in a first encapsulant;

forming a second set of connectors on the first workpiece opposite the first set of connectors;

singulating a first package from the first workpiece, the first package including the first device die;

attaching the second set of connectors of the first package to a second workpiece by corresponding second connectors;

depositing an underfill between the first device die and the second workpiece, wherein the underfill extends along sidewalls of the first encapsulant;

encapsulating the first package in a second encapsulant;

forming a third set of connectors on the second workpiece on a side of the second workpiece opposite the first package; and singulating a second package from the second workpiece, the second package including the first package.

11. The method of claim 10, wherein the passivation layer is a first passivation layer, further comprising:

thinning a backside of the first workpiece, the backside of the first workpiece opposite the first passivation layer, the thinning exposing a set of through-vias extending through the first workpiece to contact the first interconnect;

depositing a second passivation layer on the backside of the first workpiece; and forming the second set of connectors on the second passivation layer, the second set of connectors electrically coupled to the set of through-vias.

12. The method of claim 10, wherein a first subset of the first set of connectors remains unbonded after attaching the first device die, wherein the first encapsulant covers and laterally surrounds the first subset of the first set of connectors.

13. The method of claim 10, further comprising attaching a second device die to the second workpiece by corresponding third connectors, the second device die being shorter than the first package, wherein the second encapsulant also encapsulates the second device die.

14. A method comprising:

attaching a first die to a first surface of a second die with a first set of connectors, the second die being part of a first workpiece;

forming a first underfill between the first die and the second die;

forming a first encapsulant on the first surface of the second die and along sidewalls of the first die;

singulating to separate the second die from the first workpiece;

attaching the second die to a first surface of a second workpiece with a second set of connectors;

forming a second underfill between the second die and the second workpiece;

forming a second encapsulant on the first surface of the second workpiece, the second encapsulant extending along sidewalls of the first encapsulant; and singulating the second workpiece to form a packaged device.

15. The method of claim 14, wherein the second underfill contacts the sidewalls of the first encapsulant.

16. The method of claim 14, wherein a sidewall of the first encapsulant is aligned with a sidewall of the second die.

17. The method of claim 14, wherein the second workpiece is a redistribution structure.

18. The method of claim 17, wherein the first die is attached to the second die such that a face of the first die is bonded to a face of the second die.

19. The method of claim 1, wherein the first set of connectors comprises solder connectors.

20. The method of claim 10, further comprising attaching a surface mount device to the second workpiece on the side of the second workpiece opposite the first package.

* * * * *